United States Patent
Lee et al.

(10) Patent No.: US 10,216,096 B2
(45) Date of Patent: Feb. 26, 2019

(54) PROCESS-SENSITIVE METROLOGY SYSTEMS AND METHODS

(71) Applicant: KLA-Tencor Corporation, Milpitas, CA (US)

(72) Inventors: Myungjun Lee, San Jose, CA (US); Mark D. Smith, Austin, TX (US); Sanjay Kapasi, Austin, TX (US); Stilian Pandev, Santa Clara, CA (US); Dzmitry Sanko, Vallejo, CA (US); Pradeep Subrahmanyan, Milpitas, CA (US); Ady Levy, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/174,111

(22) Filed: Jun. 6, 2016

(65) Prior Publication Data

US 2017/0045826 A1   Feb. 16, 2017

Related U.S. Application Data

(60) Provisional application No. 62/205,410, filed on Aug. 14, 2015, provisional application No. 62/205,529, (Continued)

(51) Int. Cl.
*G03B 27/54* (2006.01)
*G03F 7/20* (2006.01)

(52) U.S. Cl.
CPC ...... *G03F 7/70558* (2013.01); *G03F 7/70091* (2013.01); *G03F 7/70641* (2013.01)

(58) Field of Classification Search
CPC ............. G03F 7/70091; G03F 7/70558; G03F 7/70641; G03F 7/70191
(Continued)

(56) References Cited

U.S. PATENT DOCUMENTS 5,608,526 A    3/1997   Piwonka-Corle et al.
5,680,588 A   10/1997   Gortych et al.
(Continued)

FOREIGN PATENT DOCUMENTS

WO    2009078708 A1    6/2009
WO    2013189724 A2   12/2013
(Continued)

OTHER PUBLICATIONS

International Technology Roadmap for Semiconductors, 2009 Edition, Metrology, 39 pages.
(Continued)

*Primary Examiner* — Peter B Kim
(74) *Attorney, Agent, or Firm* — Suiter Swantz pc llo

(57) ABSTRACT

A lithography system includes an illumination source and a set of projection optics. The illumination source directs a beam of illumination from an off-axis illumination pole to a pattern mask. The pattern mask includes a set of pattern elements to generate a set of diffracted beams including illumination from the illumination pole. At least two diffracted beams of the set of diffracted beams received by the set of projection optics are asymmetrically distributed in a pupil plane of the set of projection optics. The at least two diffracted beams of the set of diffracted beams are asymmetrically incident on the sample to form a set of fabricated elements corresponding to an image of the set of pattern elements. The set of fabricated elements on the sample includes one or more indicators of a location of the sample along an optical axis of the set of projection optics.

19 Claims, 45 Drawing Sheets

Related U.S. Application Data filed on Aug. 14, 2015, provisional application No. 62/297,697, filed on Feb. 19, 2016.

(58) Field of Classification Search
USPC .......................................................... 355/67
See application file for complete search history.

(56) References Cited

U.S. PATENT DOCUMENTS

| | | | |
|---|---|---|---|
| 5,859,424 | A | 1/1999 | Norton et al. |
| 6,429,943 | B1 | 8/2002 | Opsal et al. |
| 6,673,638 | B1 | 1/2004 | Bendik et al. |
| 6,842,237 | B2 | 1/2005 | Ausschnitt et al. |
| 6,871,337 | B2 | 3/2005 | Socha |
| 6,884,552 | B2 | 4/2005 | Mieher et al. |
| 6,985,618 | B2 | 1/2006 | Adel et al. |
| 7,030,966 | B2 | 4/2006 | Hansen |
| 7,352,451 | B2 | 4/2008 | Levinski et al. |
| 7,352,453 | B2 | 4/2008 | Mieher et al. |
| 7,382,447 | B2 | 6/2008 | Mieher et al. |
| 7,478,019 | B2 | 1/2009 | Zangooie et al. |
| 7,545,520 | B2 | 6/2009 | Lee et al. |
| 7,564,557 | B2 | 7/2009 | Mieher et al. |
| 7,898,644 | B2 | 3/2011 | Hansen |
| 7,933,026 | B2 | 4/2011 | Opsal et al. |
| 8,009,274 | B2 | 8/2011 | Kim |
| 8,407,632 | B2 | 3/2013 | Elfadel et al. |
| 8,411,287 | B2 | 4/2013 | Smilde et al. |
| 8,438,507 | B2 | 5/2013 | Renwick et al. |
| 8,730,452 | B2 | 5/2014 | Socha |
| 9,291,554 | B2 | 3/2016 | Kuznetsov et al. |
| 9,915,522 | B1 | 3/2018 | Jiang et al. |
| 2004/0161678 | A1* | 8/2004 | Misaka ............... G03F 1/26 430/5 |
| 2008/0030715 | A1 | 2/2008 | Kondo et al. |
| 2009/0316125 | A1* | 12/2009 | Finders ............ G03F 7/70191 355/53 |
| 2010/0081093 | A1* | 4/2010 | Kasa ................ G03F 7/70641 430/319 |
| 2010/0215273 | A1 | 8/2010 | Aksenov et al. |
| 2011/0027704 | A1 | 2/2011 | Cramer et al. |
| 2011/0224932 | A1 | 9/2011 | Huet et al. |
| 2012/0123581 | A1 | 5/2012 | Smilde et al. |
| 2013/0336572 | A1 | 12/2013 | Choi et al. |
| 2014/0111791 | A1 | 4/2014 | Manassen et al. |
| 2014/0172394 | A1 | 6/2014 | Kuznetsov et al. |
| 2015/0085267 | A1 | 3/2015 | Kisteman et al. |
| 2015/0186582 | A1 | 7/2015 | Chen et al. |
| 2015/0293458 | A1* | 10/2015 | Vanoppen ......... G03F 7/70558 355/53 |
| 2016/0216197 | A1 | 7/2016 | Bringoltz et al. |

FOREIGN PATENT DOCUMENTS

| | | |
|---|---|---|
| WO | 2014074868 A1 | 5/2014 |
| WO | 2014082938 A1 | 6/2014 |
| WO | 2015090839 A1 | 6/2015 |

OTHER PUBLICATIONS

Chie Shishido et al., Dose and focus estimation using top-down SEM images, SPIE 5038, Metrology, Inspection, and Process Control for Microlithography XVII, Jun. 2, 2003, 9 pages.

Brunner, Timothy A., "Rim phase-shift mask combined with off-axis illumination: a path to 0.5λ/numerical aperture geometries", Optical Engineering, Oct. 1993, vol. 32, No. 10, pp. 2337-2343.

Brunner, T. A. et al., "Process Monitor Gratings", Proc. of SPIE, vol. 6518, 651803-1, 2007, Downloaded Aug. 21, 2015, 9 pages.

Brunner, T. A. et al., "Quantitative stepper metrology using the focus monitor test mask", SPIE, vol. 2197, Downloaded Aug. 21, 2015, pp. 541-549.

Finders, Jo et al., "DUV Lithography (KrF) for 130 nm Using Off-Axis Illumination and Assisting Features", This paper was first presented at the Semicon, Japan '99, SEMI Technology Symposium, Dec. 1999, Makurhari Messe, Chiba, Japan, 16 pages.

van der Laan, Hans et al., "Aerial image measurement methods for fast aberration set-up and illumination pupil verification", Optical Microlithography XIV, Proceedings of SPIE, vol. 4346 (2001), Downloaded Aug. 26, 2015, pp. 394-407.

Ku, Chin-Yu et al., "Monitoring lithographic focus and tilting performance by off-line overlay measurement tools", J. Vac. Sci. Technol. B 19(5), Sep./Oct. 2001, pp. 1915-1924.

Nakao, Shuji et al., "Implementation of Phase Shift Focus Monitor with Modified Illumination", Optical Microlithography XV, Proceedigs of SPIE, vol. 4691 (2002), Downloaded Aug. 21, 2015, pp. 918-926.

Sears, Monica, "Pupil wavefront manipulation for the compensation of mask topography effects in optical nanolithography", Rochester Institute of Technology, RIT Scholar Works, Thesis/Dissertation Collections, Mar. 1, 2013, 180 pages.

* cited by examiner

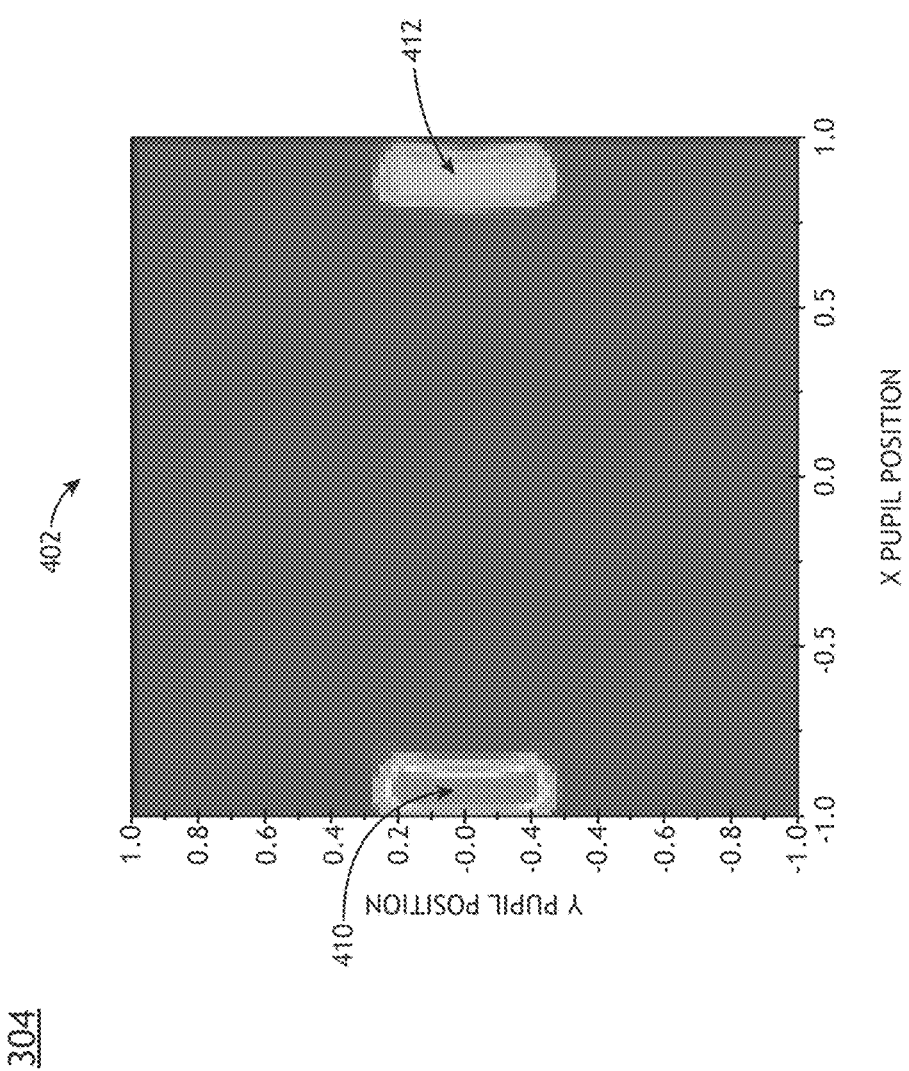

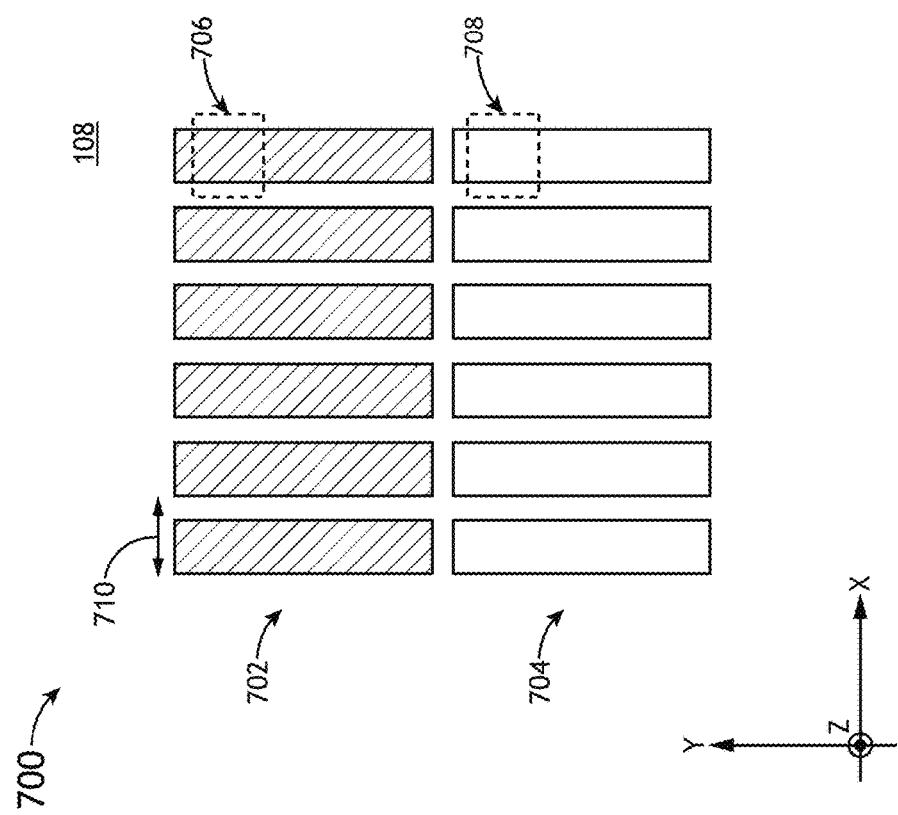

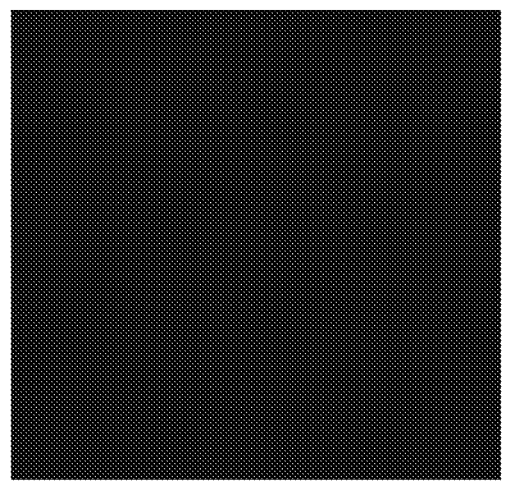
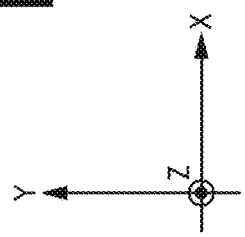
FIG.7C
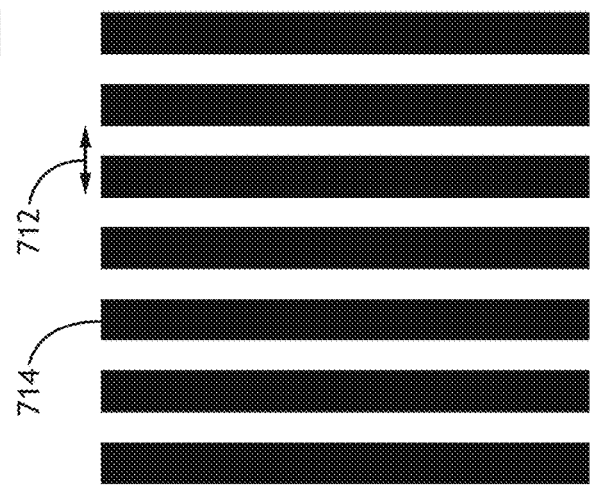
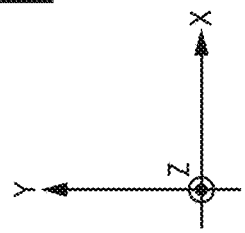
FIG.7B

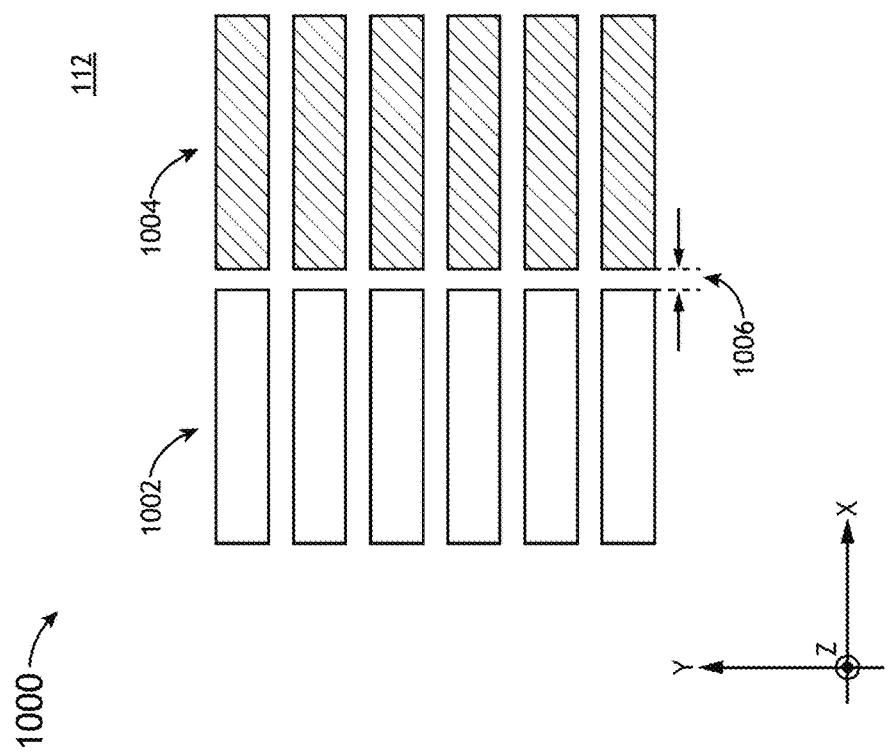

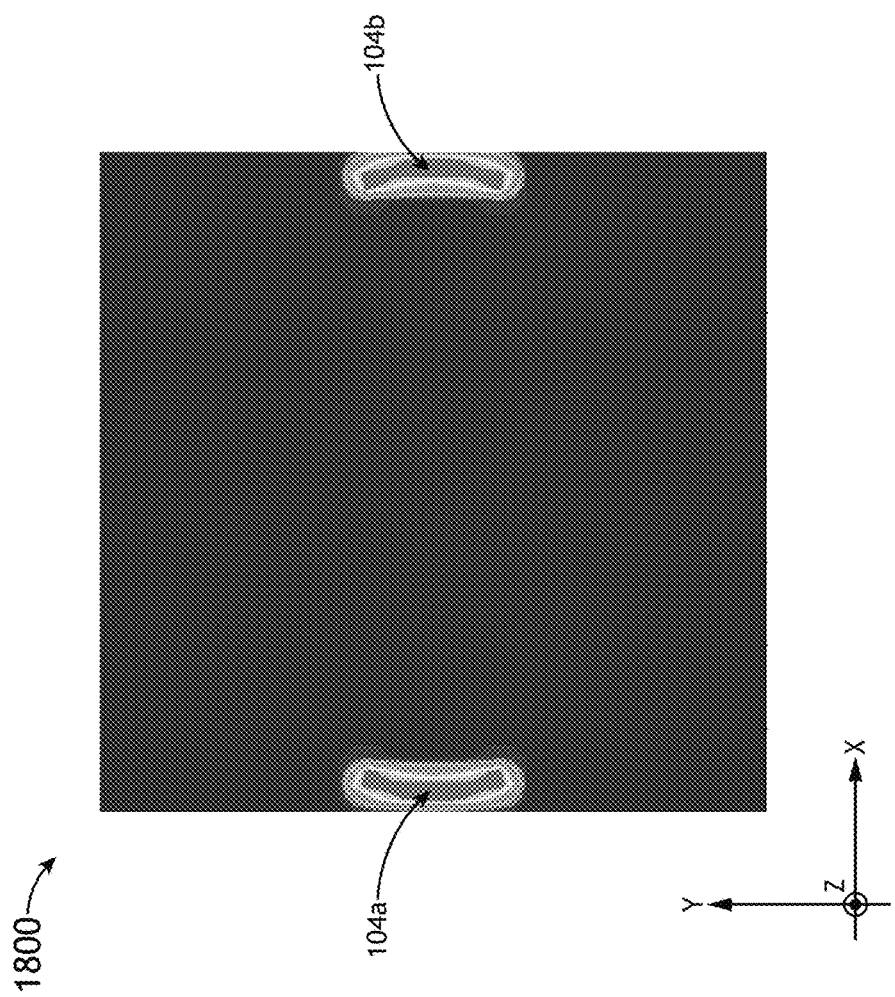

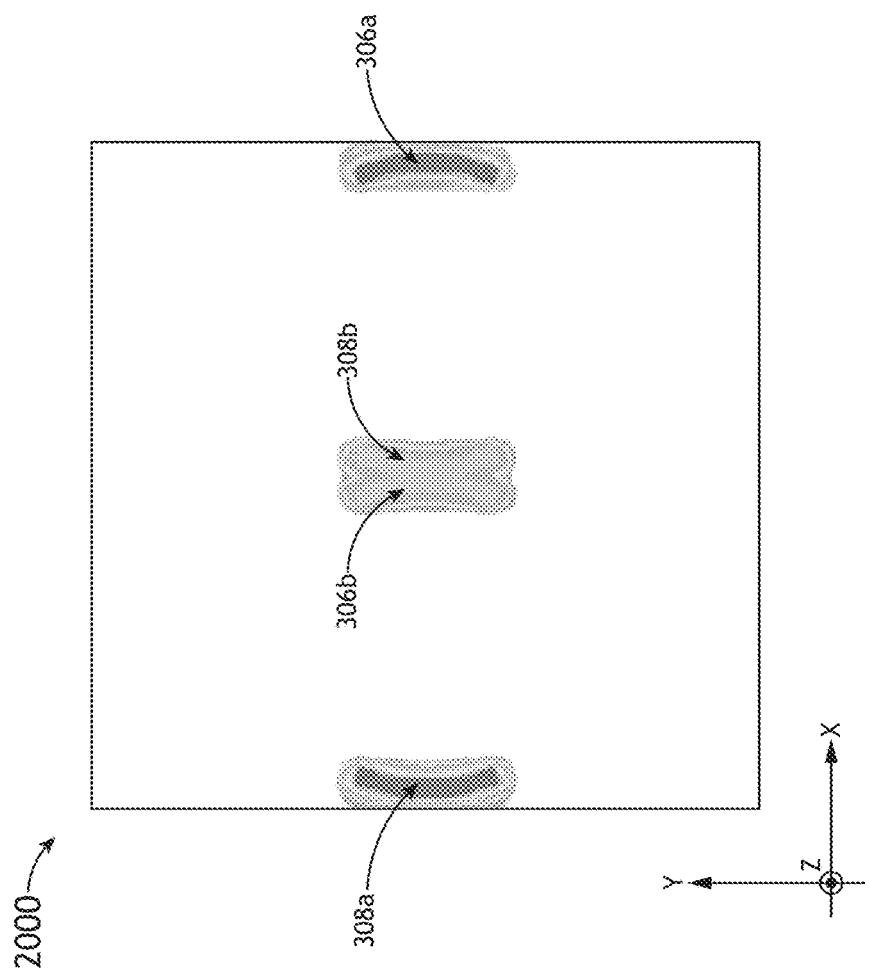

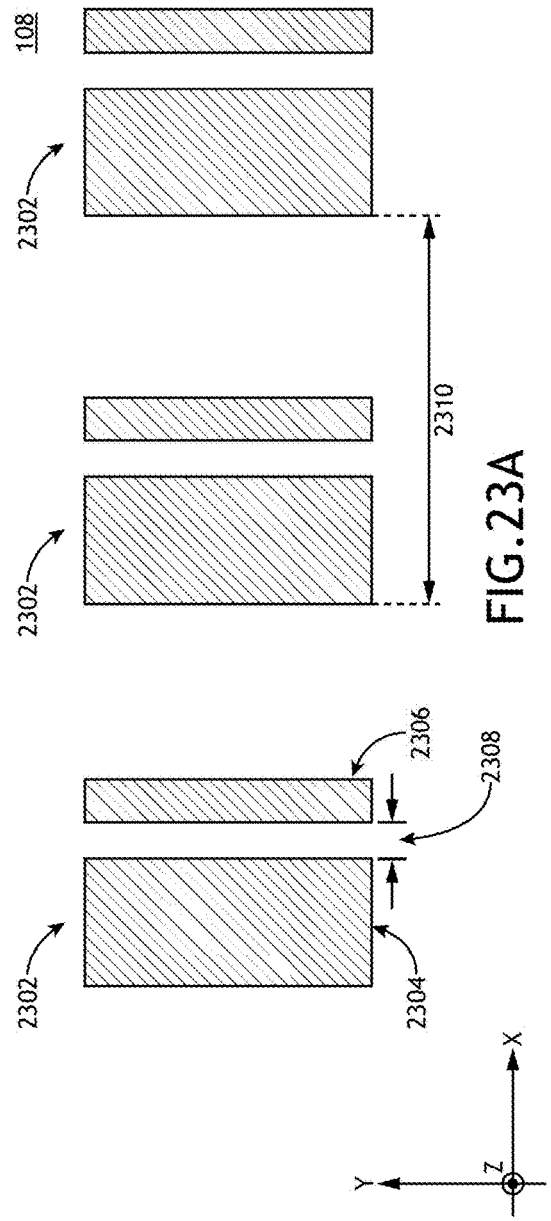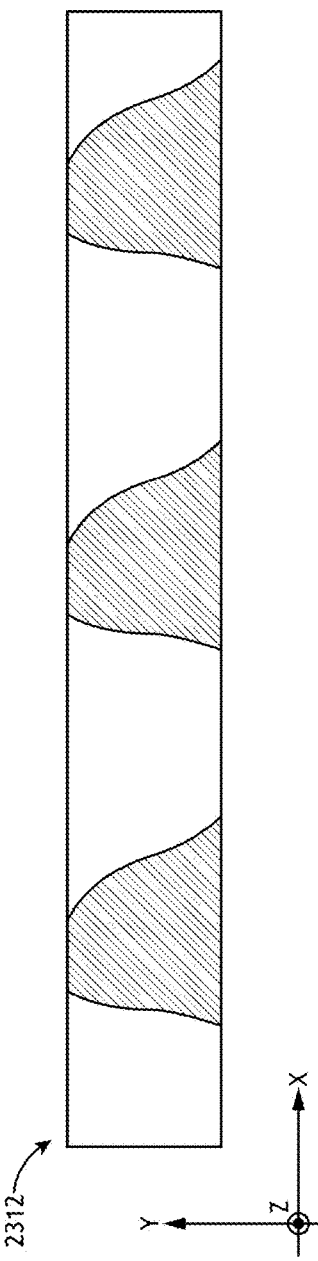

US 10,216,096 B2

PROCESS-SENSITIVE METROLOGY SYSTEMS AND METHODS

CROSS-REFERENCE TO RELATED APPLICATION

The present application claims the benefit under 35 U.S.C. § 119(e) of U.S. Provisional Application Ser. No. 62/205,410, filed Aug. 14, 2015, entitled LITHOGRAPHY-AWARE FOCUS/DOSE MONITORING TARGET DESIGN METHOD, naming Myungjun Lee, Mark D. Smith, Sanjay Kapasi, Stillian Pandev, and Dimitry Sanko as inventors, which is incorporated herein by reference in the entirety.

The present application claims the benefit under 35 U.S.C. § 119(e) of U.S. Provisional Application Ser. No. 62/205,529, filed Aug. 14, 2015, entitled HIGHLY SENSITIVE AND COST-EFFECTIVE FOCUS MONITORING TECHNIQUES USING THE BINARY MASK WITH THE OPTIMIZED OFF-AXIS ILLUMINATION, naming Myungjun Lee and Mark D. Smith as inventors, which is incorporated herein by reference in the entirety.

The present application claims the benefit under 35 U.S.C. § 119(e) of U.S. Provisional Application Ser. No. 62/297,697, filed Feb. 19, 2016, entitled HIGHLY SENSITIVE FOCUS MONITORING TECHNIQUE BASED ON ILLUMINATION AND TARGET CO-OPTIMIZATION, naming Myungjun Lee, Mark D. Smith, Pradeep Subrahmanyan, and Ady Levy as inventors, which is incorporated herein by reference in the entirety.

TECHNICAL FIELD

The present disclosure relates generally to metrology, and more particularly, to co-optimization of illumination sources and metrology targets with process-sensitive pattern masks.

BACKGROUND

Semiconductor lithography tools must typically operate within tight tolerances to properly write features having narrow linewidths and high densities. For example, process parameters such as the focal position of the sample and the dose of illumination received by the sample may be accurately monitored to ensure that printed features are within the desired specifications. Process-sensitive metrology targets are specialized marks patterned onto the wafer during a lithography step in which one or more characteristics of the metrology targets (e.g. alignment of two features) are indicative of a value of a process parameter associated with the lithography step. A process-sensitive metrology target is typically generated as images of pattern masks generated by the lithography tool and may be influenced by particular features on the pattern mask or the illumination source. Further, it is desirable that process-sensitive pattern masks to be used in a semiconductor fabrication line be cost-effective and integrate with the pattern masks used to write the semiconductor devices under production. Therefore, it would be desirable to provide a system and method for curing defects such as those identified above.

SUMMARY

A lithography system is disclosed, in accordance with one or more illustrative embodiments of the present disclosure. In one illustrative embodiment, the system includes an illumination source configured to direct a beam of illumination from an off-axis illumination pole to a pattern mask. In another illustrative embodiment, the pattern mask includes a set of pattern elements configured to generate a set of diffracted beams including illumination from the illumination pole. In another illustrative embodiment, the system includes a set of projection optics. In another illustrative embodiment, at least two diffracted beams of the set of diffracted beams received by the set of projection optics are asymmetrically distributed in a pupil plane of the set of projection optics. In another illustrative embodiment, the at least two diffracted beams of the set of diffracted beams are asymmetrically incident on the sample to form a set of fabricated elements corresponding to an image of the set of pattern elements. In another illustrative embodiment, the set of fabricated elements on the sample includes one or more indicators of a location of the sample along an optical axis of the set of projection optics.

A lithography system is disclosed in accordance with one or more illustrative embodiments of the present disclosure. In one illustrative embodiment, the system includes an off-axis illumination source. In another illustrative embodiment, the illumination source includes a first illumination pole and a second illumination pole. In another illustrative embodiment, the first and second illumination poles are symmetrically distributed with respect to an optical axis. In another illustrative embodiment, the off-axis illumination source is configured to direct illumination from the first and second illumination poles to a pattern mask. In another illustrative embodiment, the pattern mask includes a set of pattern elements. In another illustrative embodiment, the set of pattern elements is configured to generate a first set of diffracted beams including illumination from a first illumination pole diffracted from the set of pattern elements. In another illustrative embodiment, the set of pattern elements is configured to generate a second set of diffracted beams including illumination from the second illumination pole. In another illustrative embodiment, the system includes a set of projection optics. In another illustrative embodiment, at least two diffracted beams of the first set of diffracted beams received by the set of projection optics are symmetrically distributed in a pupil plane of the set of projection optics. In another illustrative embodiment, at least two diffracted beams of the second set of diffracted beams received by the set of projection optics overlap the first set of diffracted beams in the pupil plane. In another illustrative embodiment, the at least two diffracted beams of the first and second sets of diffracted beams of the set of diffracted beams form a set of fabricated elements on the sample corresponding to an image of the set of pattern elements. In another illustrative embodiment, the set of fabricated elements on the sample includes one or more indicators of a dose of illumination on the sample associated with at least two diffracted beams of the first and second sets of diffracted beams.

A metrology system is disclosed in accordance with one or more illustrative embodiments of the present disclosure. In one illustrative embodiment, the system includes a sample stage configured to support a substrate with a metrology target disposed upon the substrate. In another illustrative embodiment, the metrology target is associated with an image of a pattern mask generated by a lithography system. In another illustrative embodiment, the pattern mask includes a set of pattern elements configured to generate a set of diffracted beams including illumination from an off-axis illumination pole of the lithography system. In another illustrative embodiment, at least two diffracted beams of the set of diffracted beams received by the lithography system are asymmetrically distributed in a pupil plane of the lithography system. In another illustrative embodiment, the at least two diffracted beams of the set of diffracted beams are asymmetrically incident on the sample to form a set of fabricated elements of the metrology target. In another illustrative embodiment, the set of fabricated elements of the metrology target includes one or more indicators of a location of the sample along an optical axis of the set of projection optics of the lithography system. In another illustrative embodiment, the system includes at least one illumination source configured to illuminate the metrology target. In another illustrative embodiment, the system includes at least one detector configured to receive illumination from the metrology target. In another illustrative embodiment, the system includes at least one controller communicatively coupled to the detector and configured to determine the location of the sample along the optical axis of the set of projection optics based on the one or more indicators.

A metrology system is disclosed, in accordance with one or more illustrative embodiments of the present disclosure. In one illustrative embodiment, the system includes a sample stage configured to support a substrate with a metrology target disposed upon the substrate. In another illustrative embodiment, the metrology target is associated with an image of a pattern mask generated by a lithography system. In another illustrative embodiment, the pattern mask includes a set of pattern elements configured to generate a set of diffracted beams including illumination from a first illumination pole and a second illumination pole of the lithography system. In another illustrative embodiment, the first and second illumination poles of the lithography system are symmetrically distributed with respect to an optical axis of the lithography system. In another illustrative embodiment, at least two diffracted beams of the first set of diffracted beams received by the lithography system are symmetrically distributed in a pupil plane of the lithography system. In another illustrative embodiment, at least two diffracted beams of the second set of diffracted beams received by the set of projection optics overlap the first set of diffracted beams in the pupil plane of the lithography system. In another illustrative embodiment, the at least two diffracted beams of the first and second sets of diffracted beams of the set of diffracted beams are symmetrically incident on the sample to form a set of fabricated elements of the metrology target. In another illustrative embodiment, the set of fabricated elements of the metrology target includes one or more indicators of a dose of illumination on the sample associated with at least two diffracted beams of the first and second sets of diffracted beams. In another illustrative embodiment, the system includes at least one illumination source configured to illuminate the metrology target. In another illustrative embodiment, the system includes at least one detector configured to receive illumination from the metrology target. In another illustrative embodiment, the system includes at least one controller communicatively coupled to the detector and configured to determine the dose of illumination on the metrology target associated with the at least two diffracted beams of the first and second sets of diffracted beams based on the one or more indicators.

A method for determining a position of a sample along an optical axis of a lithography system is disclosed in accordance with one or more illustrative embodiments of the present disclosure. In one illustrative embodiment, the method includes generating an image of a pattern mask with a lithography system including an off-axis illumination pole. In another illustrative embodiment, the pattern mask includes a set of pattern elements configured to generate a set of diffracted beams including illumination from an off-axis illumination pole of the lithography system. In another illustrative embodiment, at least two diffracted beams of the set of diffracted beams received by the lithography system are asymmetrically distributed in a pupil plane of the lithography system. In another illustrative embodiment, the at least two diffracted beams of the set of diffracted beams are asymmetrically incident on the sample to form a set of fabricated elements of the metrology target. In another illustrative embodiment, the set of fabricated elements of the metrology target includes one or more indicators of a location of the sample along an optical axis of the set of projection optics of the lithography system. In another illustrative embodiment, the method includes measuring the one or more indicators of the location of the sample along the optical axis of the set of projection optics of the lithography system using a metrology system. In another illustrative embodiment, the method includes determining the location of the sample along the optical axis of the set of projection optics based on the one or more indicators.

A method for determining a dose of illumination in a lithography system is disclosed in accordance with one or more illustrative embodiments of the present disclosure. In one illustrative embodiment, the method includes generating an image of a pattern mask with a lithography system including an off-axis illumination pole. In another illustrative embodiment, the pattern mask includes a set of pattern elements configured to generate a set of diffracted beams including illumination from a first illumination pole and a second illumination pole of the lithography system. In another illustrative embodiment, the first and second illumination poles of the lithography system are symmetrically distributed with respect to an optical axis of the lithography system. In another illustrative embodiment, at least two diffracted beams of the first set of diffracted beams received by the lithography system are symmetrically distributed in a pupil plane of the lithography system. In another illustrative embodiment, at least two diffracted beams of the second set of diffracted beams received by the set of projection optics overlap the first set of diffracted beams in the pupil plane of the lithography system. In another illustrative embodiment, the at least two diffracted beams of the first and second sets of diffracted beams of the set of diffracted beams are symmetrically incident on the sample to form a set of fabricated elements of the metrology target. In another illustrative embodiment, the set of fabricated elements of the metrology target includes one or more indicators of a dose of illumination on the sample associated with at least two diffracted beams of the first and second sets of diffracted beams. In another illustrative embodiment, the method includes measuring the one or more indicators of the dose of illumination on the metrology target associated with at least two diffracted beams of the first and second sets of diffracted beams. In another illustrative embodiment, the method includes determining the dose of illumination on the metrology target based on the one or more indicators.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 4A is a plot illustrating the distribution of diffracted beams in a pupil plane associated with an off-axis single-pole illumination source and a pattern mask with a pitch of 80 nm, in accordance with one or more embodiments of the present disclosure.

FIG. 7A is a top view of a focus-sensitive pattern mask including focus-sensitive pattern elements and focus-insensitive pattern elements, in accordance with one or more embodiments of the present disclosure.

FIG. 7B is an enlarged view of a portion of a focus-sensitive pattern element, in accordance with one or more embodiments of the present disclosure.

FIG. 7C is an enlarged view of a portion of a focus-insensitive pattern element, in accordance with one or more embodiments of the present disclosure.

FIG. 10 is a top view of a focus-sensitive printed metrology target corresponding to a focus-sensitive pattern mask, in accordance with one or more embodiments of the present disclosure.

FIG. 18 is a plot of an exemplary intensity distribution of an illumination source for printing process-sensitive metrology targets, in accordance with one or more embodiments of the present disclosure.

FIG. 20 is a plot illustrating the distribution of diffracted beams in the pupil plane of a lithography system for the generation of a focus-sensitive metrology target, in accordance with one or more embodiments of the present disclosure.

FIG. 23A is a top view of asymmetric segmented pattern elements for the generation of focus-sensitive metrology targets, in accordance with one or more embodiments of the present disclosure.

FIG. 23B is a schematic view of simulated printed pattern profiles of a resist layer corresponding to asymmetric segmented pattern elements, in accordance with one or more embodiments of the present disclosure.

DETAILED DESCRIPTION

Figure 1A:
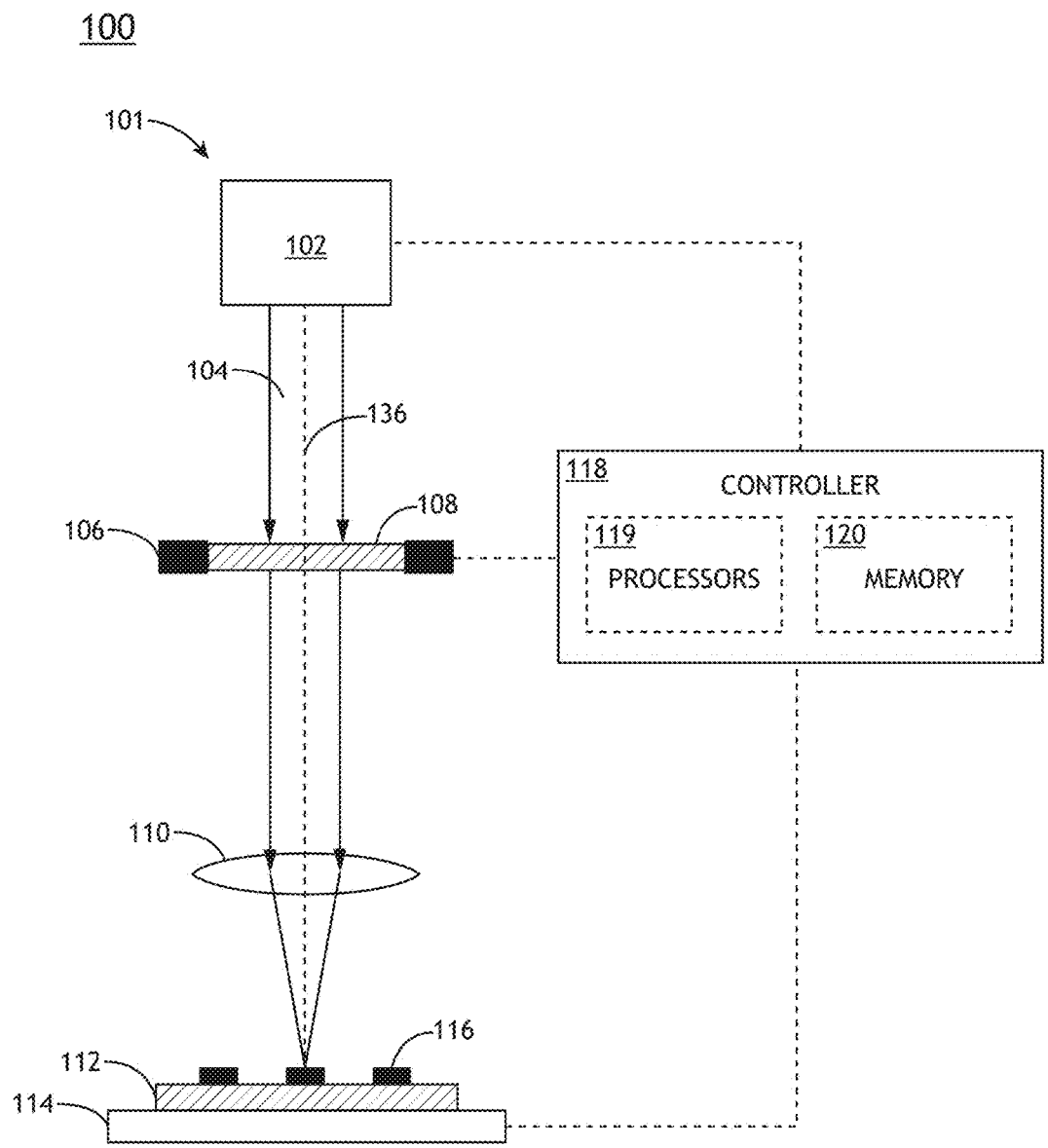
FIG. 1A is a conceptual view illustrating a system including a lithography sub-system for lithographically printing one or more patterns to a sample, in accordance with one or more embodiments of the present disclosure.

Reference will now be made in detail to the subject matter disclosed, which is illustrated in the accompanying drawings.

Embodiments of the present disclosure are directed to the co-optimization of a pattern mask and an illumination source of a lithography tool to generate process-sensitive metrology targets on a sample. Some embodiments of the present disclosure are directed to focus-sensitive metrology targets in which a deviation of the focal position of the sample within the lithography tool from a nominal focal position is manifested as a variation of one or more characteristics of the focus-sensitive metrology targets that are measurable by a metrology tool. Additional embodiments of the present disclosure are directed to exposure-sensitive metrology targets in which a deviation of the exposure dose of the sample by the illumination source from a nominal value is manifested as a variation of one or more characteristics of the exposure-sensitive metrology targets that are measurable by a metrology tool. Some embodiments of the present disclosure are directed to asymmetric off-axis illumination sources to generate process-sensitive metrology targets. Additional embodiments are directed to symmetric off-axis illumination sources to generate process-sensitive metrology targets. Further embodiments of the present disclosure are directed to pattern masks with pattern elements designed based on a known illumination profile of an illumination source to provide process-sensitive metrology targets.

It is recognized herein that, in the context of lithographic printing, the process window associated with the fabrication of printed features on a sample typically defines ranges of process parameters suitable for fabrication of the printed features within a specified tolerance. For example, a process window may define limits on the defocus associated with the position of the sample along the optical axis of the lithography tool (e.g. the focal position of the sample). By way of another example, a process window may define limits on the dose of energy from the illumination source incident on the sample (e.g. the exposure of the sample). Further, the impacts of variations of multiple process parameters on one or more characteristics of the printed features may be interdependent. In this regard, a process window may include a multi-dimensional analysis of multiple process parameters (e.g. a focus-exposure matrix (FEM), or the like) to define acceptable ranges of process parameters of interest. Accordingly, precise monitoring of process parameters such as, but not limited to, focal position of the sample and the dose of energy incident on the sample from an illumination source, may facilitate performance of lithography tools according to desired specifications.

It is further recognized that the degree to which characteristics of a printed feature are robust to deviations of process parameters may depend on a variety of factors. For example, robustness to deviations of process parameters may be influenced by characteristics of the desired pattern features such as, but not limited to, the dimensions and/or the density of the desired printed features. Additionally, robustness to deviations of process parameters may be influenced by optical characteristics of the lithography tool such as, but not limited to, the depth of focus (DOF), the numerical aperture (NA) of projection optics, the shape of the illumination source, the symmetry of the illumination source, the spectral content of the illumination source, or coherence of the illumination source. Further, robustness to deviations of process parameters may be influenced by characteristics of the pattern mask imaged onto the sample to generate the printed patterns such as, but not limited to, the transmission of pattern elements, the optical phase induced by the pattern elements, or the dimensions of pattern elements with respect to the resolution of the projection optics. Further, many such characteristics associated with the robustness of printed parameters may be interdependent.

Embodiments of the present disclosure are directed to co-optimization of pattern elements on a pattern mask and the illumination source such that one or more characteristics of printed patterns of metrology targets on the sample (e.g. positions of one or more printed elements, separation distances between printed elements, sidewall angles of printed elements, or the like) are highly sensitive to changes in process parameters (e.g. focal position of the sample, dose of illumination energy incident on the sample, or the like). In some embodiments, pattern elements on a pattern mask associated with a process-sensitive metrology target are designed to utilize the same illumination conditions (shape of the illumination source, symmetry of the illumination source, or the like) as printed patterns associated with fabricated devices. In this regard, a process-sensitive metrology target may be printed on a sample in the same process step or series of process steps as pattern elements associated with fabricated devices. In some embodiments, pattern elements on a pattern mask associated with a process-sensitive metrology target are designed to be utilized with a custom illumination source profile. In this regard, a process-sensitive metrology target may be printed in a dedicated process step.

Process-sensitive lithographic features are generally described in U.S. Pat. No. 6,673,638, issued on Jan. 6, 2004, which is incorporated by reference in the entirety. Focus masking structures are generally described in U.S. Pat. No. 6,884,552, issued on Apr. 26, 2005, which is incorporated by reference in the entirety. Determining lithographic focus and exposure is generally described in U.S. Pat. No. 7,382,447, issued on Jun. 3, 2008, which is incorporated by reference in the entirety. Process optimization and control using scatterometry signals is generally described in U.S. Pat. No. 7,352,453, issued on Apr. 1, 2008, which is incorporated by reference in the entirety. Detecting overlay errors using scatterometry is generally described in U.S. Pat. No. 7,564,557, issued on Jul. 21, 2009, which is incorporated by reference in the entirety.

As used throughout the present disclosure, the term "sample" generally refers to a substrate formed of a semiconductor or non-semiconductor material (e.g. a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a conceptual view illustrating a system 100 including a lithography sub-system 101 for lithographically printing one or more patterns to a sample, in accordance with one or more embodiments of the present disclosure. In one embodiment, the system 100 consists of a lithographic sub-system 101. The lithographic sub-system 101 may include any lithographic printing tool known in the art. For example, the lithographic sub-system 101 may include, but is not limited to, a scanner or stepper.

In another embodiment, the lithographic sub-system 101 may include an illumination source 102 configured to generate one or more illumination beams 104. The one or more illumination beams 104 may include one or more selected wavelengths of light including, but not limited to, ultraviolet (UV) radiation, visible radiation, or infrared (IR) radiation. In another embodiment, the wavelengths of radiation of the one or more illumination beams 104 emitted by the illumination source 102 are tunable. In this regard, the wavelengths of radiation of the one or more illumination beams 104 may be adjusted to any selected wavelength of radiation (e.g. UV radiation, visible radiation, infrared radiation, or the like). In another embodiment, the illumination source 102 may generate one or more illumination beams 104 having any pattern known in the art. For example, the illumination source 102 may include, but is not limited to, a single-pole illumination source, a dipole illumination source, a C-Quad illumination source, a Quasar illumination source, or a free-form illumination source.

In another embodiment, the lithography sub-system 101 includes a mask support device 106. The mask support device 106 is configured to secure a pattern mask 108. In this regard, the support device 106 may hold the pattern mask 108 utilizing any means known in the art, such as, but not limited to, a mechanical, vacuum, electrostatic or other clamping technique. In another embodiment, the lithography sub-system 101 includes a set of projection optics 110 configured to project an image of the pattern mask 108 illuminated by the one or more illumination beams 104 onto the surface of a sample 112 disposed on a sample stage 114. For example, the set of projection optics 110 may be configured to project an image of the pattern mask 108 onto a resist layer 116 on the sample 112 to generate (e.g. expose, or the like) a printed pattern element (e.g. a metrology pattern) on the resist layer 116 corresponding to a pattern element on the pattern mask 108. In another embodiment, the support device 106 may be configured to actuate or position the pattern mask 108. For example, the support device 106 may actuate the pattern mask 108 to a selected position with respect to the projection optics 110 of the system 100.

The pattern mask 108 may be a reflective or a transmissive element. In one embodiment, the pattern mask 108 is a transmissive element in which pattern elements fully or partially block the transmission of an illumination beam 104 (e.g. through absorption or reflection of the illumination beam 104). Accordingly, the illumination beam 104 may be transmitted through spaces between pattern elements to the set of projection optics 110. For example, a pattern mask 108 in which pattern elements fully block the transmission of the illumination beam 104 may operate as a binary pattern mask. It is further recognized that focus-sensitive binary pattern masks in which light from an illumination source is either fully blocked or fully transmitted/reflected to generate an image may be advantageously utilized to determine a focal position of a sample in a lithography system. For example, binary pattern masks are relatively inexpensive to fabricate and may be readily incorporated into many lithography systems.

In another embodiment, features of the pattern mask 108 (e.g. pattern elements, spaces between pattern elements, or the like) are designed to modify the optical phase of an illumination beam 104. In this regard, the pattern mask 108 may operate as a phase mask (e.g. an alternating phase shift mask, or the like).

In another embodiment, the pattern mask 108 is a reflective mask in which segments 202 fully or partially reflect an illumination beam 104 to the set of projection optics 110 and the spaces between segments 202 absorb or transmit the illumination beam 104. Further, pattern elements of the pattern mask 108 may be formed from any opaque or semi-opaque material known in the art for reflecting and/or absorbing an illumination beam 104. In another embodiment, the segments 202 may include a metal. For example, the segments 202 may be, but are not required to be, formed from chrome (e.g. a chrome alloy, or the like).

The pattern mask 108 may be utilized (e.g. by lithography sub-system 101) in any imaging configuration known in the art. For example, the pattern mask 108 may be a positive mask in which pattern elements are positively imaged as printed pattern elements of a resist layer 116 of sample 112. By way of another example, the pattern mask 108 may be a negative mask in which pattern elements of the pattern mask 108 form negative printed pattern elements (e.g. gaps, spaces, or the like) of a resist layer 116 of sample 112.

In another embodiment, the lithography sub-system 101 includes a controller 118 to control the various sub-systems of the lithography sub-system 101. In another embodiment, the controller 118 includes one or more processors 119 configured to execute program instructions maintained on a memory medium 120. In this regard, the one or more processors 119 of controller 118 may execute any of the various process steps described throughout the present disclosure. Further, the controller 118 may be communicatively coupled to the mask support device 106 and/or the sample stage 114 to direct the transfer of pattern elements on a pattern mask 108 to a sample 112 (e.g. a resist layer 116 on the sample 112, or the like). It is noted herein that the lithography sub-system 101 of the present invention may implement any of the pattern mask designs described throughout the present disclosure. Lee et al. generally describe mask-based lithography in U.S. Pat. No. 7,545,520, issued on Jun. 9, 2009, which is incorporated herein in the entirety.

Figure 1B:
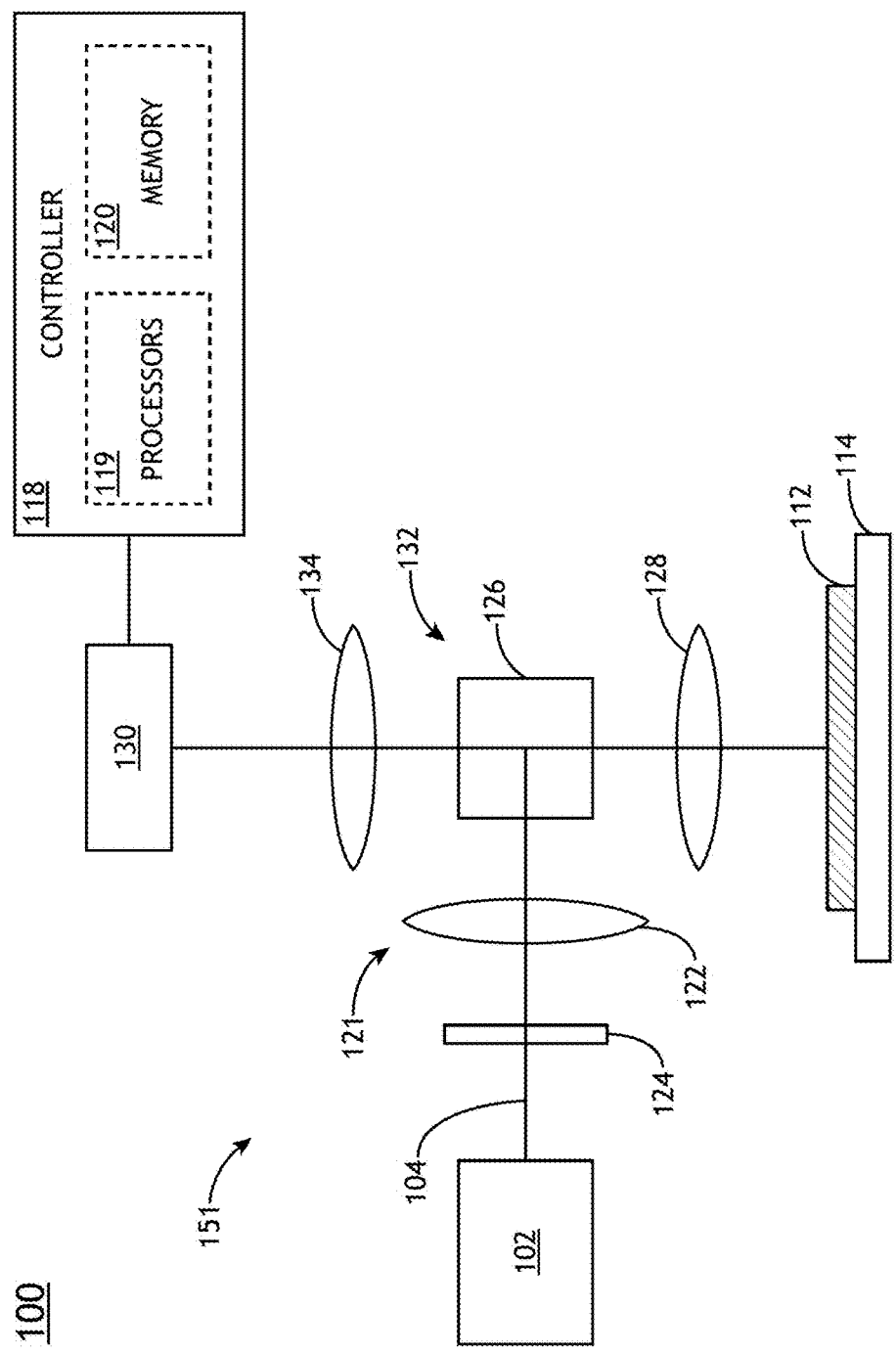
FIG. 1B is a conceptual view illustrating a metrology sub-system, in accordance with one or more embodiments of the present disclosure.

FIG. 1B is a conceptual view illustrating a metrology sub-system 151, in accordance with one or more embodiments of the present disclosure. The metrology sub-system 151 may measure any metrology metric (e.g. overlay error, CD, or the like) using any method known in the art. In one embodiment, the metrology sub-system 151 includes an image-based metrology tool to measure metrology data based on the generation of one or more images of the sample 112. In another embodiment, the metrology sub-system 151 includes a scatterometry-based metrology system to measure metrology data based on the scattering (reflection, diffraction, diffuse scattering, or the like) of light from the sample 112.

In another embodiment, the illumination source 102 directs the one or more illumination beams 104 to the sample 112 via an illumination pathway 121. The illumination pathway 121 may include one or more lenses 122. Further, the illumination pathway 121 may include one or more additional optical components 124 suitable for modifying and/or conditioning the one or more illumination beams 104. For example, the one or more optical components 124 may include, but are not limited to, one or more polarizers, one or more filters, one or more beam splitters, one or more diffusers, one or more homogenizers, one or more apodizers, or one or more beam shapers. In one embodiment, the illumination pathway 121 includes a beamsplitter 126. In another embodiment, the metrology sub-system 151 includes an objective lens 128 to focus the one or more illumination beams 104 onto the sample 112.

The illumination source 102 may direct the one or more illumination beams 104 to the sample 112 at any angle via the illumination pathway 121. In one embodiment, the illumination source 102 directs the one or more illumination beams 104 to the sample 112 at normal incidence angle. In another embodiment, the illumination source 102 directs the one or more illumination beams 104 to the sample 112 at an angle (e.g. a glancing angle, a 45-degree angle, or the like).

In another embodiment, the metrology sub-system 151 includes one or more detectors 130 configured to capture radiation emanating from the sample 112 through a collection pathway 132. The collection pathway 132 may include multiple optical elements to direct and/or modify illumination collected by the objective lens 128 including, but not limited to one or more lenses 134, one or more filters, one or more polarizers, one or more beam blocks, or one or more beamsplitters.

For example, a detector 130 may receive an image of the sample 112 provided by elements in the collection pathway 132 (e.g. the objective lens 128, the one or more optical elements, 134, or the like). By way of another example, a detector 130 may receive radiation reflected or scattered (e.g. via specular reflection, diffuse reflection, and the like) from the sample 112. By way of another example, a detector 130 may receive radiation generated by the sample 112 (e.g. luminescence associated with absorption of the one or more illumination beams 104, and the like). By way of another example, a detector 130 may receive one or more diffracted orders of radiation from the sample 112 (e.g. 0-order diffraction, ±1 order diffraction, ±2 order diffraction, and the like). Further, it is noted herein that the one or more detectors 130 may include any optical detector known in the art suitable for measuring illumination received from the sample 112. For example, a detector 130 may include, but is not limited to, a CCD detector, a TDI detector, a photomultiplier tube (PMT), an avalanche photodiode (APD), or the like. In another embodiment, a detector 130 may include a spectroscopic detector suitable for identifying wavelengths of radiation emanating from the sample 112. Further, the metrology sub-system 151 may include multiple detectors 130 (e.g. associated with multiple beam paths generated by one or more beamsplitters) to facilitate multiple metrology measurements (e.g. multiple metrology tools) by the metrology sub-system 151.

In another embodiment, the metrology sub-system 151 is communicatively coupled to the controller 118 of system 100. In this regard, the controller 118 may be configured to receive data including, but not limited to, metrology data (e.g. metrology measurement results, images of the target, pupil images, and the like) or metrology metrics (e.g. precision, tool-induced shift, sensitivity, diffraction efficiency, through-focus slope, side wall angle, critical dimensions, and the like).

Figure 1C:
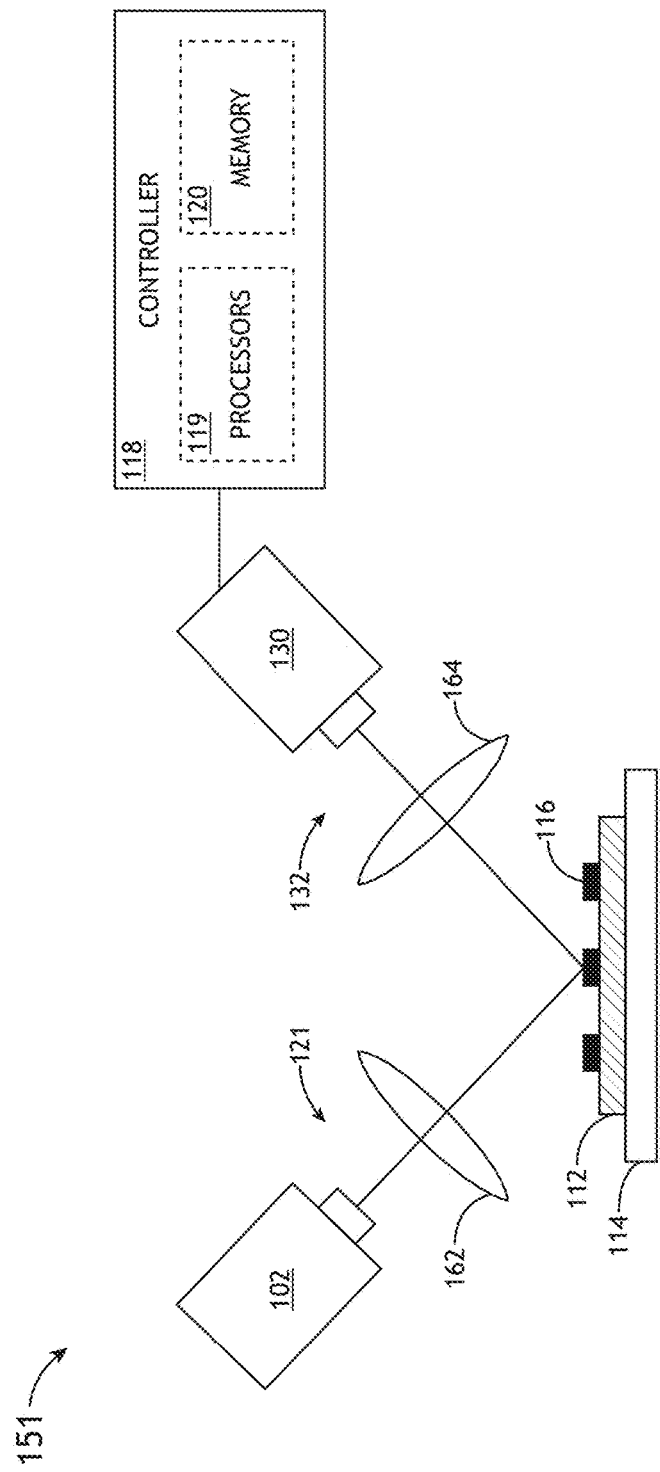
FIG. 1C is a conceptual view illustrating a metrology sub-system, in accordance with one or more embodiments of the present disclosure.

FIG. 1C is a conceptual view illustrating a metrology sub-system 151, in accordance with another embodiment of the present disclosure. In one embodiment, the illumination pathway 121 and the collection pathway 132 contain separate elements. For example, the illumination pathway 121 may utilize a first focusing element 162 to focus the one or more illumination beams 104 onto the sample 112 and the collection pathway 132 may utilize a second focusing element 164 to collect radiation from the sample 112. In this regard, the numerical apertures of the first focusing element 162 and the second focusing element 164 may be different. Further, it is noted herein that the metrology sub-system 151 depicted in FIG. 1C may facilitate multi-angle illumination of the sample 112, and/or more than one illumination source 102 (e.g. coupled to one or more additional detectors 130). In this regard, the metrology sub-system 151 depicted in FIG. 1B may perform multiple metrology measurements. In another embodiment, one or more optical components may be mounted to a rotatable arm (not shown) pivoting around the sample 112 such that the angle of incidence of the one or more illumination beams 104 on the sample 112 may be controlled by the position of the rotatable arm.

Figure 2:
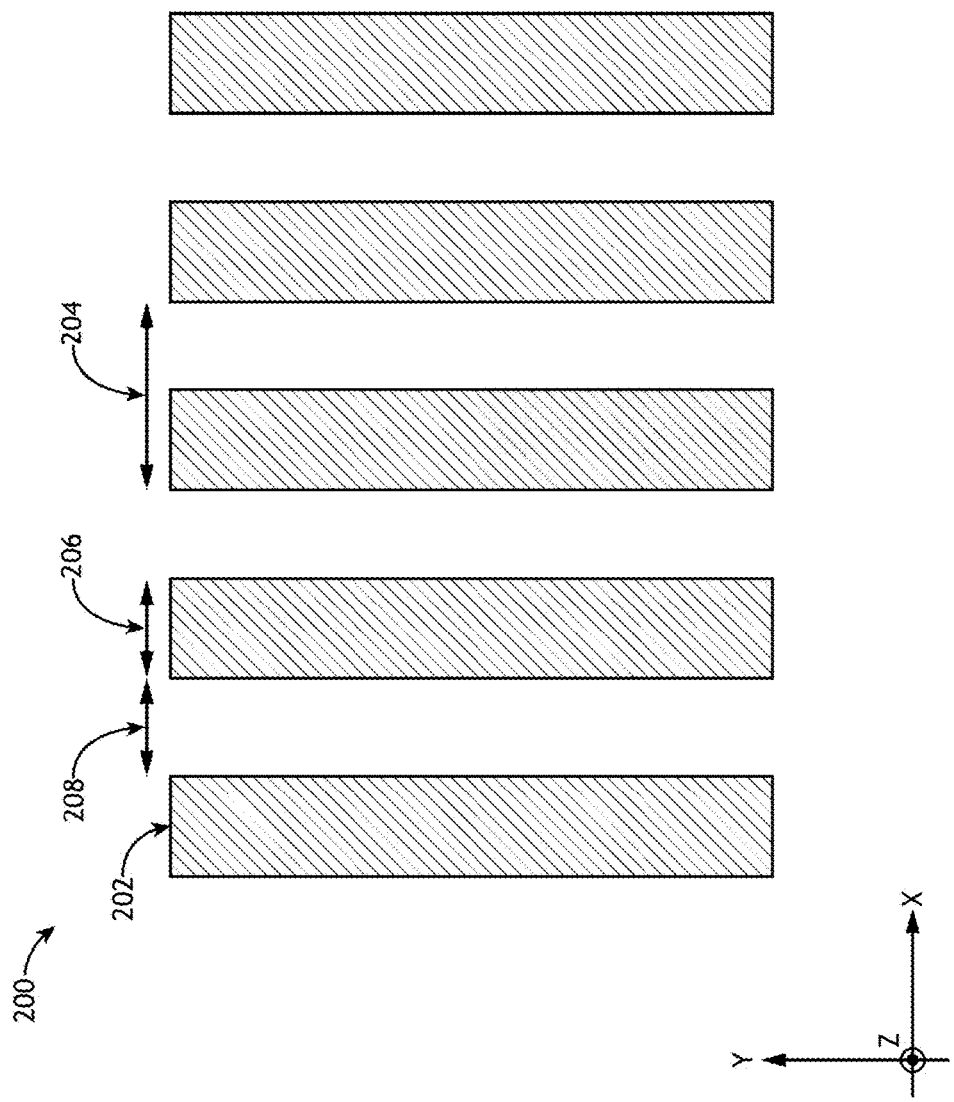
FIG. 2 is a schematic view illustrating a pattern mask including a segmented pattern element, in accordance with one or more embodiments of the present disclosure.

FIG. 2 is a schematic view illustrating a pattern mask 108 including a segmented pattern element 200, in accordance with one or more embodiments of the present disclosure. In one embodiment, the segmented pattern element 200 of pattern mask 108 includes a plurality of periodically distributed segments 202 having a pitch 204 (e.g. line/space (LS) pattern elements). In this regard, segmented pattern element 200 may induce diffraction of one or more illumination beams 104. For example, an illumination beam 104 incident on the pattern mask 108 may be diffracted into multiple diffracted beams separated along the X-direction corresponding to multiple diffraction orders (e.g. 0 order, ±1 order, ±2 order, and the like). In another embodiment, a width of segments 206 along the X-direction is equal to a separation distance 208 between segments 202 such that pattern element 200 is a 1:1 line/space target. In another embodiment, the width of segments 206 along the X-direction is not equal to a separation distance 208 between segments 202.

Figure 3A:
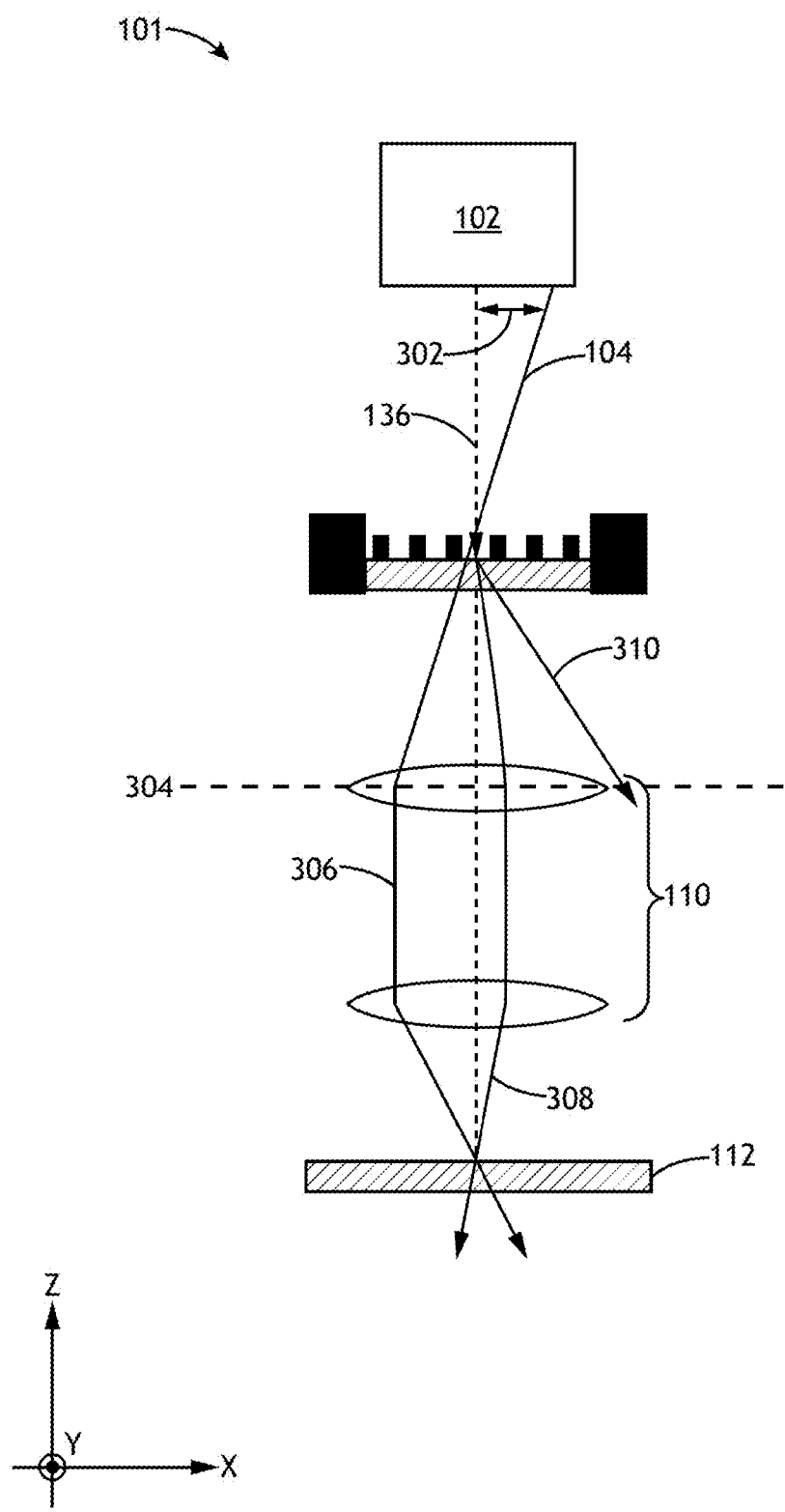
FIG. 3A is a conceptual view of the lithography sub-system illustrating multiple diffracted beams generated by a pattern mask, in accordance with one or more embodiments of the present disclosure.
Figure 3C:
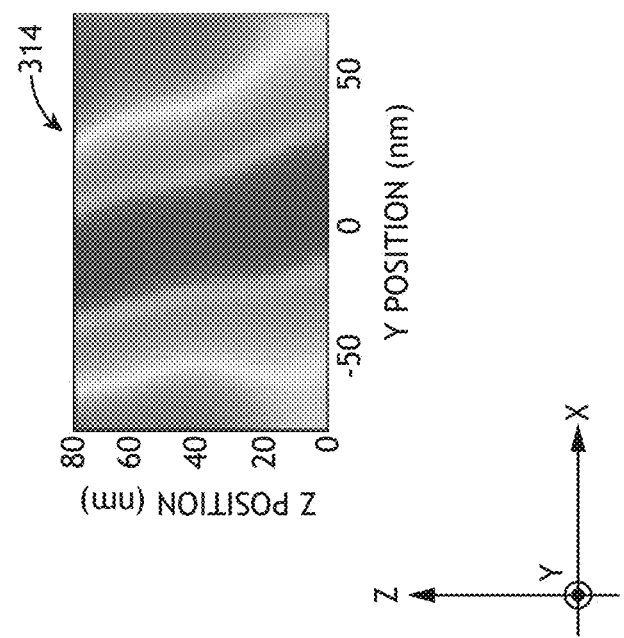
FIG. 3C is a plot illustrating the relative acid concentration within a resist layer of a sample exposed by asymmetric illumination as shown in FIGS. 3A and 3B, in accordance with one or more embodiments of the present disclosure.
Figure 3B:
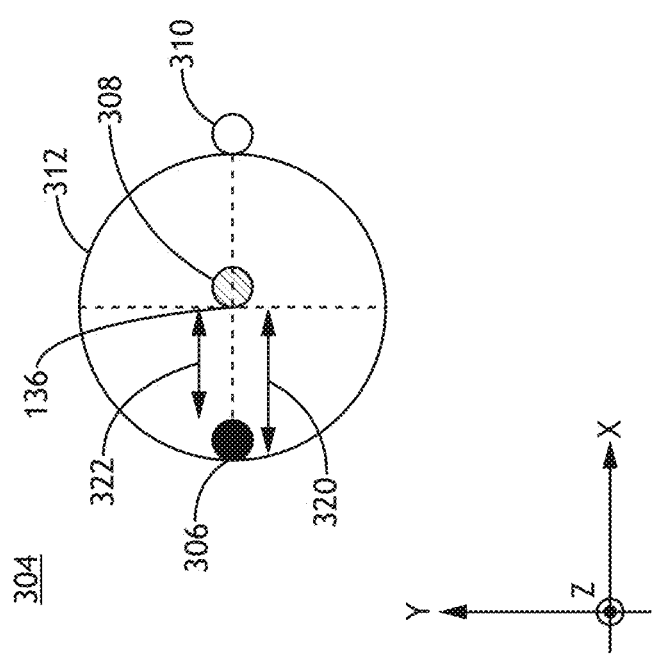
FIG. 3B is a conceptual view of a pupil plane of the set of projection optics illustrating the relative positions of diffracted beams within the pupil plane, in accordance with one or more embodiments of the present disclosure.

FIGS. 3A through 3C illustrate the co-optimization of the illumination source 102 and the pattern mask 108 to generate an asymmetric aerial imaging profile on a sample 112 for a focus-sensitive metrology target, in accordance with one or more embodiments of the present disclosure.

FIG. 3A is a conceptual view of the lithography sub-system 101 illustrating multiple diffracted beams generated by a pattern mask 108, in accordance with one or more embodiments of the present disclosure. In one embodiment, the illumination source 102 generates an off-axis illumination beam 104. In another embodiment, the pattern mask 108 diffracts the incident illumination beam 104 to generate multiple diffracted beams including, but not limited to, a 0-order diffracted beam 306, a $1^{st}$ order diffracted beam 308 and a $2^{nd}$ order diffracted beam 310. In another embodiment, two of the diffracted beams (e.g. 306 and 308) are captured by the set of projection optics 110 and directed to the sample 112 (e.g. a resist layer 116 of sample 112) to generate an aerial image of the pattern mask 108 on the sample 112.

FIG. 3B is a conceptual view of a pupil plane 304 of the set of projection optics 110 illustrating relative positions of diffracted beams within the pupil plane, in accordance with one or more embodiments of the present disclosure. In one embodiment, the pupil plane 304 is characterized as a circle with radius 1 (e.g. a pupil limit 312) such that illumination from the sample 112 within the pupil limit 312 is captured by the set of projection optics 110 and illumination falling outside the pupil limit 312 is not captured by the set of projection optics 110 and thus does not contribute to the generation of the aerial image of the pattern mask 108 on the sample 112.

For example, the 0-order diffracted beam 306 and the $1^{st}$ order diffracted beam 308 may lie within the pupil limit 312 of pupil plane 304 (e.g. an entrance pupil plane as illustrated in FIG. 3A, an exit pupil plane, or the like) and are thus captured by the set of projection optics 110, while the $2^{nd}$ order diffracted beam 310 is outside the pupil limit 312 and is not captured by the set of projection optics 110. Further, a location of a portion of a diffracted beam (e.g. any of diffracted beams 306-310) within the pupil plane 304 may be described as a radial position, σ, with respect to the center of the pupil plane 304 (e.g. optical axis 136). For example, the width of diffracted beam 306 along the X-direction may be described as a difference between an outer position, $\sigma_{out}$, and an inner position, $\sigma_{in}$, of the diffracted beam 306.

In another embodiment, the distribution of diffracted beams 306, 308 in the pupil plane 304 provides asymmetric illumination of the sample 112. For example, as illustrated in FIG. 3B, the diffracted beams 306-310 may be distributed such that the 0-order diffracted beam 306 is located on an internal edge of the pupil limit 312, whereas the $2^{nd}$ order diffracted beam 310 lies on the outer edge of the pupil limit 312 and is not captured by the set of projection optics 110. Accordingly, the set of projection optics 110 may generate an aerial image using the highly off-axis 0-order diffracted beam 306 and a slightly off-axis $1^{st}$ order diffracted beam 308 such that the optical paths of the diffracted beams 306, 308 are asymmetrically incident on the sample 112 (e.g. as shown in FIG. 3A).

In another embodiment, an asymmetric distribution of diffracted beams within the pupil plane 304 (e.g., within the pupil limits 312) provides asymmetric illumination of the sample 112 associated with the generation of the aerial image of the pattern mask 108. FIG. 3C is a plot illustrating the relative acid concentration 314 within a resist layer 116 of sample 112 exposed by asymmetric illumination as shown in FIGS. 3A and 3B, in accordance with one or more embodiments of the present disclosure. In this regard, FIG. 3C may be a latent image representative of the spatial distribution of the aerial image within the resist layer 116. It is noted herein that the asymmetric illumination may generate an asymmetric exposure profile of the resist layer 116. Accordingly, development of the resist layer 116 may generate asymmetric printed elements having one or more characteristics (e.g., a position of the top of the corresponding printed element, a critical dimension associated with the separation of printed elements, one or more sidewall angles, or the like) that vary as a function of the focal position of the sample 112 along the optic axis 136. In this regard, the corresponding printed pattern elements may operate as focus-sensitive printed pattern elements.

It is noted herein that the separation of diffracted beams, the number of diffracted beams captured by the projection optics 110, and the relative positions of the captured diffracted beams within the pupil plane 304 may be controlled by adjusting parameters associated with the illumination source 102 and the pattern mask 108 (e.g. by co-optimizing the illumination source 102 and the pattern mask 108). In this regard, the separation of diffracted beams, the number of diffracted beams captured by the projection optics 110, and the relative positions of the captured diffracted beams within the pupil plane 304 may be determined at least in part by the illumination source 102 and the pattern mask 108. For example, a 0-order diffracted beam 306 may propagate along a straight path from the illumination source 102 through the pattern mask 108 (e.g. undiffracted) to the set of projection optics 110. Accordingly, a shape of an illumination beam 104 (e.g. the diameter of an illumination pole, or the like) as well as an off-axis pole distance 302 (e.g. a distance between the illumination beam 104 and the optic axis 136 of the set of projection optics 110) may determine the position of the 0-order diffracted beam 306 in the pupil plane 304. By way of another example, the positions of higher-order diffracted beams (e.g. $1^{st}$ order diffracted beam 308, $2^{nd}$ order diffracted beam 310, or the like) in the pupil plane 304 are determined by a pitch of pattern elements of the pattern mask 108 (e.g. pitch 204 of segmented pattern element 200, or the like) as well as the off-axis pole distance 302.

Figure 3D:
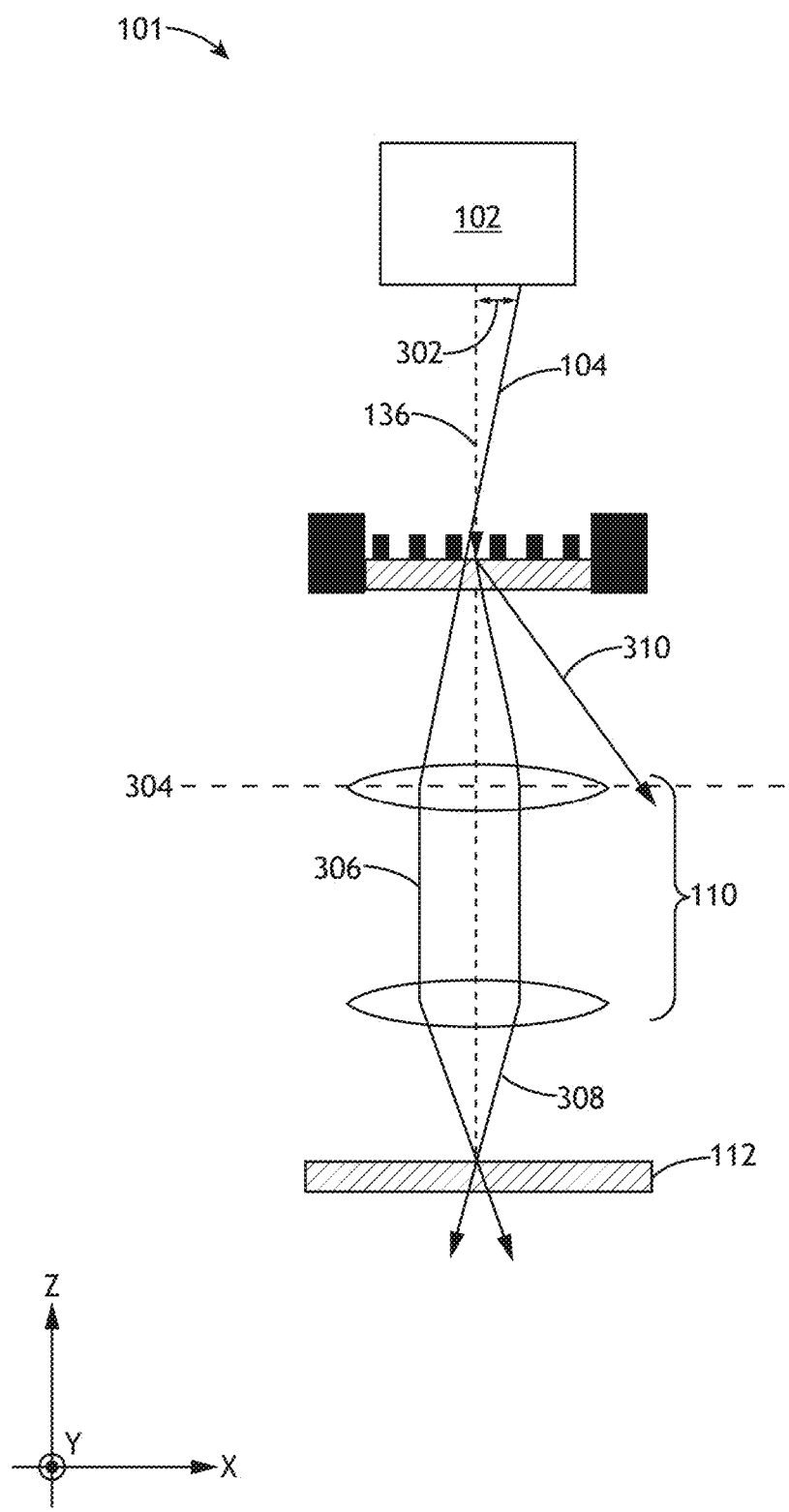
FIG. 3D is a conceptual view of the lithography sub-system illustrating multiple diffracted beams generated by a pattern mask, in accordance with one or more embodiments of the present disclosure.
Figure 3F:
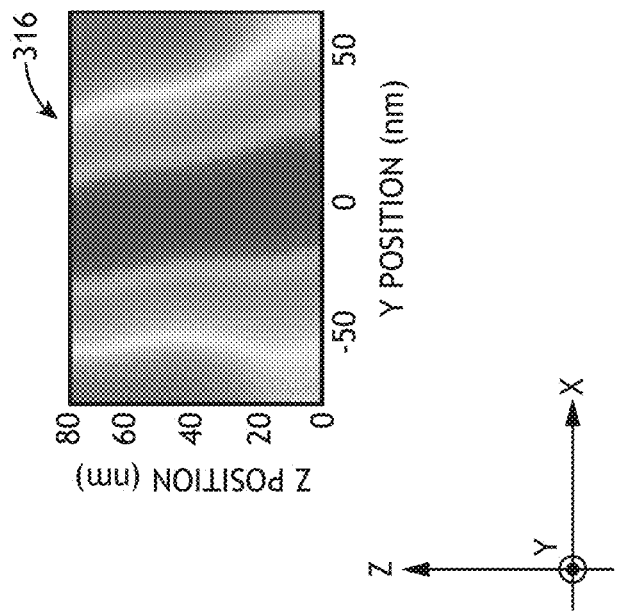
FIG. 3F is a plot illustrating the relative acid concentration within a resist layer of a sample exposed by asymmetric illumination as shown in FIGS. 3D and 3E, in accordance with one or more embodiments of the present disclosure.
Figure 3E:
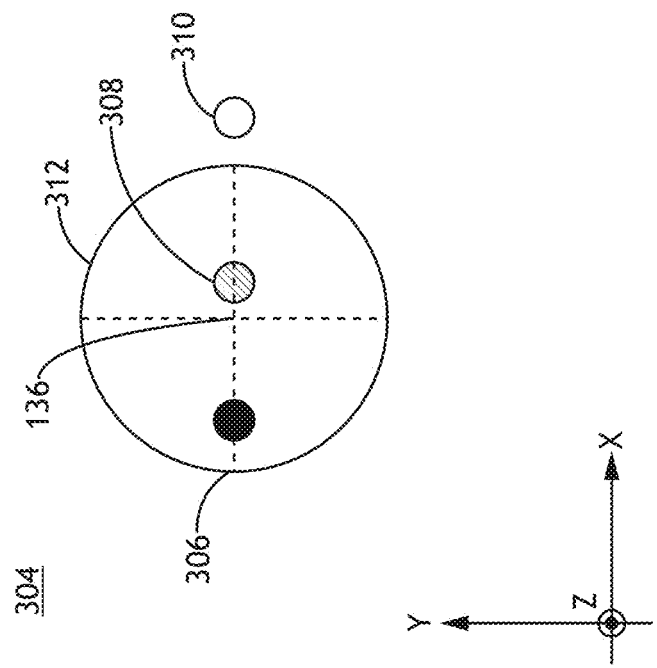
FIG. 3E is a conceptual view of a pupil plane of the set of projection optics illustrating the relative positions of diffracted beams within the pupil plane, in accordance with one or more embodiments of the present disclosure.

FIGS. 3D through 3F illustrate the co-optimization of the illumination source 102 and the pattern mask 108 to generate a second asymmetric aerial imaging profile on a sample 112 for a focus-sensitive metrology target, in accordance with one or more embodiments of the present disclosure.

FIG. 3D is a conceptual view of the lithography sub-system 101 illustrating multiple diffracted beams generated by a pattern mask 108, in accordance with one or more embodiments of the present disclosure. FIG. 3E is a conceptual view of a pupil plane 304 of the set of projection optics 110 illustrating the relative positions of diffracted beams within the pupil plane 304, in accordance with one or more embodiments of the present disclosure. FIG. 3F is a plot illustrating the relative acid concentration 316 within a resist layer 116 of sample 112 exposed by asymmetric illumination as shown in FIGS. 3D and 3E, in accordance with one or more embodiments of the present disclosure.

The degree of asymmetry of the illumination of the sample 112 illustrated by FIGS. 3D through 3F may be reduced relative to the configuration illustrated in FIGS. 3A through 3C. For example, as shown in FIGS. 3D through 3F, the distribution of diffracted beams 306, 308 may be less asymmetric with respect to the optic axis 136. The reduced asymmetry of FIG. 3E relative to 3B may result in a reduced asymmetry of the relative acid concentration 316 within a resist layer 116 of sample 112 as illustrated in FIG. 3F. In this regard, the degree of asymmetry of diffracted beams present in the pupil plane 304 may correlate to the degree of asymmetric illumination of the sample 112. Accordingly, the sensitivity of one or more characteristics of printed pattern elements to the focal position of the sample 112 may be adjusted by controlling the distribution of diffracted beams in the pupil plane 304. It is noted that the degree of asymmetry of printed pattern elements may negatively impact the robustness of the printed pattern elements. For example, highly asymmetric printed pattern elements may be prone to collapse. In this regard, the distribution of diffracted beams captured by the set of projection optics 110 may be adjusted (e.g., by co-optimization of the illumination source 102 and the pattern mask 108) to provide a balance between focus-sensitivity and robustness of printed pattern elements.

Figure 3G:
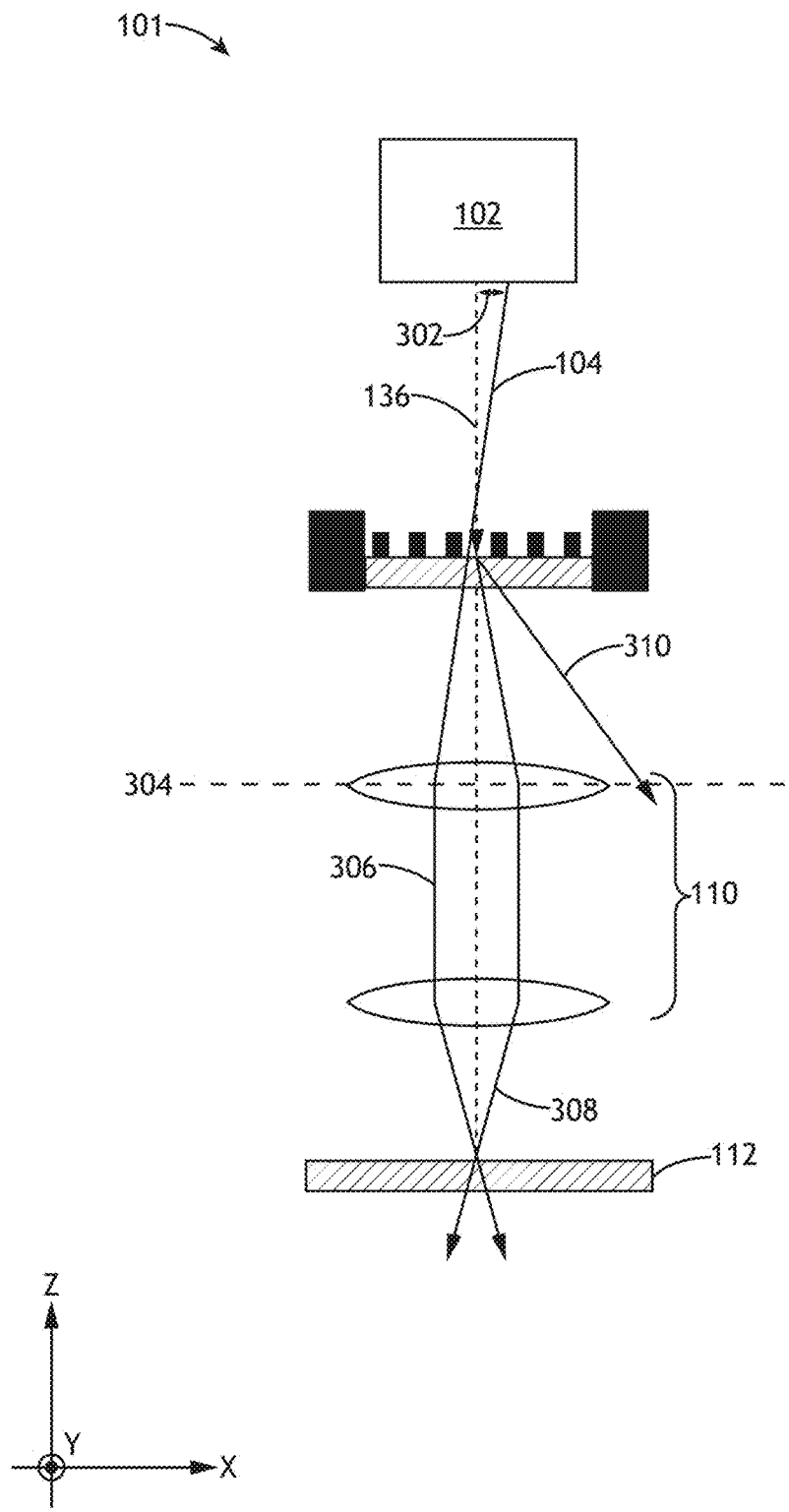
FIG. 3G is a conceptual view of the lithography sub-system illustrating multiple diffracted beams generated by a pattern mask, in accordance with one or more embodiments of the present disclosure.
Figure 3I:
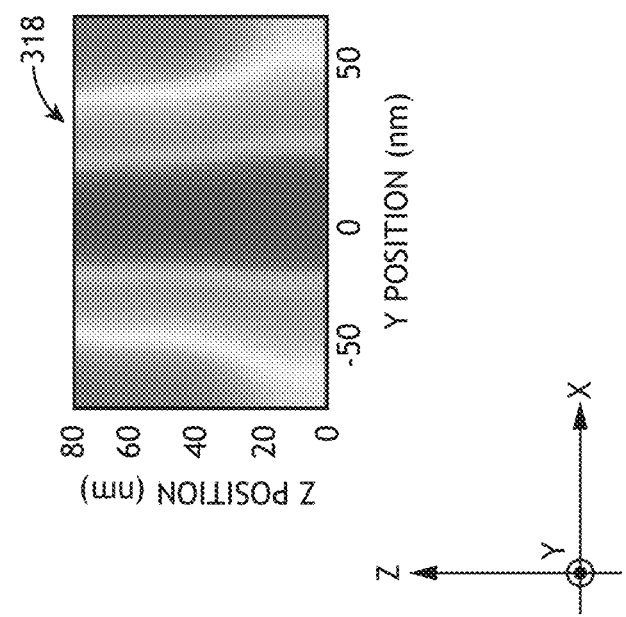
FIG. 3I is a plot illustrating the relative acid concentration within a resist layer of a sample exposed by symmetric illumination as shown in FIGS. 3D and 3E, in accordance with one or more embodiments of the present disclosure.
Figure 3H:
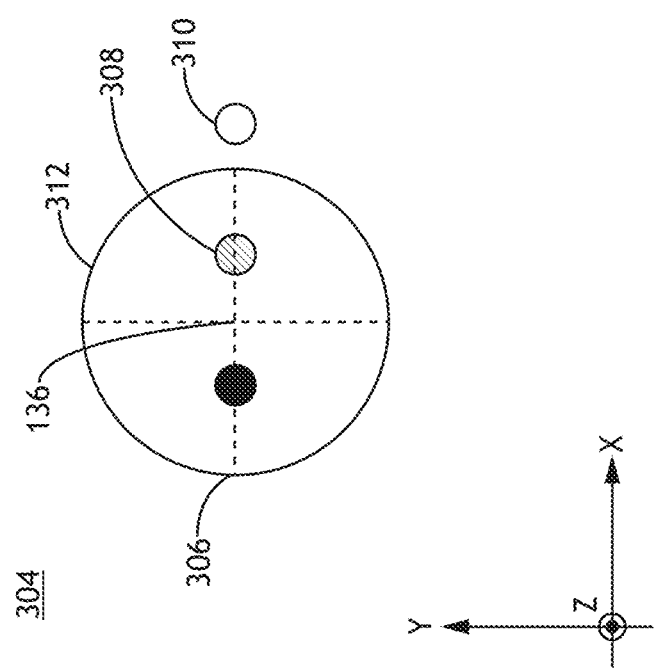
FIG. 3H is a conceptual view of a pupil plane of the set of projection optics illustrating the relative positions of symmetric diffracted beams within the pupil plane, in accordance with one or more embodiments of the present disclosure.

FIGS. 3G through 3I illustrate the co-optimization of the illumination source 102 and the pattern mask 108 to generate a symmetric aerial imaging profile on a sample 112 for a focus-insensitive metrology target, in accordance with one or more embodiments of the present disclosure.

FIG. 3G is a conceptual view of the lithography sub-system 101 illustrating multiple diffracted beams generated by a pattern mask 108, in accordance with one or more embodiments of the present disclosure. FIG. 3H is a conceptual view of a pupil plane 304 of the set of projection optics 110 illustrating the relative positions of symmetric diffracted beams within the pupil plane 304, in accordance with one or more embodiments of the present disclosure. FIG. 3I is a plot illustrating the relative acid concentration 318 within a resist layer 116 of sample 112 exposed by symmetric illumination as shown in FIGS. 3G and 3H, in accordance with one or more embodiments of the present disclosure. In another embodiment, a symmetric distribution of diffracted beams 306, 308 in the pupil plane 304 provides symmetric illumination of the sample 112 associated with the aerial image of the pattern mask 108. Accordingly, printed pattern elements associated with the symmetric illumination will operate as focus-insensitive printed pattern elements. In another embodiment, focus-insensitive printed pattern elements may be fabricated within the same metrology target (e.g., in the same process step or in a different process step). For example, a focus-insensitive printed pattern element may provide a reference against which one or more characteristics of a focus-sensitive printed pattern element may be measured. By way of another example, a focus-insensitive printed pattern element may facilitate the determination of an overlay measurement (e.g., a translation of one patterned layer on the sample 112 with respect to one or more additional pattern layers) in addition to a measurement of the focal position of the sample 112.

FIGS. 4A through 6 illustrate the variation of printed pattern elements fabricated using asymmetric illumination as a function of the pitch of the pattern mask, in accordance with one or more embodiments of the present disclosure. In this regard, FIGS. 4A through 6 illustrate one or more embodiments of the present disclosure in which the characteristics of the illumination source 102 are fixed at known values. Accordingly, the pitch of one or more pattern elements on pattern mask 108 may be adjusted to control the asymmetry of illumination on the sample 112 and thus the sensitivity of the corresponding printed pattern elements to deviations of the focal position of the sample 112. It is noted herein that FIGS. 4A through 6 and the associated description below are provided solely for illustrative purposes and should not be interpreted as limiting.

Figure 5:
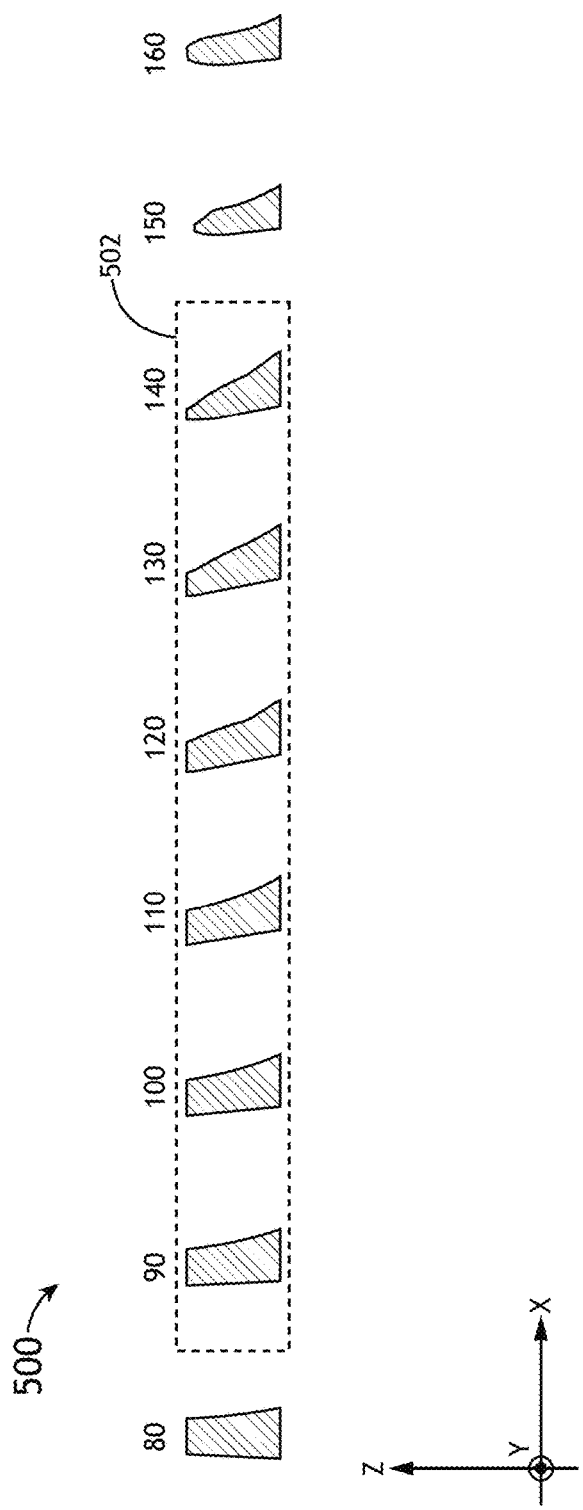
FIG. 5 is a schematic view of simulated printed pattern profiles for pattern masks having pitch values ranging from 80 nm to 160 nm, in accordance with one or more embodiments of the present disclosure.
Figure 6:
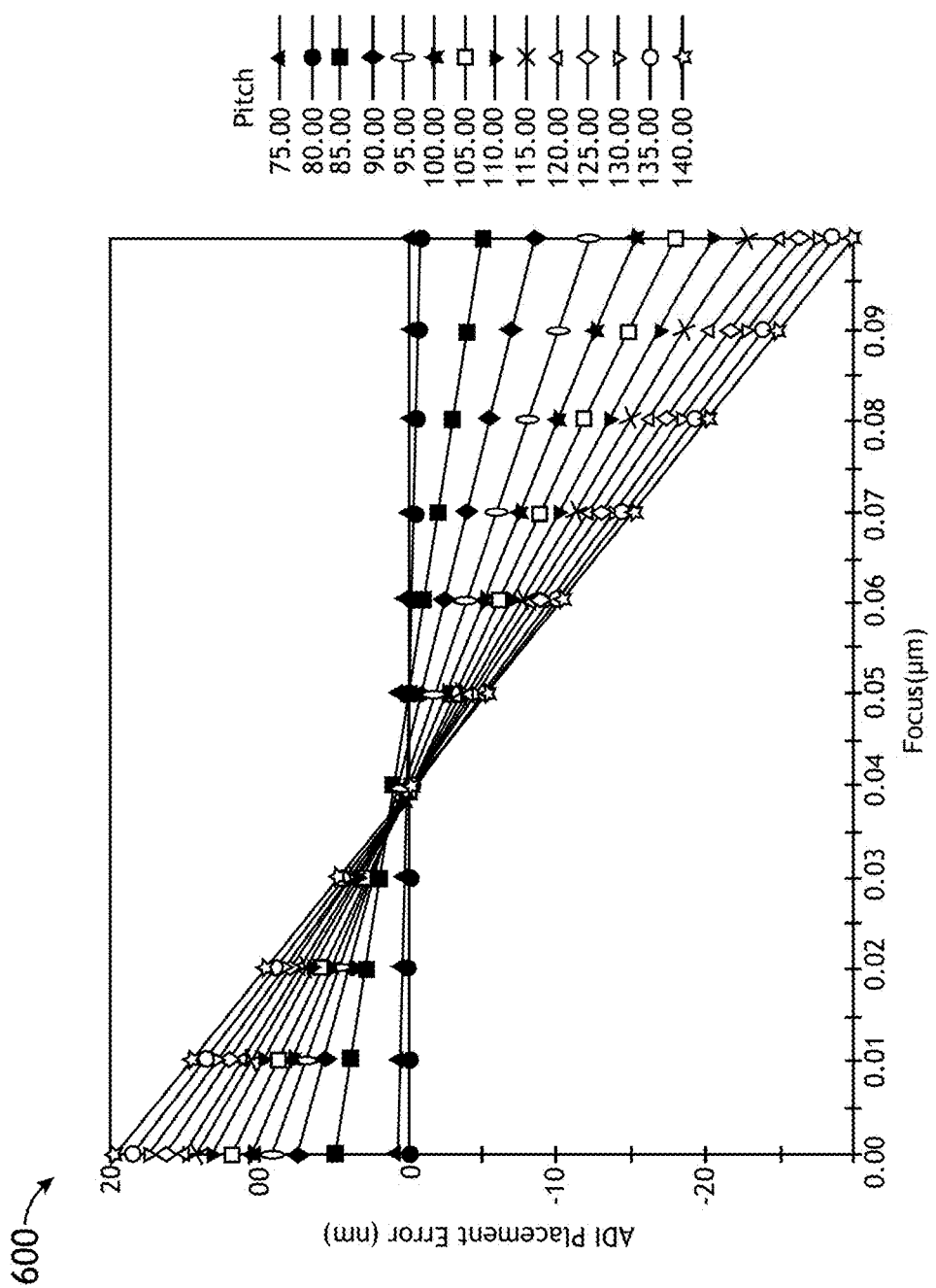
FIG. 6 is a plot illustrating pattern placement error (PPE) associated with a measurement of the deviation of the top of the printed patterns for pitch values ranging from 75 nm to 140 nm, in accordance with one or more embodiments of the present disclosure.

FIGS. 4A through 4D are plots 402-408 illustrating the distribution of diffracted beams in a pupil plane 304 associated with an off-axis single-pole illumination source and a pattern mask 108 with values of pitch of 80 nm, 100 nm, 140 nm, and 150 nm, in accordance with one or more embodiments of the present disclosure. For example, FIGS. 4A through 4D may illustrate diffracted beams captured by the set of projection optics 110. FIG. 5 is a schematic view of simulated printed pattern profiles 500 (e.g. in a resist layer 116 of sample 112) for pattern masks 108 having pitch values ranging from 80 nm to 160 nm, in accordance with one or more embodiments of the present disclosure. For example, simulated printed pattern profiles associated with pitch values of 80 nm, 100 nm, 140 nm, and 150 nm may correspond to distributions of diffracted beams illustrated in FIGS. 4A through 4D, respectively. In another embodiment, box 502 may illustrate a process window depicting asymmetric pattern resist profiles for use as focus-sensitive pattern elements. FIG. 6 is a plot 600 illustrating pattern placement error (PPE) associated with a measurement of the deviation of the top of the printed patterns for pitch values ranging from 75 nm to 140 nm, in accordance with one or more embodiments of the present disclosure. For example, PPE may be measured as a deviation of the top of printed pattern elements in response to a deviation of the focal position of the sample 112.

In one embodiment, as illustrated in FIG. 4A, a pattern element pitch of 80 nm provides a symmetric distribution of a 0-order diffracted beam 410 and a 1st order diffracted beam 412 in the pupil plane 304. Accordingly, as illustrated in FIG. 5, the resulting printed pattern profiles are symmetric. Further, as illustrated in FIG. 6, the resulting printed pattern profile do not exhibit any PPE as a function of focal position of the sample 112 (e.g. defocus) and may operate as focus insensitive pattern elements.

Figure 4B:
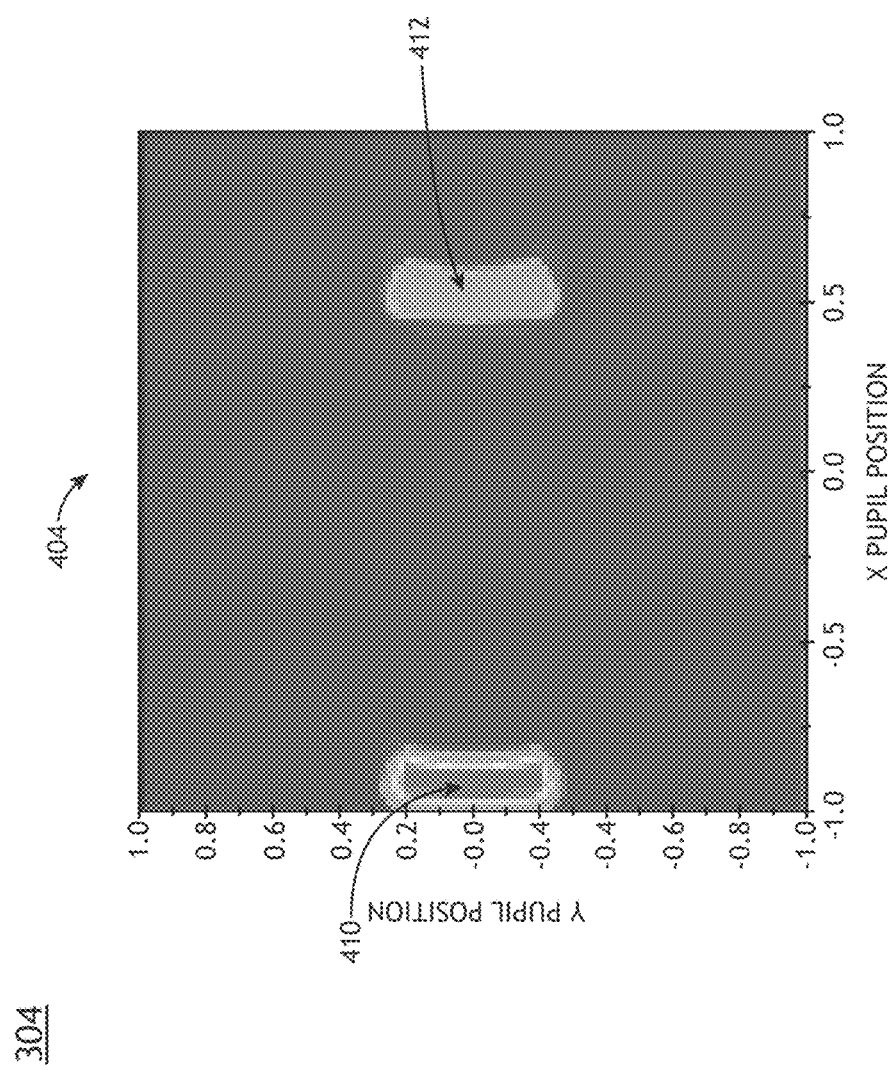
FIG. 4B is a plot illustrating the distribution of diffracted beams in a pupil plane associated with an off-axis single-pole illumination source and a pattern mask with a pitch of 100 nm, in accordance with one or more embodiments of the present disclosure.
Figure 4C:
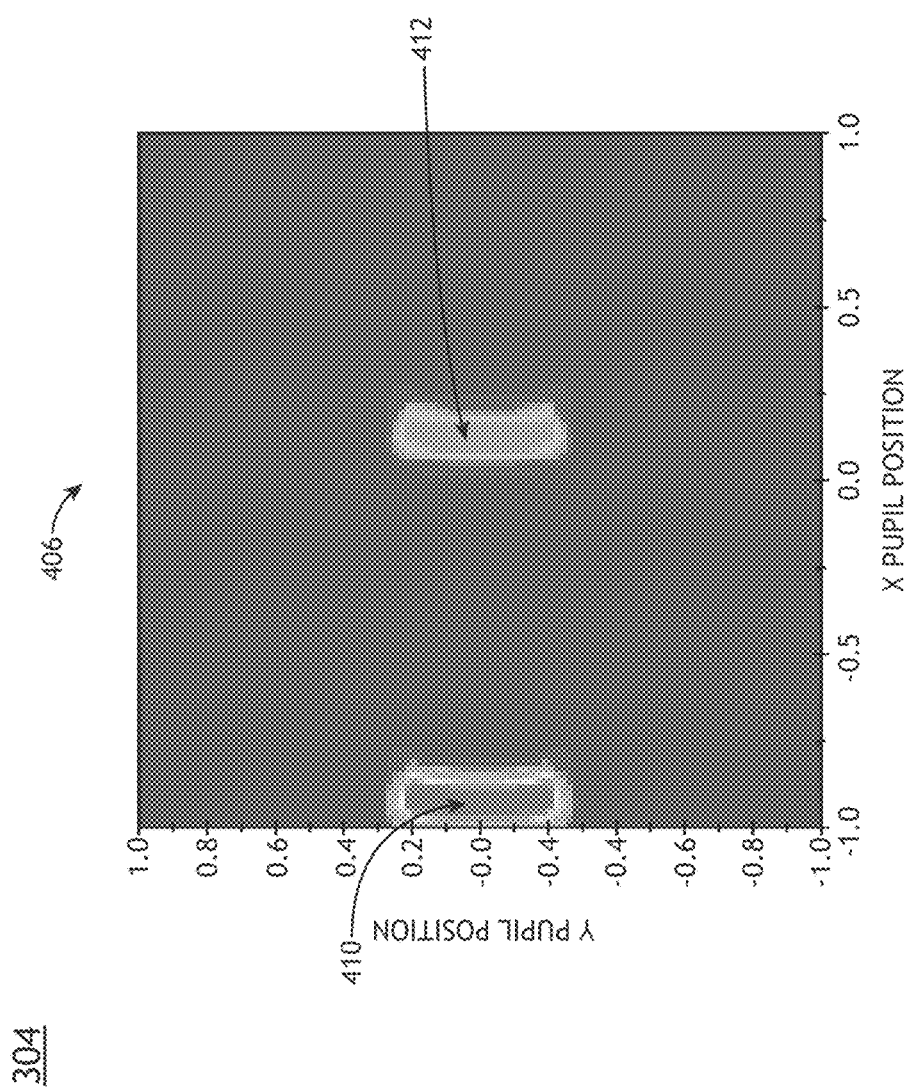
FIG. 4C is a plot illustrating the distribution of diffracted beams in a pupil plane associated with an off-axis single-pole illumination source and a pattern mask with a pitch of 140 nm, in accordance with one or more embodiments of the present disclosure.

In another embodiment, as illustrated in FIGS. 4B and 4C, increasing the pitch from 80 nm decreases the spacing between diffracted orders. For example, increasing the pitch causes the $1^{st}$ diffracted beam 412 to move in a direction towards the 0-order diffracted beam 410 in the pupil plane 304. As previously described, the position of the 0-order diffracted beam 410 within the pupil plane 304 may, but is not required to, be unaffected by the pitch of the pattern mask 108. Further, as the distribution of diffracted beams in the pupil plane 304 becomes increasingly asymmetric (e.g. as illustrated in FIGS. 4B and 4C), the corresponding printed pattern profiles may become increasingly asymmetric (e.g. see printed pattern profiles corresponding to 90 nm through 140 nm in FIG. 5) as evidenced by asymmetric sidewall angles, a deviation of the top of the printed pattern profile relative to the bottom of the printed pattern profile, or the like. Further, the sensitivity of the PPE vs. defocus (e.g. the slope associated with plots in FIG. 6) may increase with increasing asymmetry of printed pattern profiles.

Figure 4D:
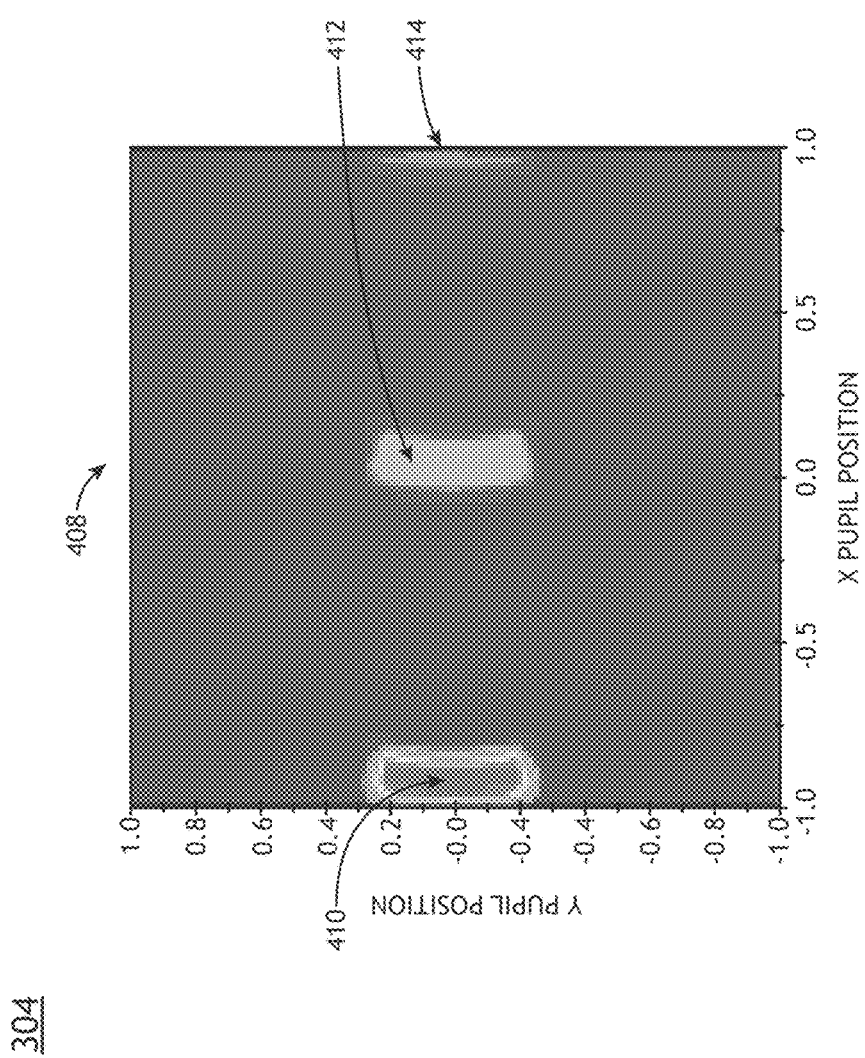
FIG. 4D is a plot illustrating the distribution of diffracted beams in a pupil plane associated with an off-axis single-pole illumination source and a pattern mask with a pitch of 150 nm, in accordance with one or more embodiments of the present disclosure.

In another embodiment, as illustrated in FIG. 4D, increasing the pitch to 150 nm and beyond may decrease the spacing of diffracted beams 410-414 in the pupil plane 304 such that $2^{nd}$ order diffracted beam 414 is captured by the set of projection optics 110. As a result, the asymmetry of the illumination of the sample 112 may be reduced and the printed pattern profiles for pitch values of 150 nm and 160 nm shown in FIG. 5 may be correspondingly reduced.

In another embodiment, a pattern mask 108 includes a characteristic design of an overlay metrology target such that a deviation of the focal position of the sample 112 is manifested as a measurable translation of one or more printed pattern elements. For example, a typical imaging metrology overlay target (e.g., an Advanced Imaging Metrology (AIM) target, a box-in-box target, a scatterometry overlay target, or the like) may include one or more printed pattern elements associated with one or more processing steps such that an overlay error (e.g., a translation of one layer with respect to another) is manifested as a relative translation between pattern elements of the imaging metrology overlay target. Correspondingly, a focus-sensitive metrology target may be designed to mimic an imaging metrology overlay target such that a deviation of the focal position of the sample 112 is manifested as a measurable translation of one or more printed pattern elements of the focus-sensitive metrology target. It is noted herein that a focus-sensitive mask may be designed to mimic any overlay metrology target including, but not limited to, imaging metrology overlay targets or scatterometry metrology overlay targets. It is further noted that a focus-sensitive metrology target that mimics an overlay metrology target may be readily characterized by an overlay metrology tool (e.g., a custom overlay metrology tool, a commercially available metrology tool, or the like). Further, the output of the overlay metrology tool may be further analyzed (e.g., by controller 118) to convert a measured "overlay error" to the focal position of the sample 112 when the pattern mask 108 was imaged (e.g., by lithography sub-system 101). For example, the focus-sensitive metrology target may be designed such that no measured overlay error corresponds to a sample 112 positioned at a nominal (or desired) focal position. In this regard, a measured overlay error by an overlay metrology tool may correspond to an error (e.g., an offset) in the focal position of the sample 112 relative to the nominal position.

In another embodiment, a focus-sensitive pattern mask 108 may be used to generate a corresponding printed metrology target for any number of process layers on a target. For example, a focus-sensitive mask may be used to generate a metrology target suitable for characterizing the focal position of the sample 112 for the single layer. By way of another example, a focus-sensitive mask may be used to generate a metrology target suitable for characterizing the focal position of the sample 112 for any number of process layers. In this regard, a focus-sensitive pattern mask 108 may be used to generate printed pattern elements in one or more layers of a metrology target, and a focus-insensitive pattern mask 108 (e.g. a pattern mask 108 with symmetric elements, or the like) may be used to generate printed pattern elements in one or more additional layers of the metrology target. In another embodiment, a single metrology target may include pattern elements associated with both focus-sensitive and focus-insensitive pattern masks 108. Accordingly, printed pattern elements associated with focus-insensitive pattern masks 108 may serve as points of reference for the measurement of relative position of printed pattern elements associated with focus-sensitive pattern masks 108. Further, a metrology target including printed pattern elements associated with both focus-sensitive and focus-insensitive pattern masks 108 may simultaneously provide traditional overlay data (e.g. translations between one or more process layers on the sample 112) and the focal position of the sample 112 for one or more process layers.

FIGS. 7A through 7C illustrate a focus-sensitive pattern mask 700, in accordance with one or more embodiments of the present disclosure. FIG. 7A is a top view of a focus-sensitive pattern mask 700 including focus-sensitive pattern elements 702 and focus-insensitive pattern elements 704, in accordance with one or more embodiments of the present disclosure. FIG. 7B is an enlarged view 706 of a portion of a focus-sensitive pattern element 702, in accordance with one or more embodiments of the present disclosure. FIG. 7C is an enlarged view 708 of a portion of a focus-insensitive pattern element 704, in accordance with one or more embodiments of the present disclosure.

In one embodiment, as illustrated in FIG. 7B, each focus-sensitive pattern element 702 is a segmented pattern element including multiple segments 714 distributed with a focus-sensitive pitch 712. For example, the multiple segments 714 distributed with pitch 712 may diffract illumination beam 104 and generate an asymmetric distribution of diffracted beams in the pupil plane 304 of lithography sub-system 101. Accordingly, the aerial image of focus-sensitive pattern elements 702 may be asymmetric such that the positions of corresponding printed pattern elements are sensitive to the focal position of the sample 112. In another embodiment, as illustrated in FIG. 7A, the segmented focus-sensitive pattern elements 702 are further distributed with a focus-insensitive pitch 710. For example, pitch 710 may be greater than pitch 712 such that diffracted beams associated with pitch 710 are not collected by the set of projection optics 110 and thus do not influence the symmetry of the illumination of the sample 112.

In another embodiment, as illustrated in FIG. 7C, each focus-insensitive pattern element 704 is an unsegmented pattern element. Further, focus-insensitive pattern elements 704 may be distributed with focus-insensitive pitch 710. Accordingly, aerial images of focus-insensitive pattern elements 704 generated by the set of projection optics 110 as illuminated by the illumination beam 104 provide focus-insensitive printed patterns on the sample 112. For example, focus-insensitive pattern elements 704 illuminated by illumination source 102 and imaged by the set of projection optics 110 may provide a symmetric aerial illumination profile on the sample 112. In another embodiment, focus-insensitive pattern elements 704 distributed with focus-insensitive pitch 710 are aligned with focus-sensitive pattern elements 702. In this regard, printed pattern elements associated with focus-sensitive pattern elements 702 and focus-insensitive pattern elements 704 may be aligned when the sample 112 is located at a nominal focal position and misaligned otherwise.

Focus-sensitive pattern elements 702 and focus-insensitive pattern elements 704 may be imaged onto the sample 112 to generate printed pattern elements in a single processing step or in multiple processing steps. In one embodiment, focus-sensitive pattern elements 702 and focus-insensitive pattern elements 704 are located on a single pattern mask (e.g. pattern mask 700) and simultaneously imaged onto the sample 112. In another embodiment, focus-sensitive pattern elements 702 and focus-insensitive pattern elements 704 may be separately imaged onto the sample 112. For example, focus-sensitive pattern elements 702 and focus-insensitive pattern elements 704 may be located on separate pattern masks or different locations of a single pattern mask.

Figure 8A:
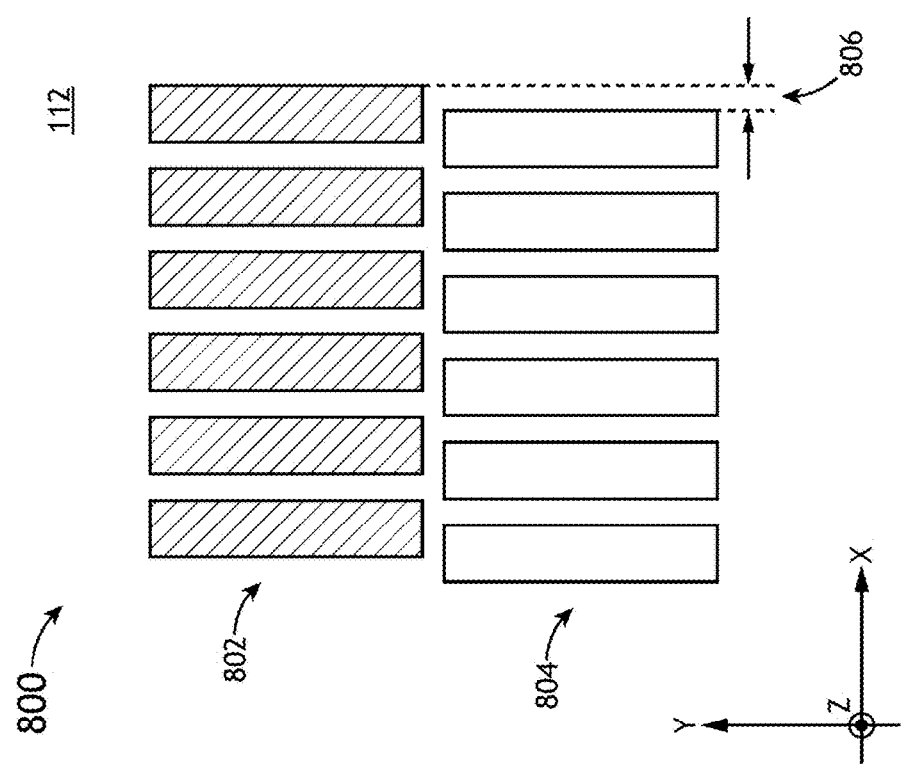
FIG. 8A is a top view of a focus-sensitive printed metrology target corresponding to a focus-sensitive pattern mask, in accordance with one or more embodiments of the present disclosure.

FIG. 8A is a top view of a focus-sensitive printed metrology target 800 corresponding to focus-sensitive pattern mask 700, in accordance with one or more embodiments of the present disclosure. For example, focus-sensitive metrology target 800 may correspond to an aerial image of focus-sensitive pattern mask 700 by an illumination source 102 configured for single-pole illumination in which the illumination pole is offset from the optical axis 136 of lithography sub-system 101 in the X-direction. In one embodiment, focus-sensitive printed pattern elements 802 correspond to focus-sensitive pattern elements 702 and focus-insensitive printed pattern elements 804 correspond to focus-insensitive pattern elements 704. It is noted herein that, although not shown for clarity, the multiple segments 714 of focus-sensitive pattern elements 702 may be, but are not required to be, resolved by the set of projection optics 110 and printed as separate printed pattern elements on the sample 112. As illustrated in FIG. 8A, a misalignment metric 806 (e.g. a PPE measured in the X-direction) may correspond to a deviation of the focal position of the sample 112 with respect to a nominal focal position.

Figure 8B:
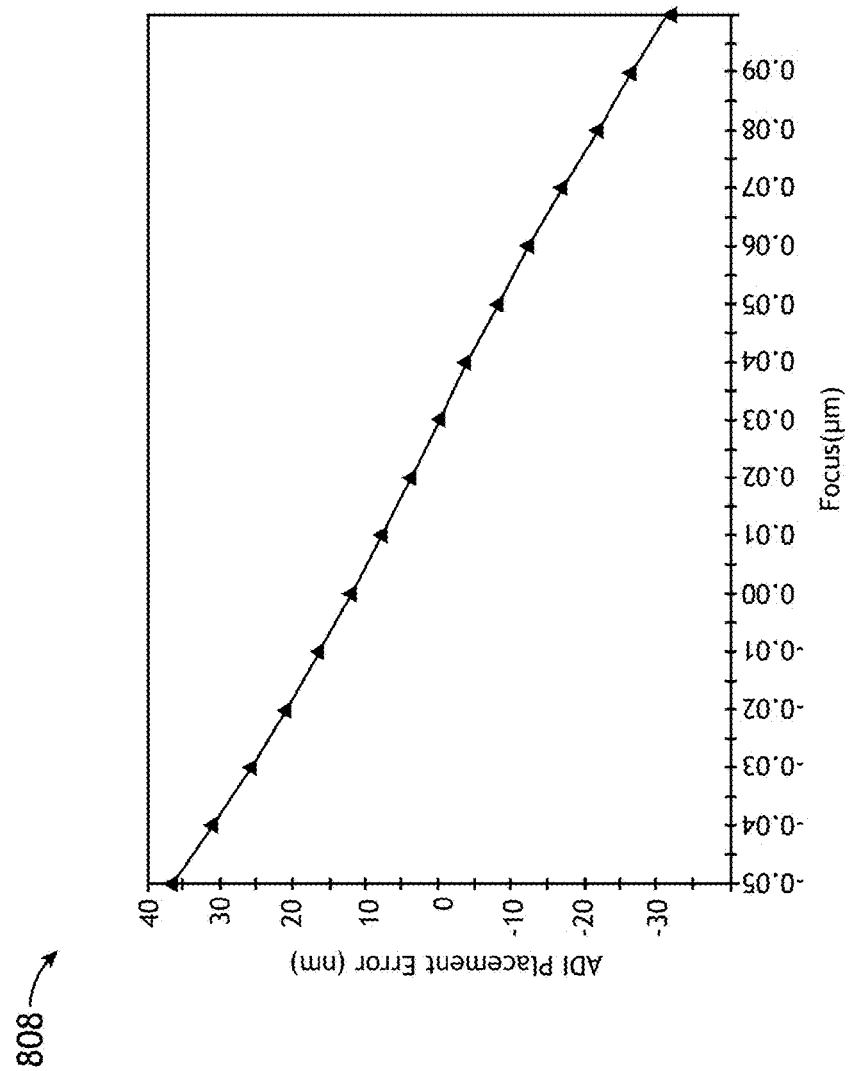
FIG. 8B is a plot illustrating an exemplary relationship between the focal position of a sample and a misalignment metric, in accordance with one or more embodiments of the present disclosure.

FIG. 8B is a plot 808 illustrating an exemplary relationship between the focal position of a sample 112 and a misalignment metric 806, in accordance with one or more embodiments of the present disclosure. As shown in FIG. 8B, a misalignment metric 806 may, but is not required to, exhibit a linear dependence with respect to the focal position of the sample 112. In one embodiment, a focal position of 0 represents a nominal focal position (e.g. a target focal position, a "best" focal position, or the like).

In another embodiment, a misalignment metric 806 is measured by metrology sub-system 151. For example, metrology sub-system 151 may be configured as an overlay metrology tool to measure the misalignment metric 806. Further, the actual focal position of the sample 112 (e.g. a magnitude and/or a direction of a deviation of the focal position of the sample 112) may be calculated (e.g. by controller 118) based on the measured misalignment metric 806. It is noted herein that the description of misalignment metric 806 is provided solely for illustrative purposes and should not be interpreted as limiting. For example, any metrology metric may be utilized to characterize the focal position of the sample 112. In one embodiment, translations of the locations of individual segments of printed pattern elements 802 (not shown) may be utilized to characterize the focal position of the sample 112. In another embodiment, one or more additional characteristics of the printed pattern elements 802 such as, but not limited to, one or more side-wall angles or one or more critical dimensions may be utilized to characterize the focal position of the sample 112.

Figure 9A:
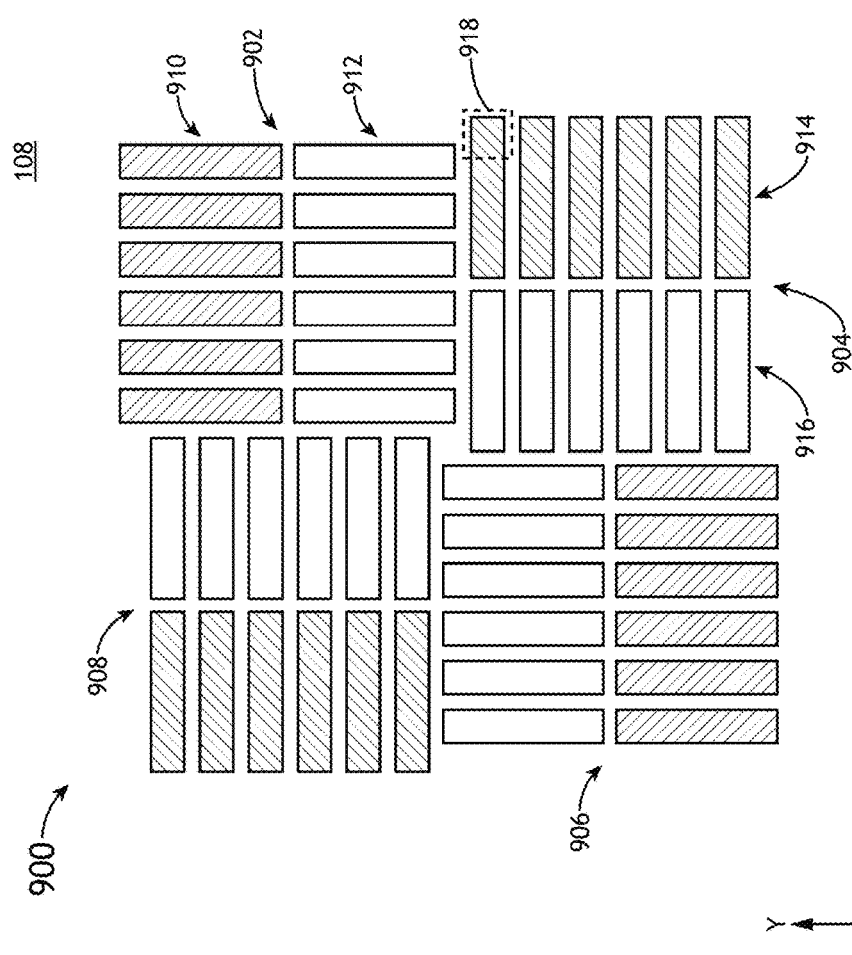
FIG. 9A is a top view of a focus-sensitive pattern mask including multiple cells with differing orientations of pattern elements, in accordance with one or more embodiments of the present disclosure.

FIG. 9A is top view of a focus-sensitive pattern mask 900 including multiple cells 902-908 with differing orientations of pattern elements, in accordance with one or more embodiments of the present disclosure. In one embodiment, focus-sensitive pattern mask 900 may be characteristic of a two-layer AIM metrology overlay target. For example, pattern mask 900 may include focus-sensitive pattern elements and focus-insensitive pattern elements in each of cells 902-908.

In another embodiment, cell 902 corresponds to focus-sensitive pattern mask 700. In this regard, focus-sensitive pattern elements 910 may be segmented pattern elements including a focus-sensitive pitch. Further, both focus-sensitive pattern elements 910 and focus-insensitive pattern elements 912 may be aligned on the pattern mask 900. Additionally, cell 906 may be an additional instance of cell 902.

Figure 9B:
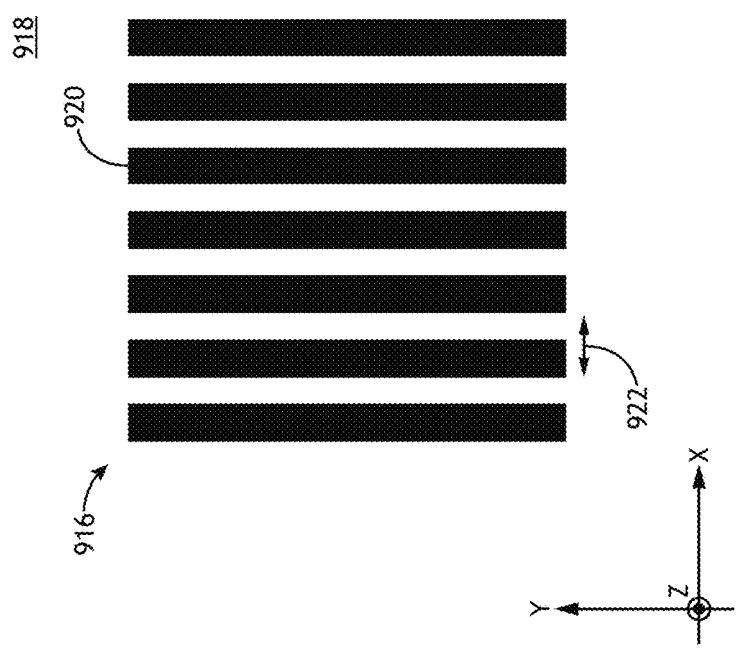
FIG. 9B is an expanded view of a portion of a focus-sensitive pattern element including multiple segments, in accordance with one or more embodiments of the present disclosure.

In another embodiment, as illustrated in expanded view 918 in FIG. 9B, each focus-sensitive pattern element 914 is a segmented pattern element including multiple segments 920 distributed with a focus-sensitive pitch 922. For example, the multiple segments 920 distributed with focus-sensitive pitch 922 may diffract illumination beam 104 and generate an asymmetric distribution of diffracted beams in the pupil plane 304 of lithography system 101. For example, the multiple segments 920 may be distributed along the X-direction to correspond to the offset position 302 of illumination source 102. In this regard, the pattern mask 900 and the illumination source 102 may be co-optimized. Accordingly, the aerial image of pattern elements 914 may be asymmetric such that the positions of corresponding printed pattern elements are sensitive to the focal position of the sample 112.

FIG. 10 is a top view of a focus-sensitive printed metrology target 1000 corresponding to cell 904 of focus-sensitive pattern mask 900, in accordance with one or more embodiments of the present disclosure. In one embodiment, focus-sensitive printed pattern elements 1002 correspond to focus-sensitive pattern elements 910 and focus-insensitive printed pattern elements 1004 correspond to focus-insensitive pattern elements 912. In another embodiment, misalignment metric 1006 (e.g. a relative separation between focus-sensitive printed pattern elements 1002 and focus-insensitive printed pattern elements 1004, or the like) provides data on the deviation of the focal position of the sample 112.

Figure 11A:
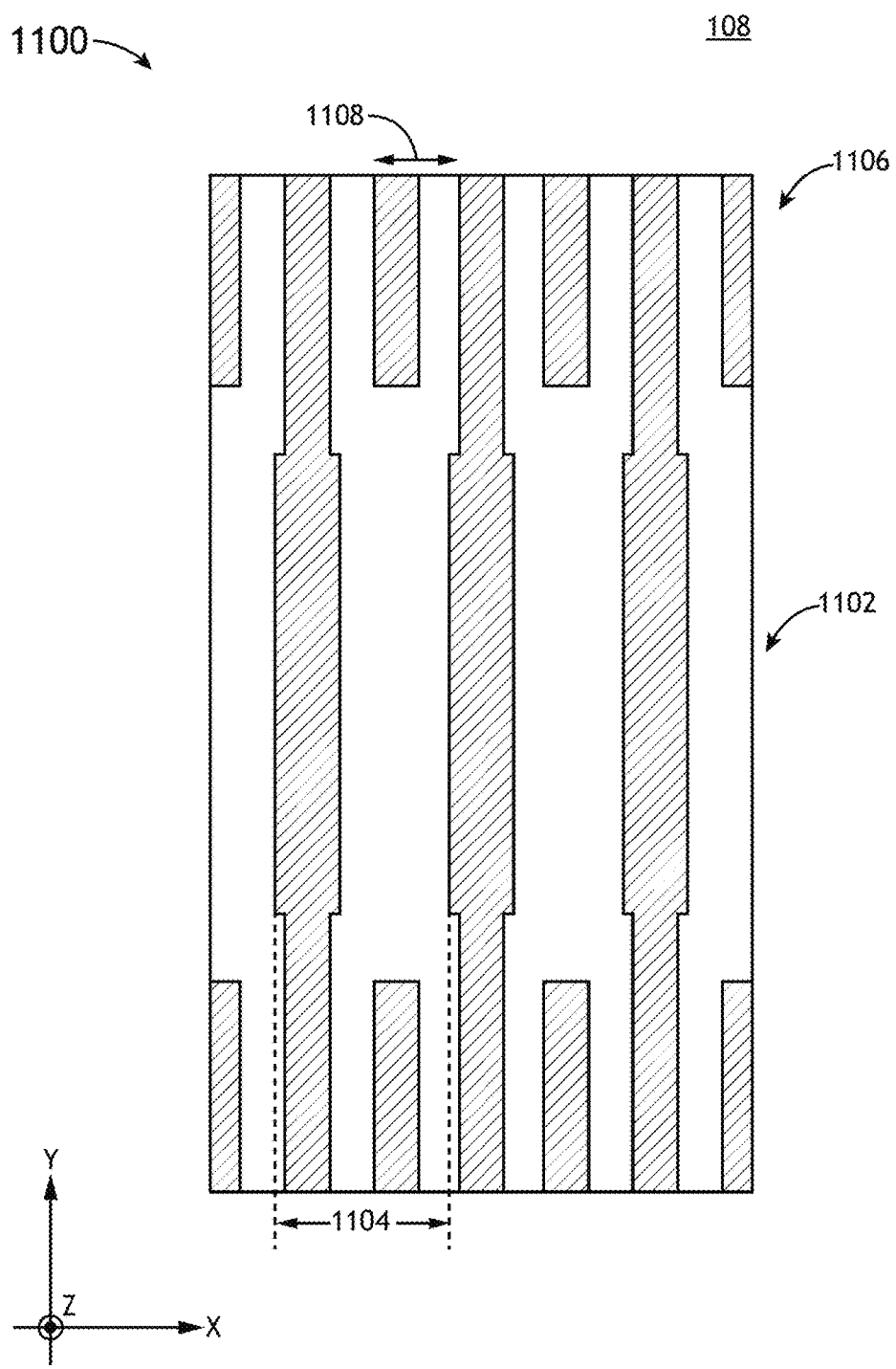
FIG. 11A is a top view of a focus-sensitive pattern mask, in accordance with one or more embodiments of the present disclosure.

FIG. 11A is a top view of a focus-sensitive pattern mask 1100, in accordance with one or more embodiments of the present disclosure. In one embodiment, pattern elements in region 1102 are distributed with a focus-sensitive pitch 1104. In another embodiment, pattern elements in region 1106 are distributed with a focus-insensitive pitch 1108. In this regard, one or more characteristics of pattern elements corresponding to region 1102 (e.g. PPE associated with a location of corresponding printed pattern elements, a critical dimension, a sidewall angle, or the like) may vary with respect to the focal position of the sample 112. Further, the characteristics of printed pattern elements corresponding to region 1106 may be constant with respect to the focal position of the sample 112.

Figure 11B:
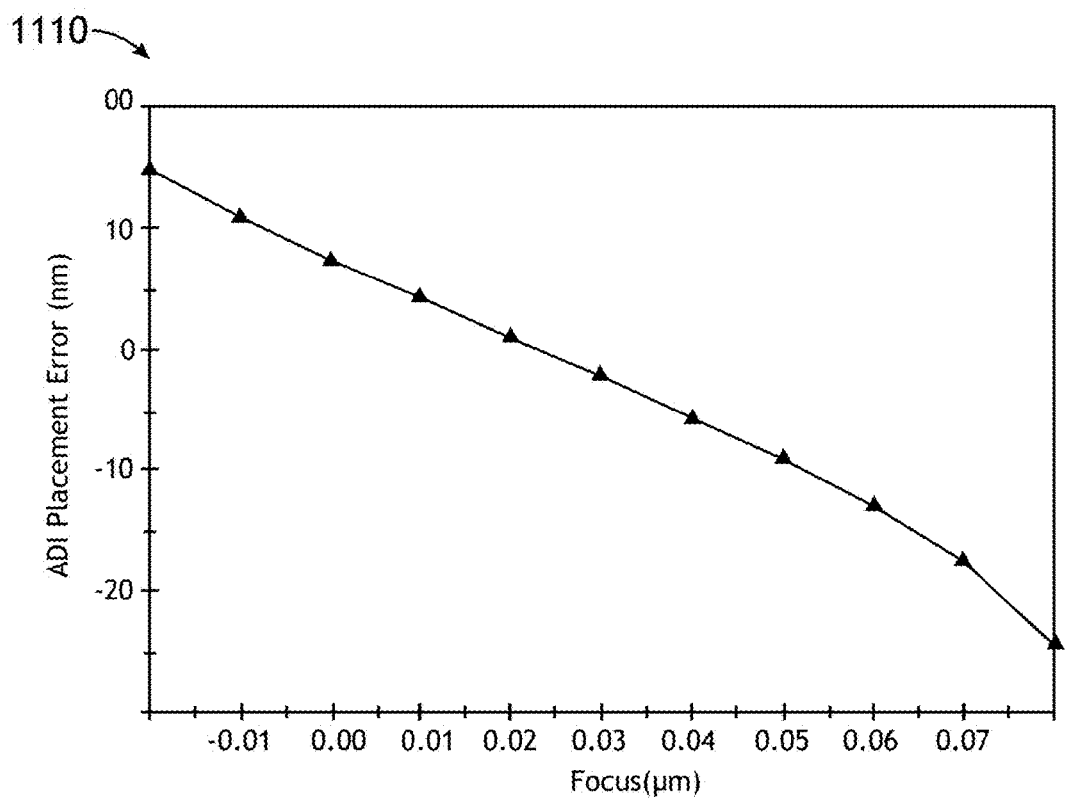
FIG. 11B is a plot illustrating pattern placement error associated with printed pattern elements corresponding to focus-sensitive pattern elements, in accordance with one or more embodiments of the present disclosure.
Figure 11C:
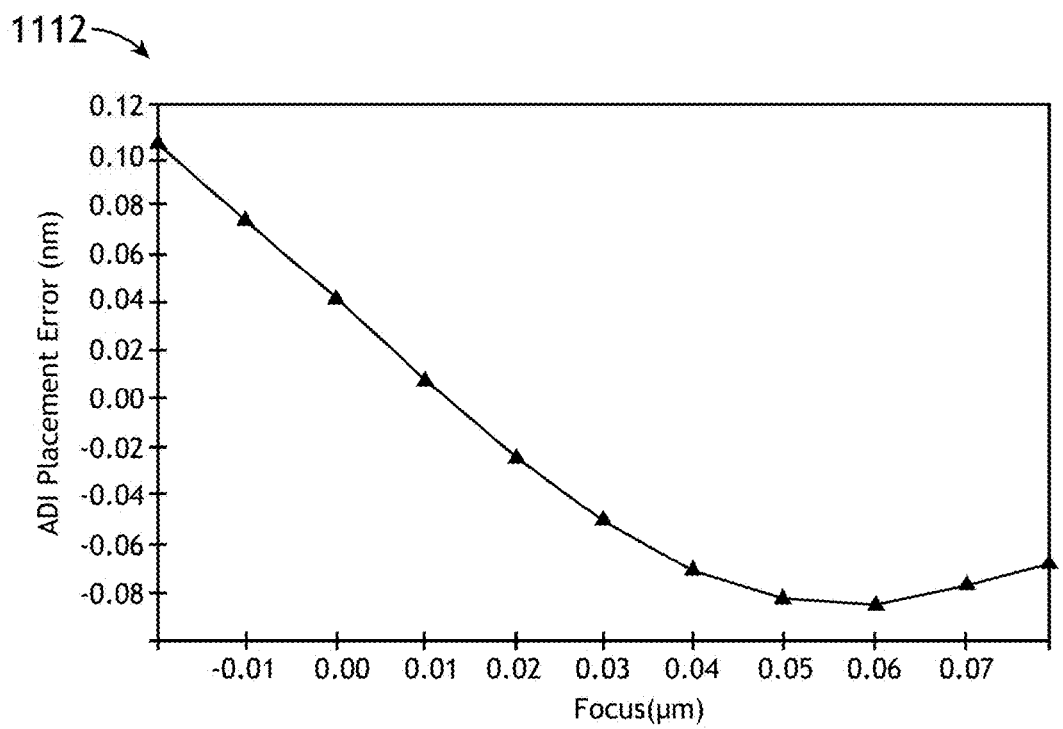
FIG. 11C is a plot illustrating pattern placement error associated with printed pattern elements corresponding to focus-insensitive pattern elements, in accordance with one or more embodiments of the present disclosure.

FIGS. 11B and 11C are plots 1110 and 1112 illustrating the PPE associated with printed pattern elements corresponding to focus-sensitive pattern elements in region 1102 and focus-insensitive pattern elements in region 1106, respectively, in accordance with one or more embodiments of the present disclosure. For example, the PPE of focus-sensitive printed pattern elements corresponding to region 1102 may, but are not required to, exhibit a linear (or nearly linear) dependence on the focal position of the sample 112 over a range of interest. Further, the PPE of focus-insensitive printed pattern elements corresponding to region 1106 may exhibit a negligible PPE with respect to the focal position of the sample 112. It is noted herein that the scale of plot 1112 is magnified with respect to the scale of plot 1110. Further, the PPE of focus-sensitive printed pattern elements corresponding to region 1102 may be measured with respect to focus-insensitive printed pattern elements corresponding to region 1106.

Figure 12A:
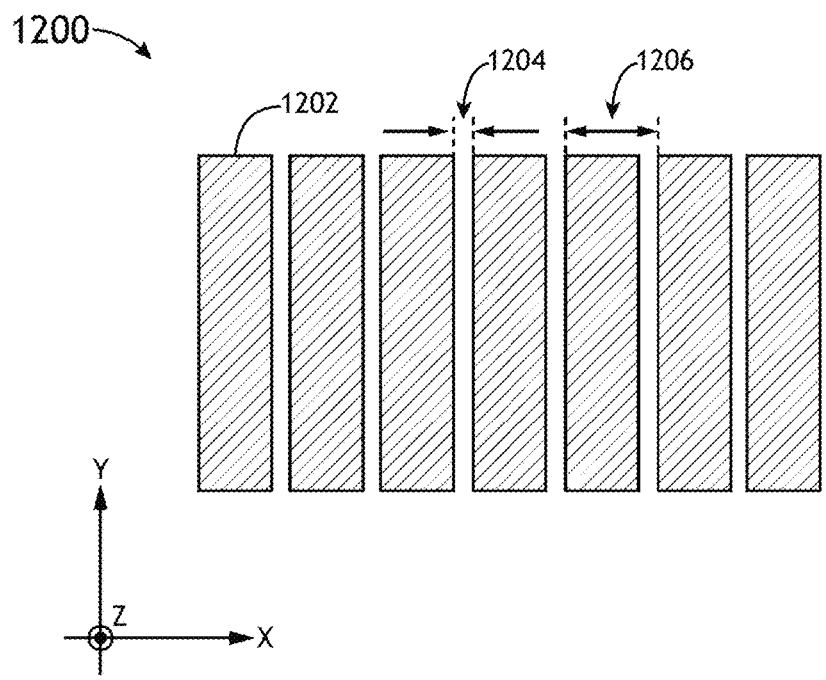
FIG. 12A is a top view of a focus-sensitive pattern element including sub-resolution features, in accordance with one or more embodiments of the present disclosure.

FIG. 12A is a top view of a focus-sensitive pattern element 1200 including sub-resolution features, in accordance with one or more embodiments of the present disclosure. In one embodiment, pattern element 1200 is a segmented pattern element including multiple segments 1202 distributed (e.g. along the X-direction) with a sub-resolution separation distance 1204. In this regard, sub-resolution features (e.g. separation distance 1204, or the like) may not be printed on the sample 112 by the lithography sub-system 101. In another embodiment, the segments 1202 are distributed (e.g. along the X-direction) with a focus-sensitive pitch 1206. Accordingly, pattern element 1200 may diffract illumination beam 104 such that multiple diffracted beams are asymmetrically distributed in the pupil plane 304 of the lithography sub-system 101. Further, the illumination on the sample 112 associated with the aerial image of pattern element 1200 may be asymmetric such that the printed pattern element is sensitive to the focal position of the sample 112. It is noted herein that a pattern element including sub-resolution features that induce diffraction of illumination beam 104 but are not imaged onto the sample 112 may facilitate the fabrication of robust printed pattern elements. For example, highly asymmetric printed pattern elements may exhibit highly asymmetric sidewall angles. Accordingly, highly asymmetric printed pattern elements may be prone to collapse, particularly when the aspect ratio (e.g. a ratio of a printed pattern height to a printed pattern width) is high. In contrast, the multiple segments (e.g. segments 1202) of pattern elements including sub-resolution features may be imaged as a single printed pattern element with a relatively low aspect ratio to facilitate robustness of the printed pattern element, while simultaneously providing sensitivity to the focal position of the sample 112.

Figure 12B:
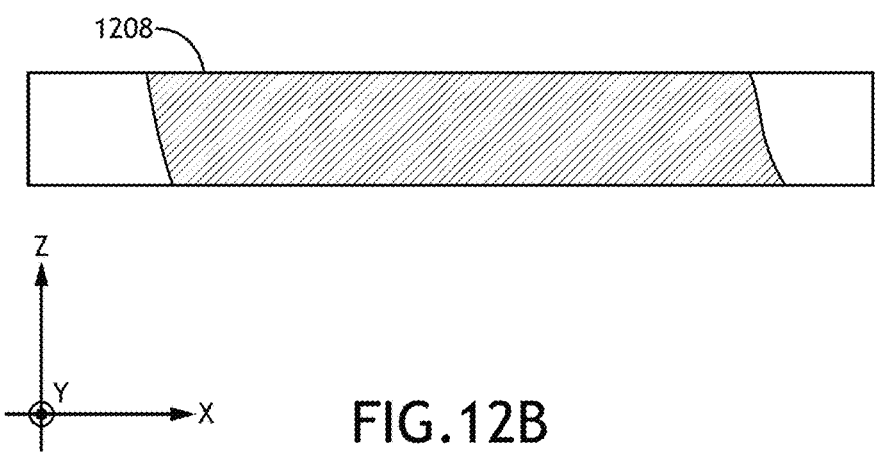
FIG. 12B is a schematic view of a simulated printed pattern profile of a resist layer corresponding to a focus-sensitive pattern element with sub-resolution features, in accordance with one or more embodiments of the present disclosure.

FIG. 12B is a schematic view of a simulated printed pattern profile 1208 of a resist layer 116 corresponding to a focus-sensitive pattern element 1200 with sub-resolution features, in accordance with one or more embodiments of the present disclosure. In another embodiment, the printed pattern corresponding to the segmented focus-sensitive pattern element 1200 is an unsegmented printed pattern element. In this regard, the sub-resolution features (e.g. sub-resolution separation distances 1204, or the like) may not be resolvably imaged by the set of projection optics 110 of the lithography sub-system 101. However, as illustrated in FIG. 12B, the printed pattern profile 1208 of the resist layer 116 may be asymmetric due to the influence of the sub-resolution features. In one embodiment, a PPE (e.g. as measured by a location of the top of the printed pattern element) is sensitive to the focal position of the sample 112. In another embodiment, one or more sidewall angles may be sensitive to the focal position of the sample 112.

FIGS. 13 through 17 illustrate an illumination source and a pattern mask co-optimized to generate printed pattern elements sensitive to the focal position of the sample as measured along two directions, in accordance with one or more embodiments of the present disclosure.

Figure 13:
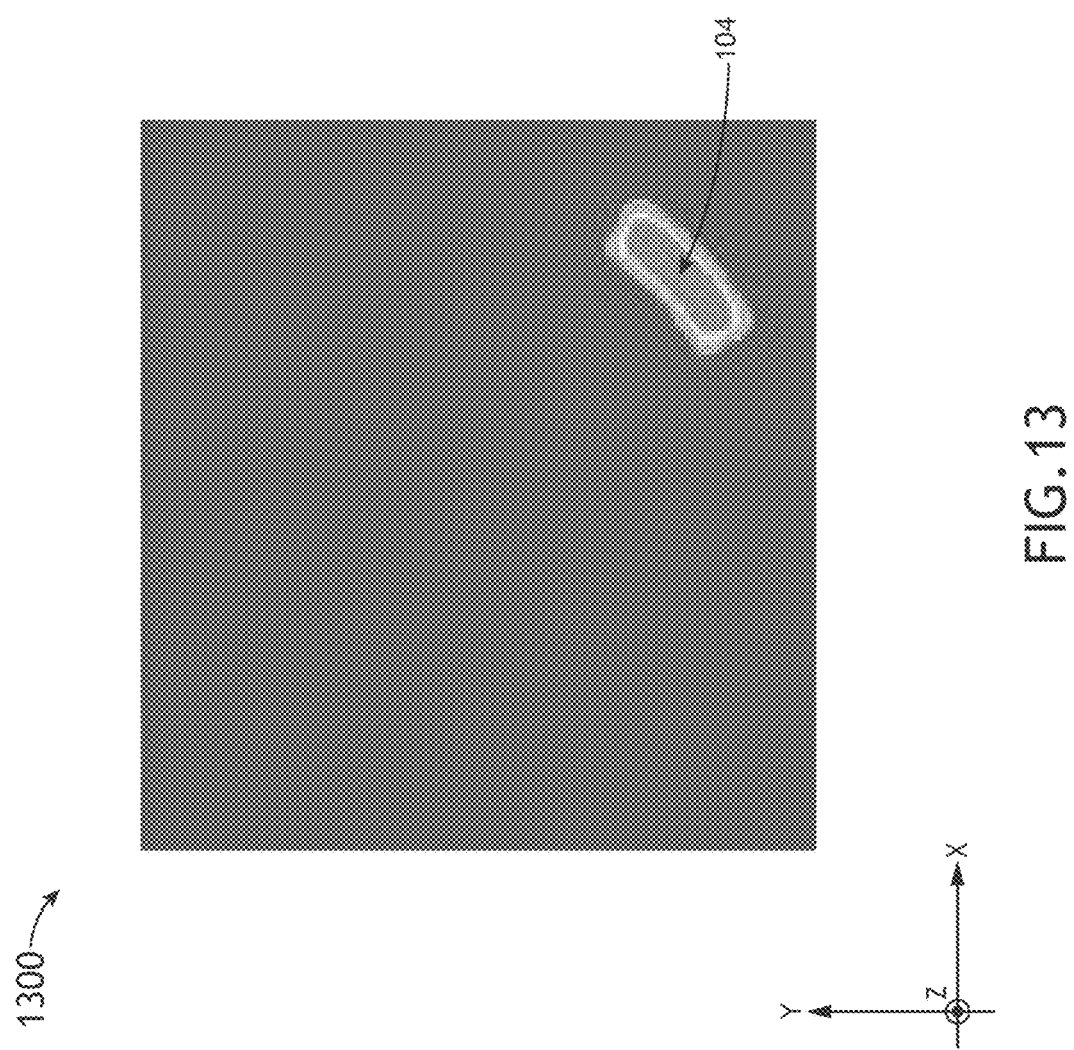
FIG. 13 is a plot illustrating the intensity distribution of a single-pole illumination source offset from the optical axis of the set of projection optics in both the X and Y directions, in accordance with one or more embodiments of the present disclosure.

FIG. 13 is a plot 1300 illustrating the intensity distribution of an illumination source 102 configured as a single-pole illumination source offset from the optical axis 136 of the set of projection optics 110 in both the X and Y directions, in accordance with one or more embodiments of the present disclosure.

Figure 14:
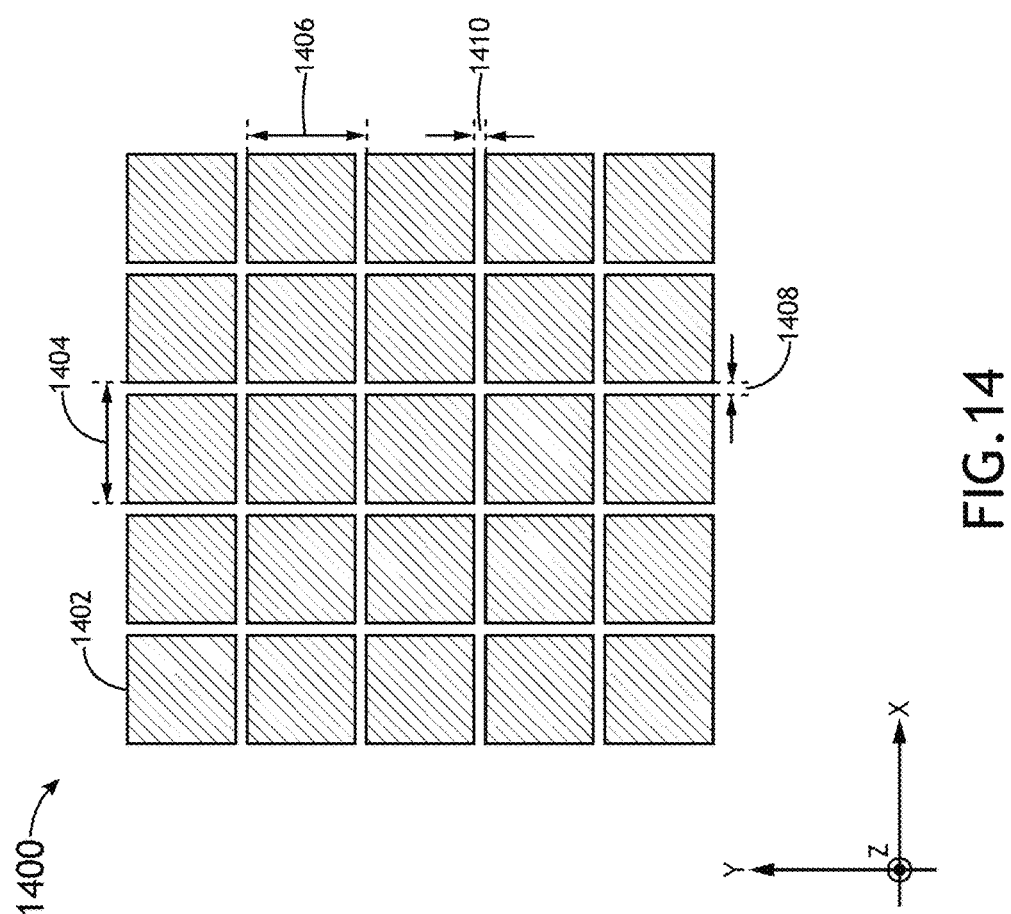
FIG. 14 is a top view of a pattern element including multiple segments distributed along both the X and Y directions, in accordance with one or more embodiments of the present disclosure.

FIG. 14 is a top view of a pattern element 1400 including multiple segments 1402 distributed along both the X and Y directions, in accordance with one or more embodiments of the present disclosure. For example, pattern element 1400 may include a two-dimensional array of segments 1402 separated by focus-sensitive pitch 1404 in the X-direction and focus-sensitive pitch 1406 in the Y-direction to generate multiple diffracted beams distributed in both the X and Y directions. In one embodiment, the values of the focus-sensitive pitch in the X-direction 1404 and in the Y-direction 1406 are the same to provide the same degree of asymmetry of illumination on the sample 112 along the X and Y directions. In another embodiment, the values of the focus-sensitive pitch in the X-direction 1404 and in the Y-direction 1406 are different to provide different degrees of asymmetry of illumination on the sample 112 along the X and Y directions. In another embodiment, the intensity profile of the illumination source 102 may include differing degrees of asymmetry in the X and Y directions, which may be compensated for by differing values of the focus-sensitive pitch in the X-direction 1404 and the Y-direction 1406 to provide the same degree of asymmetry of illumination on the sample 112 along the X and Y directions.

In one embodiment, the segments 1402 are separated by a separation distance 1408 along the X-direction and a separation distance 1410 along the Y-direction. In another embodiment, the separation distances 1408,1410 are larger than the resolution of the set of projection optics 110 such that each segment 1402 is resolvably imaged onto the sample 112 as a printed pattern element. In another embodiment, the separation distances 1408,1410 are smaller than the resolution of the set of projection optics 110 such that the multiple segment 1402 are imaged onto the sample 112 as a single printed pattern element.

Figure 15:
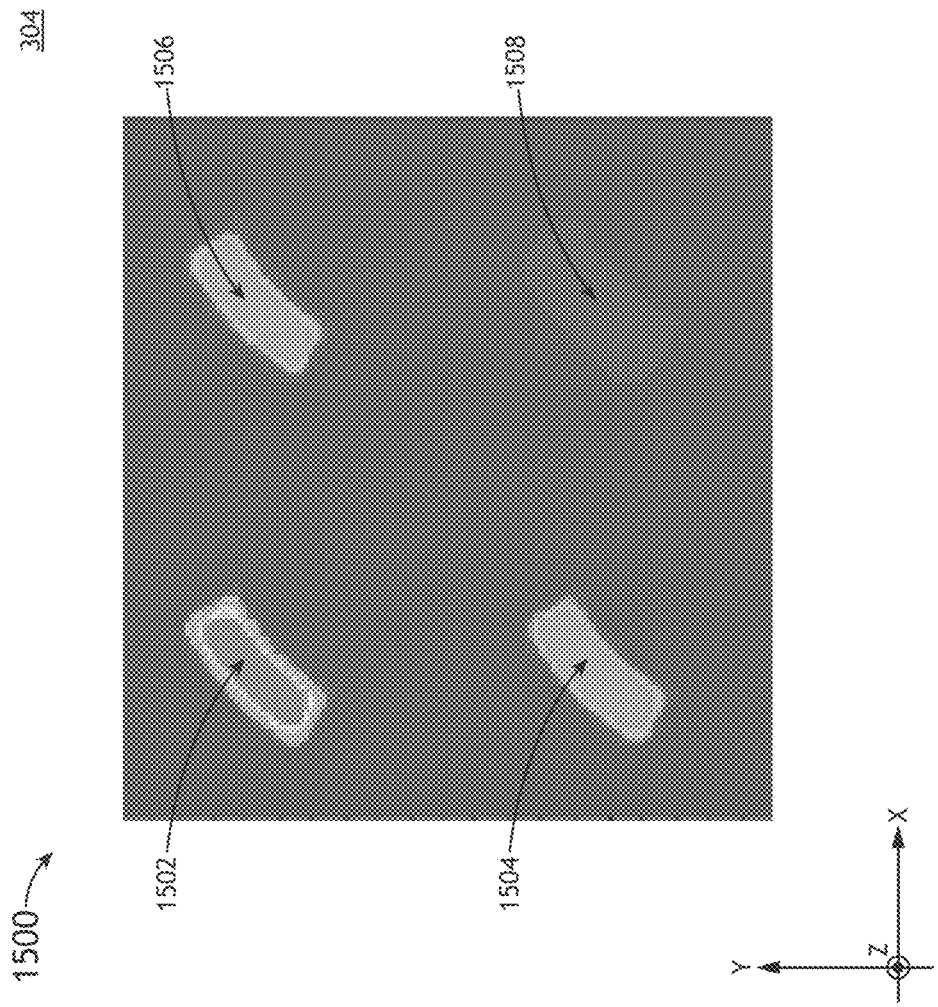
FIG. 15 is a plot of the distribution of diffracted beams in the pupil plane of the set of projection optics, in accordance with one or more embodiments of the present disclosure.

FIG. 15 is a plot 1500 of the distribution of diffracted beams in the pupil plane 304 of the set of projection optics 110, in accordance with one or more embodiments of the present disclosure. In one embodiment, pattern element 1400 diffracts illumination beam 104 into a 0-order diffracted beam 1502, a $1^{st}$ order diffracted beam 1504 in the Y-direction and a $1^{st}$ order diffracted beam 1506 in the X-direction such that the diffracted beams are asymmetrically distributed in the pupil plane 304. In another embodiment, the pupil plane 304 includes one or more additional diffracted beams (e.g. diffracted beam 1508).

Figure 16:
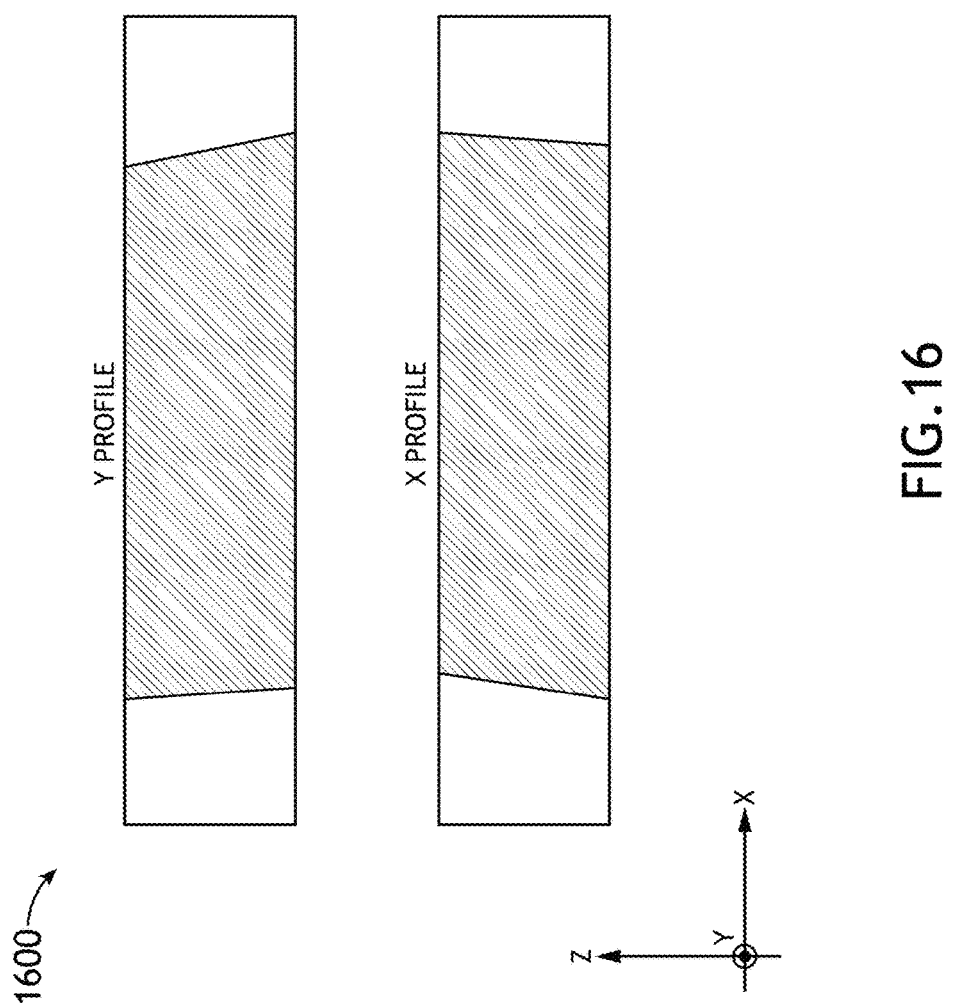
FIG. 16 is a schematic view of a simulated printed pattern profile of a resist layer corresponding to a focus-sensitive pattern element with sub-resolution features, in accordance with one or more embodiments of the present disclosure.

FIG. 16 is a schematic view of a simulated printed pattern profile 1600 of a resist layer 116 corresponding to a focus-sensitive pattern element 1400 with sub-resolution features, in accordance with one or more embodiments of the present disclosure. In one embodiment, asymmetric illumination associated with an asymmetric distribution of diffracted beams 1502-1508 induces a resist profile 1600 that is asymmetric in both the X and Y directions. For example, resist profile 1600 may exhibit asymmetric sidewall angles in both the X and Y directions in response to deviations of the focal position of the sample 112, leading to PPE. Further, the top of the resist profile 1600 may shift in both the X and Y directions in response to deviations of the focal position of the sample 112, leading to PPE.

Figure 17:
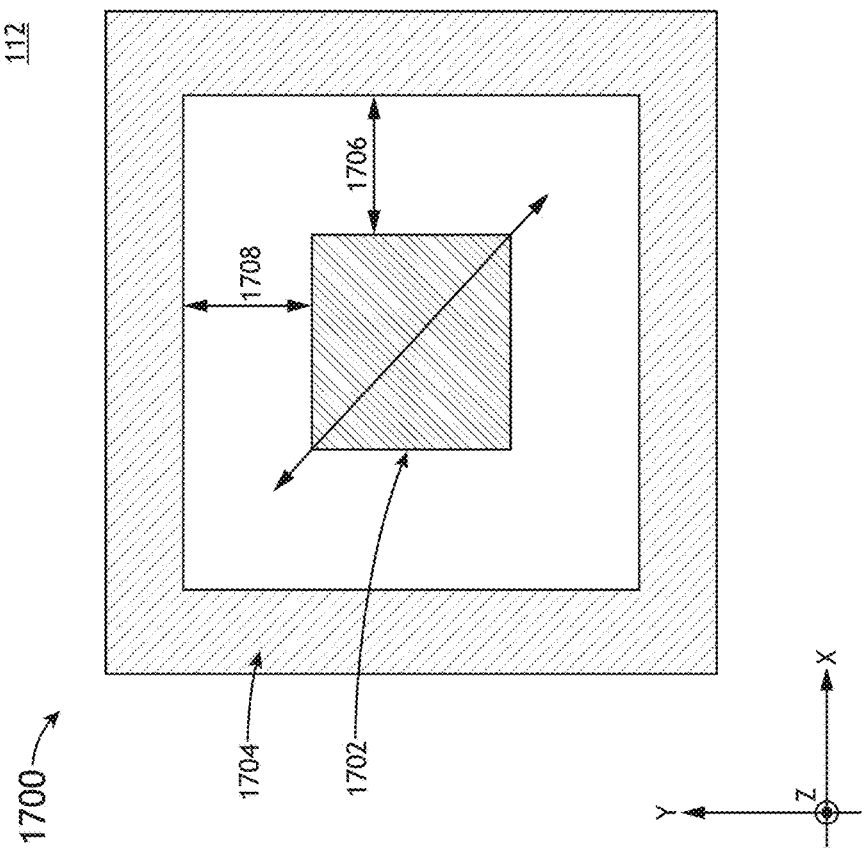
FIG. 17 is a top view of a metrology target including focus-sensitive and focus-insensitive printed pattern elements, in accordance with one or more embodiments of the present disclosure.

FIG. 17 is a top view of a metrology target 1700 including focus-sensitive and focus-insensitive printed pattern elements, in accordance with one or more embodiments of the present disclosure. In one embodiment, metrology target 1700 includes focus-sensitive printed pattern element 1702 corresponding to an image of pattern element 1400. For example, focus-sensitive printed pattern element 1702 may be configured to provide sensitivity to the focal position of the sample 112 as measured along both the X and Y directions. In another embodiment, metrology target 1700 includes a focus-insensitive printed pattern element 1704 surrounding the focus-sensitive printed pattern element 1702. In this regard, metrology target 1700 may be characteristic of a box-in-box overlay metrology target. For example, a deviation of the focal position of the sample 112 along the X-direction may be manifested as a shift of the focus-sensitive printed pattern element 1702 and thus a change in distance 1706. Similarly, a deviation of the focal position of the sample 112 along the Y-direction may be manifested as a shift of the focus-sensitive printed pattern element 1702 and thus a change in distance 1708. In this regard, metrology target 1700 is sensitive to the pitch and yaw of the sample 112 as well as an average focal position of the sample 112.

Focus-sensitive pattern element 1702 and focus-insensitive pattern element 1704 may be imaged onto the sample 112 to generate printed pattern elements in a single processing step or in multiple processing steps. In one embodiment, focus-sensitive pattern element 1702 and focus-insensitive pattern element 1704 are located on a single pattern mask and simultaneously imaged onto the sample 112. In another embodiment, focus-sensitive pattern element 1702 and focus-insensitive pattern element 1704 may be separately imaged onto the sample 112. For example, focus-sensitive pattern element 1702 and focus-insensitive pattern element 1704 may be located on separate pattern masks or different locations of a single pattern mask.

In some embodiments, the illumination source 102 is configured to exhibit a symmetric off-axis intensity distribution. In this regard, the distribution of the illumination source 102 may be suitable for the fabrication of printed pattern elements associated with semiconductor devices of interest as well as process-sensitive metrology targets. For example, a symmetric off-axis illumination source 102 such as, but not limited to, a symmetric dipole illumination source 102 may be suitable for printing dense line/space patterns (e.g. associated with fins, gates or the like of logic and/or memory devices). Accordingly, in some embodiments, the pattern mask 108 and the symmetric illumination source 102 are co-optimized to provide process-sensitive metrology targets suitable for fabrication on a sample 112 in the same set of process steps used to fabricate semiconductor devices.

FIG. 18 is a plot 1800 of an exemplary intensity distribution of an illumination source 102 for printing process-sensitive metrology targets, in accordance with one or more embodiments of the present disclosure. In one embodiment, illumination source 102 is a symmetric dipole illumination source including a first pole 104a and a second pole 104b symmetric to the first pole. It is noted, however, that the exemplary intensity distribution of FIG. 18 is provided solely for illustrative purposes and should not be interpreted as limiting. For example, the illumination source 102 may be configured as any symmetric source including, but not limited to, a symmetric dipole source, a C-Quad illumination source, a Quasar illumination source, or a free-form illumination source with a symmetric distribution.

It is noted herein that each illumination pole (e.g. illumination poles 104a,104b) may be diffracted by the pattern mask 108 according to the distribution of pattern elements on the pattern mask 108. In this regard, diffracted beams associated with a given illumination pole may interfere on the sample 112 such that the intensity distribution on the sample 112 associated with the given illumination pole is a function of the relative optical phase (e.g. associated with optical path differences, or the like) of the diffracted beams. Further, the total intensity distribution may include contributions of the first and second illumination poles (e.g. illumination poles 104a,104b).

For example, the intensity of the illumination on the sample 112 associated with a first illumination pole (e.g. illumination pole 104a) may be described as the interference of two diffracted beams at the sample 112 (e.g. in a lithography sub-system 101 as illustrated in FIG. 3A, or the like):

$$I_1(x,z) = a_0^2 + a_1^2 + 2a_0 a_1 \cos(\Delta\Phi(x,z)) \tag{1}$$

where $a_0$ and $a_1$ are constants associated with the electric field amplitude of first and second diffracted beams, and $\Delta\Phi$ corresponds to an optical phase difference between the diffracted beams. For example, the diffracted beams may include a 0-order diffracted beam and a $1^{st}$ order diffracted beam (e.g. as shown in FIG. 3A,3D,3G, or the like). In this regard, $\Delta\Phi(x,z)$ may be described as:

$$\Delta\Phi(x,z) = \frac{2\pi}{p}x + \frac{2\pi n}{\lambda}(\cos\theta_1 - \cos\theta_0)z = \tag{2}$$

$$\frac{2\pi}{p}x + \frac{2\pi}{\lambda}\left(\sqrt{1 - \left(\sin\theta_0 - \frac{\lambda}{p}\right)^2} - \cos\theta_0\right)z$$

where p is a pitch of the pattern mask 108 along the x-direction, $\lambda$ is the wavelength of the illumination beam

104, $\theta_0$ is the diffraction angle of the 0-order diffracted beam from the pattern mask 108, and $\theta_1$ is the diffraction angle of the 1st order diffracted beam from the pattern mask 108. Further, the diffraction angle of the 0-order diffracted beam, $\theta_0$, may be the same as the incident angle of the illumination beam 104. Accordingly, the 0-order diffracted beam may propagate along a linear path through the pattern mask 108.

The total intensity distribution on the sample 112 associated with symmetric dipole illumination may thus be described by the contributions of the intensity distributions from the two dipole sources. For example, the total intensity distribution may be, but is not required to be, described as:

$$I_{Tot}(x,z) = \frac{I_1(x) + I_2(x)}{2} = \quad (3)$$

$$a_0^2 + a_1^2 + 2a_0 a_1 \cos\left(\frac{2\pi}{p}x\right)\cos\left(\frac{2\pi}{\lambda}\left(\sqrt{1 - \left(\sin\theta_0 - \frac{\lambda}{p}\right)^2} - \cos\theta_0\right)z\right).$$

In this regard, the intensity distribution on the sample 112 may correspond to a sinusoidal distribution along the X-direction with a period equal to the pitch, p, of the pattern mask 108. Further, the intensity distribution on the sample 112 along the Z-direction may correspond to a sinusoidal distribution with a period a function of the incident angle of the illumination beam 104, $\theta_0$, and the pitch of the pattern mask 108, p.

It is to be understood that equations 1 through 3 and the associated description of the distribution of illumination on the sample 112 associated with the illumination source 102 is provided solely for illustrative purposes and should not be interpreted as limiting. For example, the illumination source 102 may exhibit any spatial and/or temporal coherence properties to provide a desired illumination profile on the sample 112. In this regard, the spatial and/or temporal coherence properties of the illumination source 102 may affect the interference between diffracted orders of a given illumination pole and/or the interference between multiple illumination poles. Further, the total intensity distribution on the sample 112 may include contributions from any number of diffracted beams from any number of locations on the illumination source 102 (e.g. illumination poles, or the like).

In one embodiment, the illumination source 102 and the pattern mask 108 may be co-optimized to provide an intensity distribution on the sample 112 suitable for generating a focus-sensitive metrology target. For example, the illumination source 102 and the pattern mask 108 may be co-optimized to generate an optical phase difference between diffracted beams from each of a pair of symmetric illumination poles (e.g. such that $\Delta\Phi \neq 0$ in equations 1-3). Accordingly, as shown by equations 1-3, the intensity on the sample 112 associated with the first dipole (e.g. $I_1(x,z)$) may be asymmetric in a first direction, whereas the intensity on the sample 112 associated with the second dipole (e.g. $I_2(x,z)$) may be asymmetric in the opposite direction. Further, the total intensity distribution on the sample 112 (e.g. $I_{Tot}(x,z)$) may be modulated along the Z-direction (e.g. along the optical axis of the set of projection optics 110, or the like). In this regard, the intensity distribution on the sample 112 may be sensitive to the focal position of the sample 112 (e.g. according to a Z-dependent term in equation 3, or the like). Accordingly, deviations of the focal position of the sample 112 may influence one or more characteristics of printed pattern elements on the sample 112 to generate a focus-sensitive metrology target.

Figure 19A:
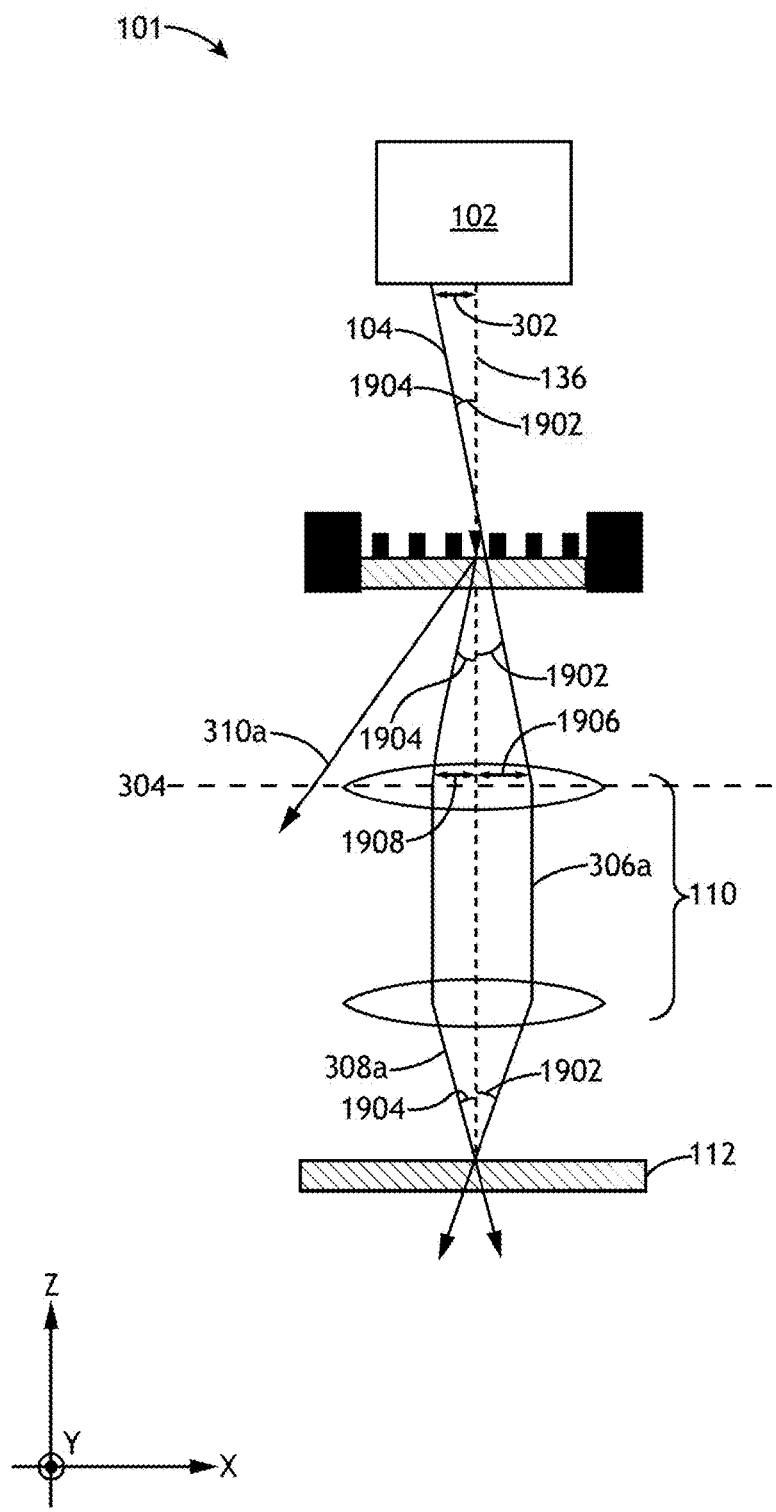
FIG. 19A is a conceptual view of lithography sub-system illustrating beam paths associated with a first pole of an illumination source and a pattern mask configured to generate a focus-sensitive metrology target on a sample, in accordance with one or more embodiments of the present disclosure.
Figure 19B:
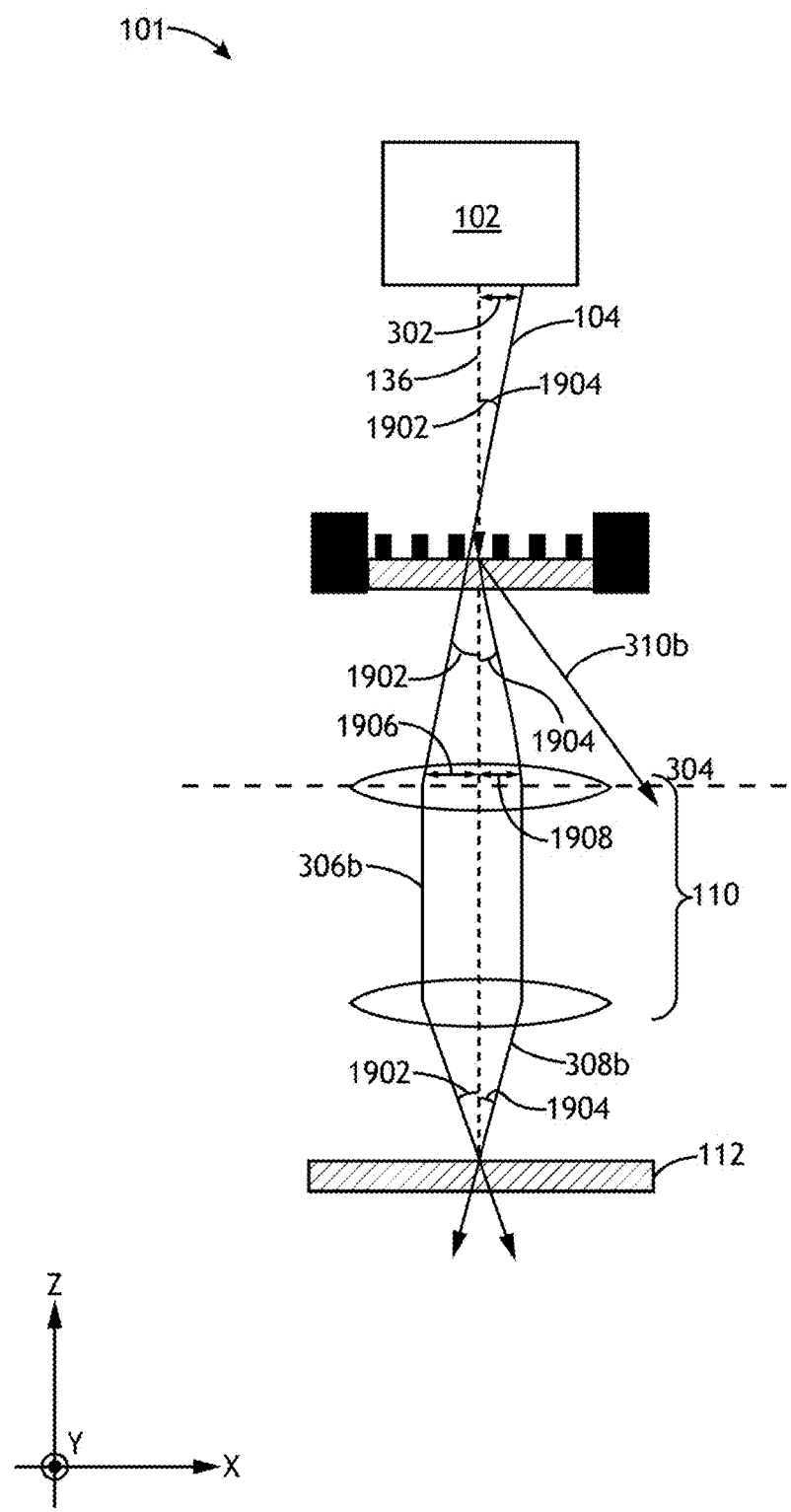
FIG. 19B is a conceptual view of lithography sub-system illustrating beam paths associated with a second pole of an illumination source symmetric to the first pole and a pattern mask configured to generate a focus-sensitive metrology target on a sample, in accordance with one or more embodiments of the present disclosure.

FIG. 19A is a conceptual view of lithography sub-system 101 illustrating beam paths associated with a first pole of illumination source 102 and a pattern mask 108 configured to generate a focus-sensitive metrology target on a sample 112, in accordance with one or more embodiments of the present disclosure. FIG. 19B is a conceptual view of lithography sub-system 101 illustrating beam paths associated with a second pole of illumination source 102 symmetric to the first pole and a pattern mask 108 configured to generate a focus-sensitive metrology target on a sample 112, in accordance with one or more embodiments of the present disclosure. It is noted herein that beam paths associated with both FIGS. 19A and 19B, as well as additional pairs of symmetric illumination poles (not shown) may be simultaneously present to generate an aerial image of pattern mask 108 on the sample 112.

FIG. 20 is a plot 2000 illustrating the distribution of diffracted beams 306a, 306b, 308a, 308b in the pupil plane 304 of a lithography sub-system 101 for the generation of a focus-sensitive metrology target, in accordance with one or more embodiments of the present disclosure. In one embodiment, diffracted beams 306a, 306b correspond to beam paths illustrated in FIG. 19A. For example, diffracted beam 306a may correspond to a 0-order diffracted beam and diffracted beam 306b may correspond to a 1st order diffracted beam. Further, diffracted beams 306a, 306b may be distributed with an asymmetric profile such that the optical paths of the diffracted beams through the lithography sub-system 101 differ (e.g., $\theta_0 \neq \theta_1$ in equation 2) and the illumination of the sample 112 may be asymmetric. Similarly, diffracted beams 308a, 308b may correspond to beam paths illustrated in FIG. 19B. For example, diffracted beam 308a may correspond to a 0-order diffracted beam and diffracted beam 308b may correspond to a 1st order diffracted beam. Further, diffracted beams 308a, 308b may be similarly distributed with an asymmetric profile such that the illumination of the sample 112 may be asymmetric. However, the combined distribution of diffracted beams 306a, 306b, 308a, 308b may be symmetric.

In another embodiment, diffracted beams 306a, 306b, 308a, 308b may have a finite width in the pupil plane 304 corresponding to a spatial extent of the illumination poles of the illumination source 102. For example, a pitch of a pattern mask 108 suitable for generating a focus-sensitive metrology target on the sample 112 may be calculated based on a known distribution of the illumination source 102. For example, the pattern mask 108 may be, but is not required to be, designed such that a focus-sensitive pupil separation distance, $D_f$, between diffracted beams of a given illumination pole (e.g. the separation between 306a and 306b) in the pupil plane 304 may be calculated as:

$$D_f = \frac{\sigma_{out} + \sigma_{in}}{2} + (\sigma_{out} - \sigma_{in}) \quad (4)$$

where $\sigma_{out}$ and $\sigma_{in}$ are the outer and inner extents of the 0-order diffracted beam in the pupil plane, respectively. Accordingly, the diffracted beams of each illumination pole may be asymmetrically distributed in the pupil plane without overlap (e.g. as illustrated in FIG. 20).

Further, a focus-sensitive pitch, $P_f$, of pattern elements on the pattern mask 108 may be calculated based on the focus-sensitive pupil separation distance, $D_f$. In one embodiment, the separation between diffracted beams generated by a pattern mask 108 may be described according to a diffraction equation:

$$\frac{m\lambda}{P} = n\sin\theta_0 + n\sin\theta_1 = NA(\sigma_0 + \sigma_1) \quad (5)$$

where λ is the wavelength of the illumination source 102, n is the refractive index surrounding the diffraction grating, p is a pitch associated with pattern elements on the pattern mask 108, $\theta_0$ is the incident angle 1902 of the illumination beam 104 as well as the exit angle of the 0-order diffracted beam (e.g., diffracted beam 306a,308a), $\theta_1$ is the exit angle 1904 of a diffracted beam (e.g., diffracted beam 306b,308b), $\sigma_0$ is a center position 1906 of the 0-order diffracted beam (e.g., diffracted beam 306a,308a) in the pupil plane 304, $\sigma_1$ is a center position 1908 of the 1$^{st}$ order diffracted beam (e.g., diffracted beam 306a,308a) in the pupil plane 304, and NA is the numerical aperture of the set of projection optics 110. In another embodiment, a focus-sensitive pitch, $P_f$, may be calculated based on the focus-sensitive pupil separation, $D_f$, between a 0-order diffracted beam (e.g., diffracted beam 306a,308a) and a 1$^{st}$ order diffracted beam (e.g., diffracted beam 306a,308a where m=1) as:

$$P_f = \frac{\lambda}{NA \cdot D_f}. \quad (6)$$

By way of an illustrative example, lithography sub-system 101 may include a symmetric dipole source (e.g. corresponding to plot 1800 of FIG. 18, or the like) configured for the fabrication of line/space patterns with a pitch of 80 nm. Further, the 0-order diffracted beams 306a,308a in the pupil plane may have an outer extent, $\sigma_{out}$, of 0.96 and an inner extent, $\sigma_{in}$, of 0.86 such that the 0-order diffracted beams 306a,308a are distributed near the pupil limit 312. Accordingly, the pattern mask 108 may be designed to generate diffracted orders with a separation of $D_f$=0.942 (e.g. according to equation 4) with a pitch, Pf=152 nm (e.g. according to equation 6).

Figure 21:
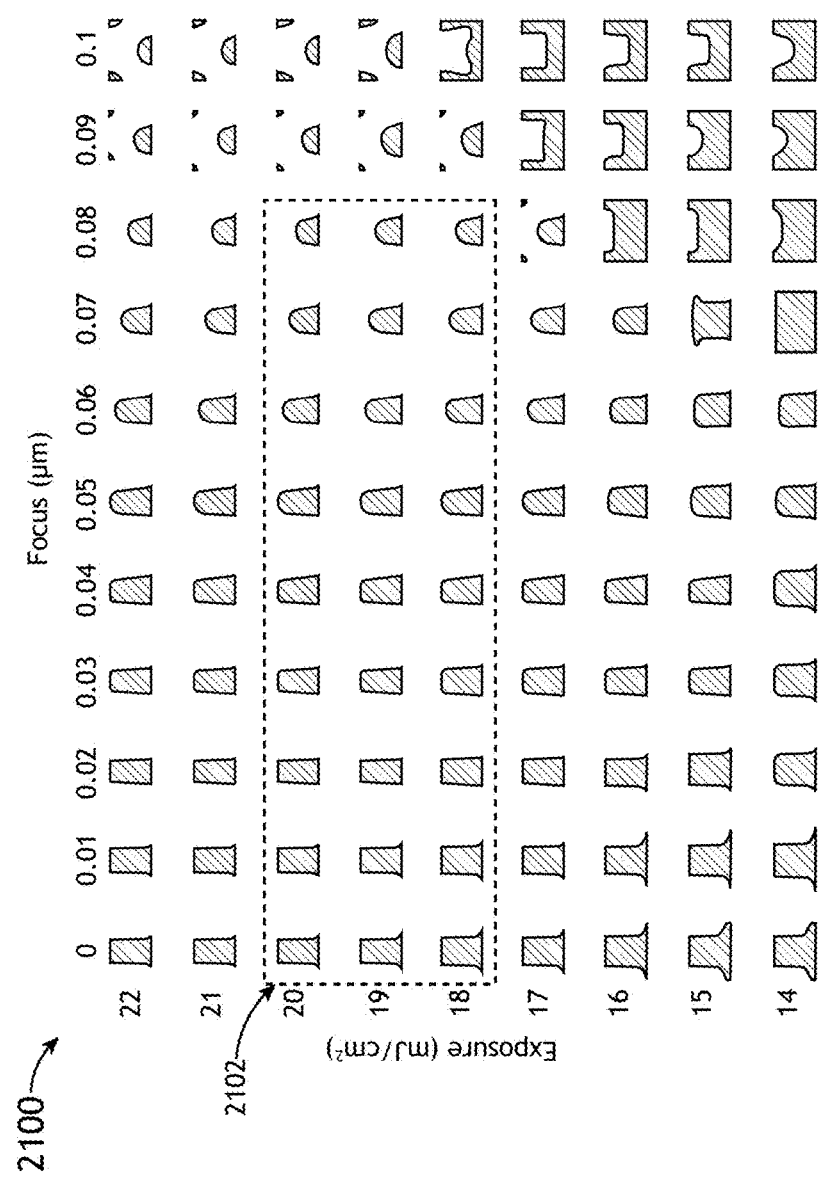
FIG. 21 is a schematic view of simulated printed pattern profiles of a focus exposure matrix corresponding to a focus-sensitive metrology target, in accordance with one or more embodiments of the present disclosure.

FIG. 21 is a schematic view of simulated printed pattern profiles 2100 (e.g. in a resist layer 116 of sample 112) of a focus exposure matrix (FEM) corresponding to a focus-sensitive metrology target, in accordance with one or more embodiments of the present disclosure. In one embodiment, FIG. 21 illustrates variations of printed pattern profiles 2100 with respect to the focal position of the sample 112 along the horizontal axis and the exposure of the sample 112 (e.g. the dose of energy incident on the sample 112 by the illumination beams 104) along the vertical axis. In another embodiment, a process window of interest is illustrated by the process window 2102. For example, printed pattern profiles 2100 may correspond to printed patterns fabricated with a focus-sensitive pitch of 150 nm as described above. Further, multiple characteristics of the printed pattern elements such as, but not limited to, the printed height, sidewall angle, and critical dimension (e.g. a width of the printed pattern at a designated height), are sensitive to deviations of the focal position of the sample 112.

In another embodiment, focus-sensitive characteristics (e.g. height, sidewall angle, critical dimension, or the like) are relatively sensitive to deviations of the focal position of the sample 112, and relatively insensitive to other process variations such as, but not limited to the exposure of the sample 112. For example, as illustrated in FIG. 21, within the process window 2102, the printed pattern profiles 2100 exhibit a higher sensitivity to deviations of the focal position of the sample 112 (e.g. as viewed along the horizontal axis) than the exposure (e.g. as viewed along the vertical axis).

Figure 22A:
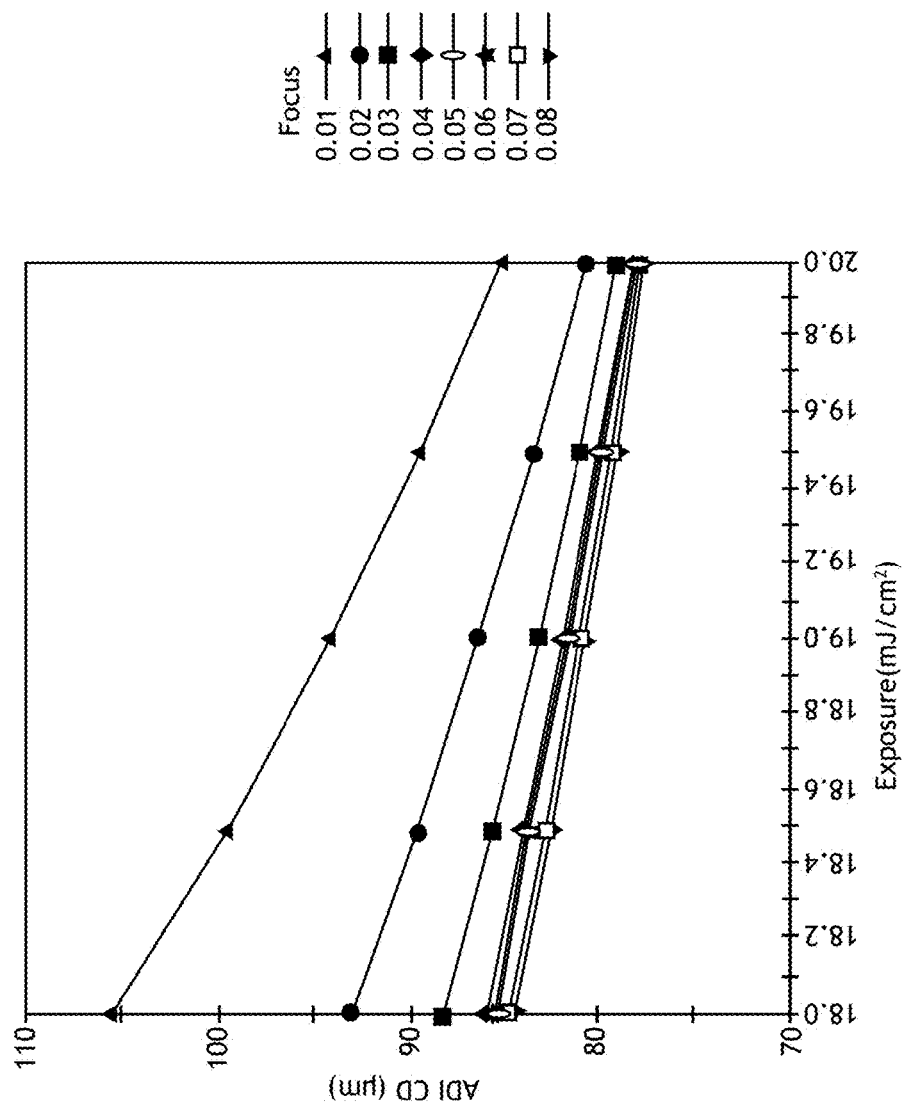
FIG. 22A is a plot illustrating the variation of the critical dimension of printed pattern elements as a function of exposure for multiple values of focal position of the sample, in accordance with one or more embodiments of the present disclosure.

FIG. 22A is a plot illustrating the variation of a critical dimension of printed pattern elements (e.g., printed pattern elements 2100) as a function of exposure for multiple values of focal position of the sample 112, in accordance with one or more embodiments of the present disclosure. For example, plot 2200 may correspond to measured values of the simulated printed pattern profiles of FIG. 21. In one embodiment, the sensitivity of the critical dimension to focal position of the sample 112 varies by an exemplary 18 nm in response to a 70 nm deviation of the focal position. Further, for a given focal position of the sample 112, the variations of the critical dimension as a function of exposure are relatively small (e.g., approximately 5 nanometers over the range of interest).

Figure 22B:
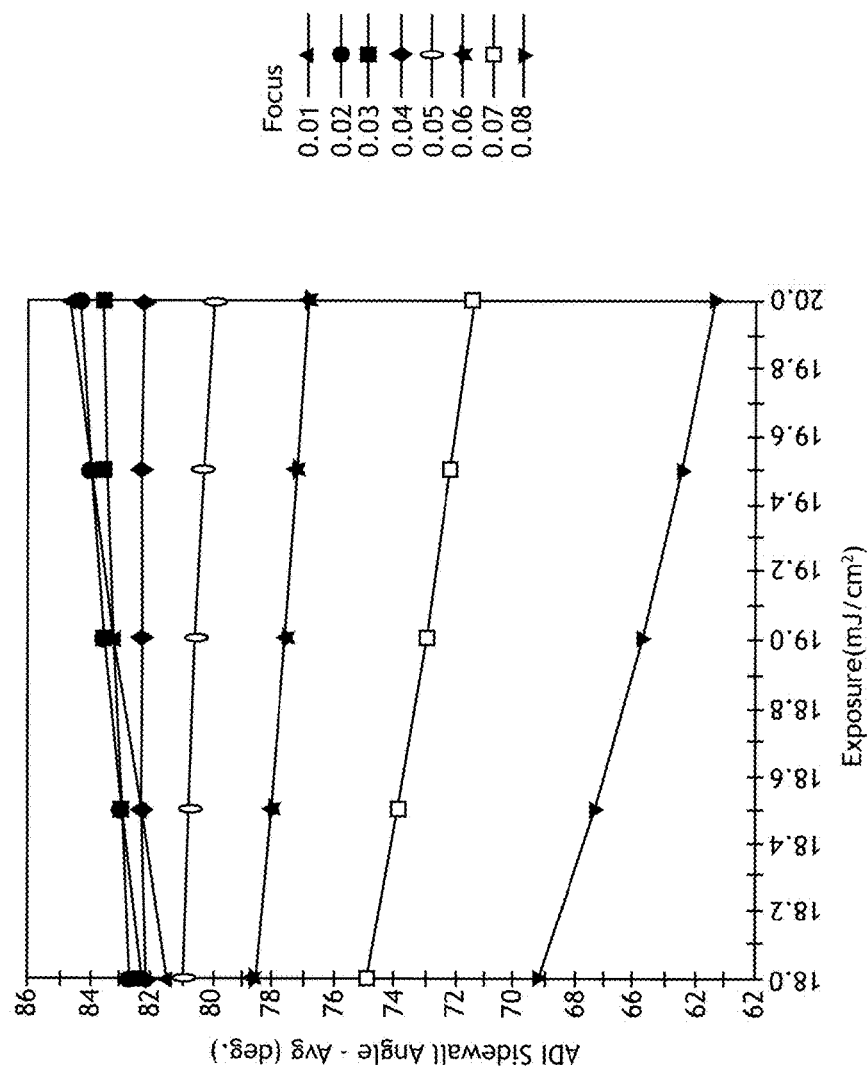
FIG. 22B is a plot illustrating the variation of the sidewall angles of printed pattern elements as a function of exposure for multiple values of focal position of the sample, in accordance with one or more embodiments of the present disclosure.

FIG. 22B is a plot illustrating the variation of the sidewall angles of printed pattern elements (e.g., printed pattern elements 2100) as a function of exposure for multiple values of focal position of the sample 112, in accordance with one or more embodiments of the present disclosure. For example, the plot may correspond to measured values of the simulated printed pattern profiles of FIG. 21. In one embodiment, the sidewall angle varies by an exemplary 16 degrees in response to a 70 nm deviation of the focal position of the sample 112. Further, for a given focal position of the sample 112, the variations of the sidewall angle as a function of exposure are relatively small (e.g., approximately 3 degrees over the range of interest).

In another embodiment, multiple characteristics of printed pattern elements may be simultaneously utilized to determine deviations of the focal position of the sample 112. For example, measurements of the critical dimension and the sidewall angle of printed pattern elements of a metrology target may provide greater sensitivity and accuracy than measurements of a single characteristic.

It is noted herein that the image of a pattern mask generated on a sample (e.g. by lithography sub-system 101) may critically depend on the proximity of pattern elements within a pattern mask. In this regard, pattern elements with dimensions (e.g. actual dimensions, separations between pattern elements, or the like) smaller than a resolution of the lithography sub-system 101 (e.g. the set of projection optics 110) may influence a pattern printed on a resist layer 116 of a sample 112 based on optical effects such as scattering, diffraction, and the like. Further, sub-resolution pattern elements (alternatively, optical proximity correction (OPC) pattern elements, or the like) may influence one or more characteristics of printed pattern elements (e.g. PPE, sidewall angle, critical dimension, or the like) without being resolvably imaged onto the sample 112.

FIG. 23A is a top view of asymmetric segmented pattern elements 2302 for the generation of focus-sensitive metrology targets, in accordance with one or more embodiments of the present disclosure. In one embodiment, asymmetric segmented pattern elements 2302 are separated by a focus-sensitive pitch 2310 such that diffracted beams from an illumination pole (e.g. an off-axis single-pole illumination source 102 as illustrated by FIG. 3A, one of a pair of symmetric illumination poles as illustrated in FIGS. 19A and 19B, or the like) are asymmetrically distributed in the pupil plane 304 of lithography sub-system 101. In another embodiment, asymmetric segmented pattern elements 2302 include one or more features (e.g. segments, separation distances between segments, or the like) smaller than the resolution of the set of projection optics 110. For example, as shown in FIG. 23A, asymmetric segmented pattern element 2302 includes a primary segment 2304 and a secondary segment 2306 separated along the X-direction by a sub-resolution separation distance 2308. Further, the lengths of the primary segment 2304 and the secondary segment 2306 along the X-direction may be different such that asymmetric segmented pattern element 2302 is asymmetric in the X-direction. Accordingly, the asymmetric segmented pattern elements 2302 may be imaged onto the sample 112 as unsegmented printed pattern elements.

In another embodiment, asymmetric segmented pattern elements 2302 separated by a focus-sensitive pitch 2310 and illuminated by a symmetric illumination source 102 (e.g. as illustrated in FIGS. 19A and 19B) provide asymmetric illumination of the sample 112 associated with the aerial image of the pattern mask 108. For example, asymmetric segmented pattern elements 2302 may break the symmetry of illumination beam 104a and illumination beam 104b to provide asymmetric illumination of the sample 112. Accordingly, corresponding printed pattern elements may be asymmetric.

FIG. 23B is a schematic view of simulated printed pattern profiles 2312 of a resist layer 116 corresponding to asymmetric segmented pattern elements 2302, in accordance with one or more embodiments of the present disclosure. In one embodiment, the sidewall angles as well as the shapes of the printed pattern profiles 2312 are asymmetric.

Figure 23C:
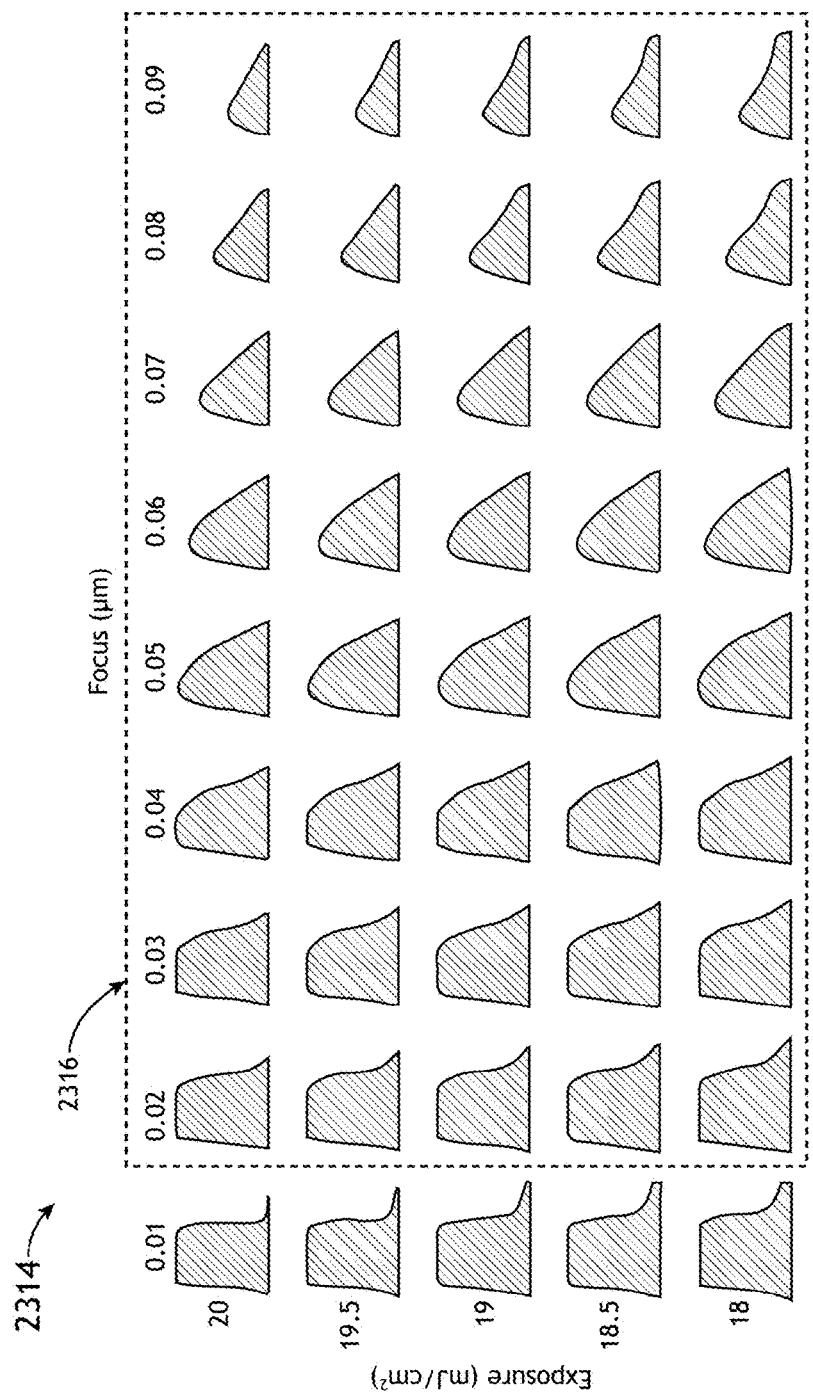
FIG. 23C is a schematic view of simulated printed pattern profiles of a focus exposure matrix corresponding to images of asymmetric segmented metrology targets, in accordance with one or more embodiments of the present disclosure.

FIG. 23C is a schematic view of simulated printed pattern profiles 2314 (e.g. in a resist layer 116 of sample 112) of a focus exposure matrix corresponding to images of asymmetric segmented metrology targets, in accordance with one or more embodiments of the present disclosure. For example, simulated printed pattern profiles 2314 may correspond to images of asymmetric segmented pattern elements 2302. In one embodiment, FIG. 23C illustrates variations of printed pattern profiles with respect to the focal position of the sample 112 along the horizontal axis and the exposure of the sample 112 (e.g. the dose of energy incident on the sample 112 by the illumination beams 104) along the vertical axis. In another embodiment, a process window 2316 illustrates process parameters of interest. For example, the process window 2316 may include robust printed pattern elements and/or practical ranges associated with expected deviations of the focal position of the sample 112 and the exposure of the sample 112.

In another embodiment, the asymmetric printed pattern profiles 2314 are highly sensitive to deviations of the focal position of the sample 112 and are insensitive to deviations of the exposure. In this regard, the asymmetric printed pattern profiles 2314 may operate as focus-sensitive patterns on a focus-sensitive metrology target.

In one embodiment, the illumination source 102 and the pattern mask 108 may be co-optimized to provide an intensity distribution on the sample 112 suitable for generating an exposure-sensitive metrology target.

Figure 24A:
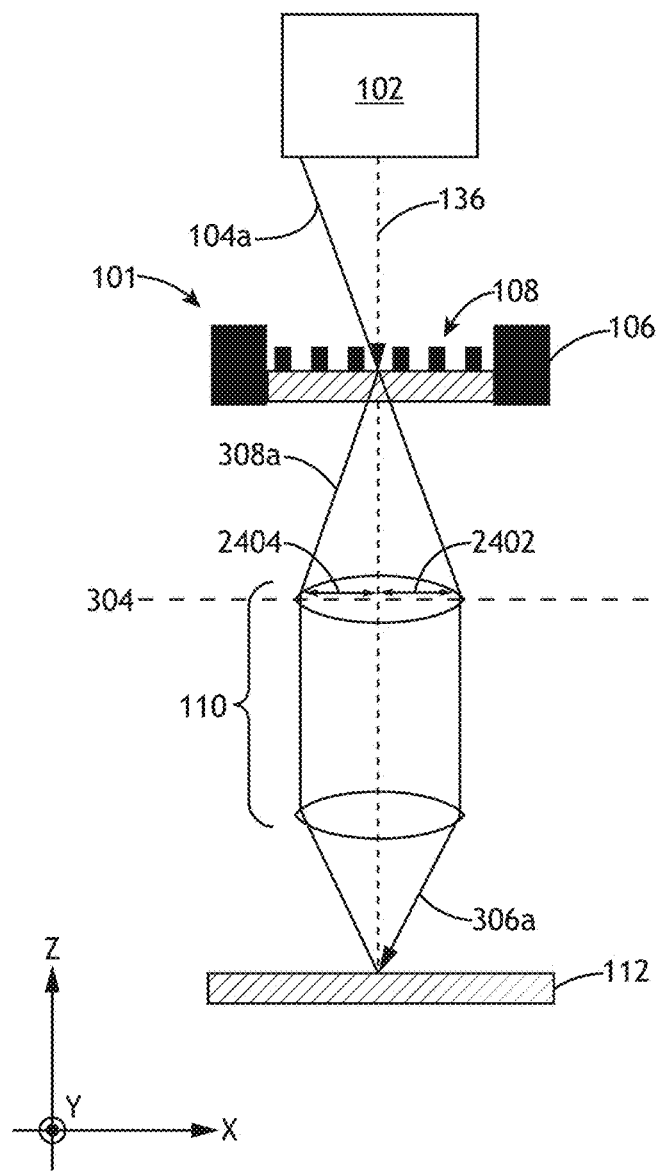
FIG. 24A is a conceptual view of lithography sub-system illustrating beam paths associated with a first pole of an illumination source and a pattern mask configured to generate an exposure-sensitive metrology target on a sample, in accordance with one or more embodiments of the present disclosure.
Figure 24B:
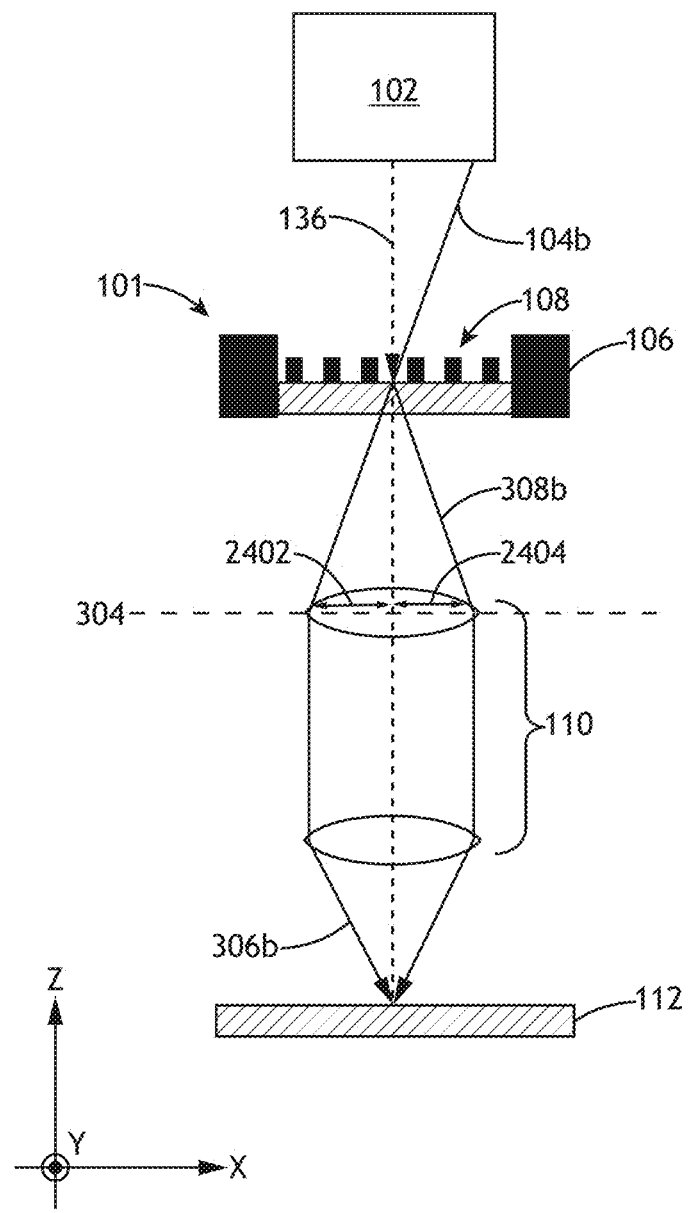
FIG. 24B is a conceptual view of lithography sub-system illustrating beam paths associated with a second pole of an illumination source symmetric to the first pole and a pattern mask configured to generate an exposure-sensitive metrology target on a sample, in accordance with one or more embodiments of the present disclosure.

FIG. 24A is a conceptual view of lithography sub-system 101 illustrating beam paths associated with a first pole of illumination source 102 and a pattern mask 108 configured to generate an exposure-sensitive metrology target on a sample 112, in accordance with one or more embodiments of the present disclosure. FIG. 24B is a conceptual view of lithography sub-system 101 illustrating beam paths associated with a second pole of illumination source 102 symmetric to the first pole and a pattern mask 108 configured to generate an exposure-sensitive metrology target on a sample 112, in accordance with one or more embodiments of the present disclosure. It is noted herein that beam paths associated with both FIGS. 24A and 24B, as well as additional pairs of symmetric illumination poles (not shown) may be simultaneously present to generate an aerial image of pattern mask 108 on the sample 112.

In one embodiment, the illumination source 102 (e.g. the symmetric illumination source illustrated in FIGS. 24A and 24B, or the like) and the pattern mask 108 are co-optimized such that diffracted beams from each of a pair of symmetric illumination poles have the same optical path length when propagating through the lithography sub-system 101. For example, the illumination source 102 and the pattern mask 108 may be co-optimized such that diffracted beams are symmetrically distributed in the pupil plane 304 (e.g. $\theta_0 = \theta_1$ according to equation 2). Accordingly, as shown by equation 2, the optical phase between the diffracted beams, $\Delta\Phi$, may not exhibit a dependence on the Z-direction. The total intensity distribution on the sample 112 may thus be, but is not required to be, described as:

$$I_{Tot}(x, z) = a_0^2 + a_1^2 + 2a_0 a_1 \cos\left(\frac{2\pi}{p} x\right). \tag{7}$$

In this regard, the total intensity distribution on the sample 112 may be insensitive to deviations of the focal position of the sample 112 (e.g. along the Z-direction) such that any variations of characteristics of printed pattern elements may be attributed to deviations of the exposure of the sample 112.

Figure 25:
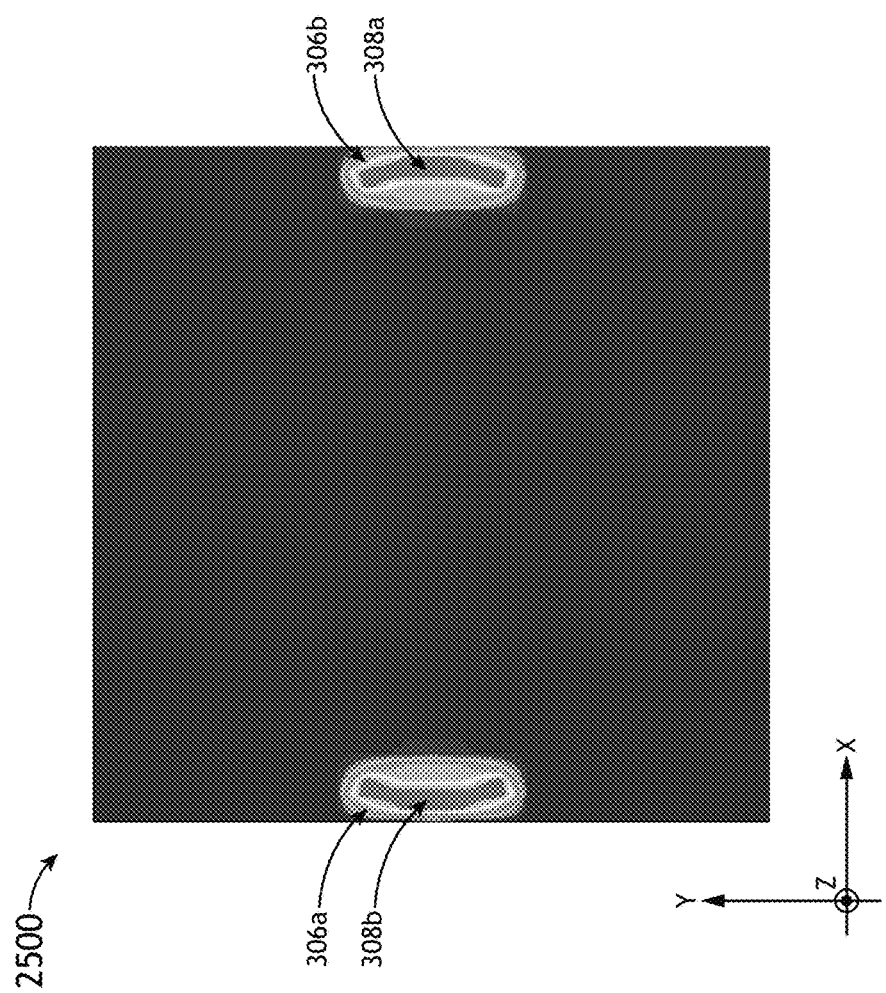
FIG. 25 is a plot illustrating the distribution of diffracted beams in the pupil plane of a lithography system for the generation of an exposure-sensitive metrology target, in accordance with one or more embodiments of the present disclosure.

FIG. 25 is a plot 2500 illustrating the distribution of diffracted beams 306a, 306b, 308a, 308b in the pupil plane 304 of a lithography sub-system 101 for the generation of an exposure-sensitive metrology target, in accordance with one or more embodiments of the present disclosure. In one embodiment, diffracted beams 306a, 306b correspond to beam paths illustrated in FIG. 24A. For example, diffracted beam 306a may correspond to a 0-order diffracted beam and diffracted beam 306b may correspond to a $1^{st}$ order diffracted beam. Further, diffracted beams 306a, 306b may be symmetrically distributed such that the optical phase difference between the diffracted beams 306a, 306b is zero (e.g. $\theta_0 = \theta_1$) and the illumination of the sample 112 is symmetric. Similarly, diffracted beams 308a, 308b may correspond to beam paths illustrated in FIG. 24B. For example, diffracted beam 308a may correspond to a 0-order diffracted beam and diffracted beam 308b may correspond to a 1st order diffracted beam. Further, diffracted beams 308a, 308b may be symmetrically distributed such that the optical path difference between the diffracted beams 308a, 308b is zero (e.g. $\theta_0 = \theta_1$) and the illumination of the sample 112 is symmetric. Additionally, the beams from the two illumination poles may overlap. For example, as illustrated in FIG. 25, the diffracted beam 306a and diffracted beam 308b may overlap. Similarly, diffracted beam 306b and 308a may overlap.

In another embodiment, the separation of diffracted beams in the pupil plane 304 is designed to achieve a relatively high depth of field on the sample 112. For example, the separation of diffracted beams in the pupil plane 304 may be configured to be equal to the separation of the illumination poles of the illumination source 102. In this regard, the sensitivity of printed pattern elements to deviations of the focal position of the sample 112 may be reduced. Accordingly, one or more characteristics of printed pattern elements may be sensitive to the exposure (e.g. dose) on the sample 112.

In another embodiment, an exposure-sensitive pupil separation distance, $D_e$, between a 0-order diffracted beam (e.g., diffracted beam 306a,308a) and a $1^{st}$ order diffracted beam (e.g., diffracted beam 306a,308a) may be calculated as:

$$D_e = 2\sigma_0 = 2\sigma_1 = 2\sigma \quad (8)$$

where $\sigma_0$ is a center position 2402 of the 0-order diffracted beam (e.g., diffracted beam 306a,308a) in the pupil plane 304, and $\sigma_1$ is a center position 2404 of the $1^{st}$ order diffracted beam (e.g., diffracted beam 306a,308a) in the pupil plane 304. In another embodiment, an exposure-sensitive pitch, $P_e$, of pattern elements on the pattern mask 108 may be calculated as (e.g., according to equation 5):

$$P_e = \frac{\lambda}{2NA \cdot \sigma}. \quad (9)$$

Further, the width of the diffracted beams in the pupil plane may define a process window for the design of exposure-sensitive metrology targets. For example, a process window may include values of exposure-sensitive pitch, $P_e$, ranging from:

$$P_{e,min} = \frac{\lambda}{2NA \cdot \sigma_{in}} \quad (10)$$

$$P_{e,max} = \frac{\lambda}{2NA \cdot \sigma_{out}} \quad (11)$$

where $\sigma_{in}$ and $\sigma_{out}$ are the inner and outer extents of the 0-order diffracted beam in the pupil plane 304, respectively.

By way of an illustrative example, lithography sub-system 101 may include a symmetric dipole source (e.g. corresponding to plot 1800 of FIG. 18, or the like) configured for the fabrication of line/space patterns with a pitch of 80 nm. Further, the 0-order diffracted beams 306a,308a in the pupil plane may have an outer extent, $\sigma_{out}$, of 0.96 and an inner extent, $\sigma_{in}$, of 0.86 such that the 0-order diffracted beams 306a,308a are distributed near the pupil limit 312. Accordingly, the pattern mask 108 may be designed to have an exposure-sensitive pitch, $P_e$, in the range of 74-84 nm. In this regard, an exposure-sensitive pitch of 80 nm may correspond to the same feature size as the line/space patterns to be fabricated as part of a semiconductor device on the sample 112.

Figure 26:
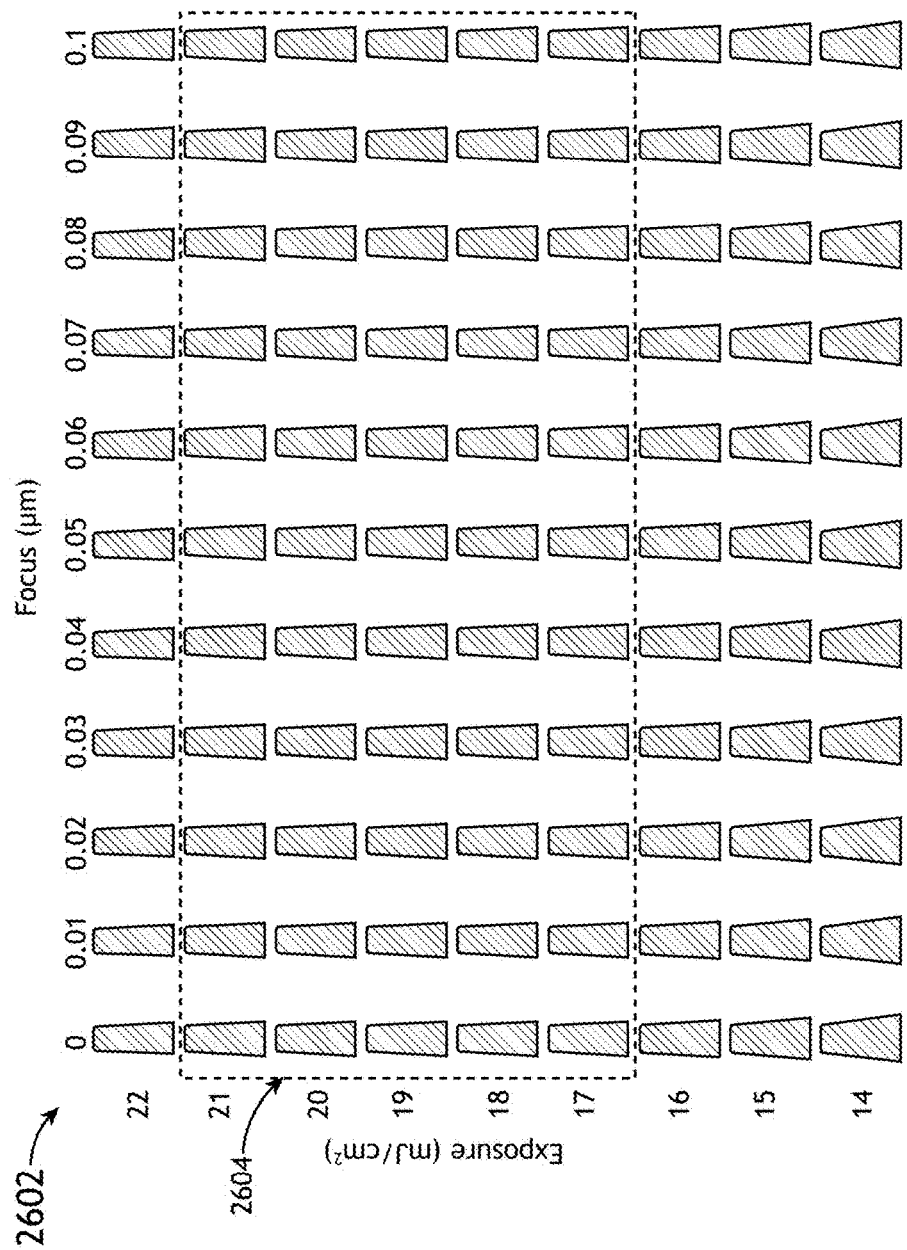
FIG. 26 is a schematic view of simulated printed pattern of a focus exposure matrix corresponding to images of exposure-sensitive pattern elements, in accordance with one or more embodiments of the present disclosure.

FIG. 26 is a schematic view of simulated printed pattern profiles 2602 (e.g. in a resist layer 116 of sample 112) of a focus exposure matrix corresponding to images of exposure-sensitive pattern elements, in accordance with one or more embodiments of the present disclosure. For example, simulated printed pattern profiles 2602 may correspond to illumination of the sample 112 with a distribution of diffracted beams 306a, 306b, 308a, 308b as depicted in FIG. 25, in accordance with one or more embodiments of the present disclosure. In one embodiment, FIG. 26 illustrates variations of printed pattern profiles with respect to the focal position of the sample 112 along the horizontal axis and the exposure of the sample 112 (e.g. the dose of energy incident on the sample 112 by the illumination beams 104) along the vertical axis. In another embodiment, a process window 2604 illustrates process parameters of interest. For example, the process window 2604 may include robust printed pattern elements and/or practical ranges associated with expected deviations of the focal position of the sample 112 and the exposure of the sample 112.

In another embodiment, the printed pattern profiles 2602 are highly sensitive to deviations of the exposure position of the sample and are insensitive to deviations of the focal position of the sample 112.

Figure 27:
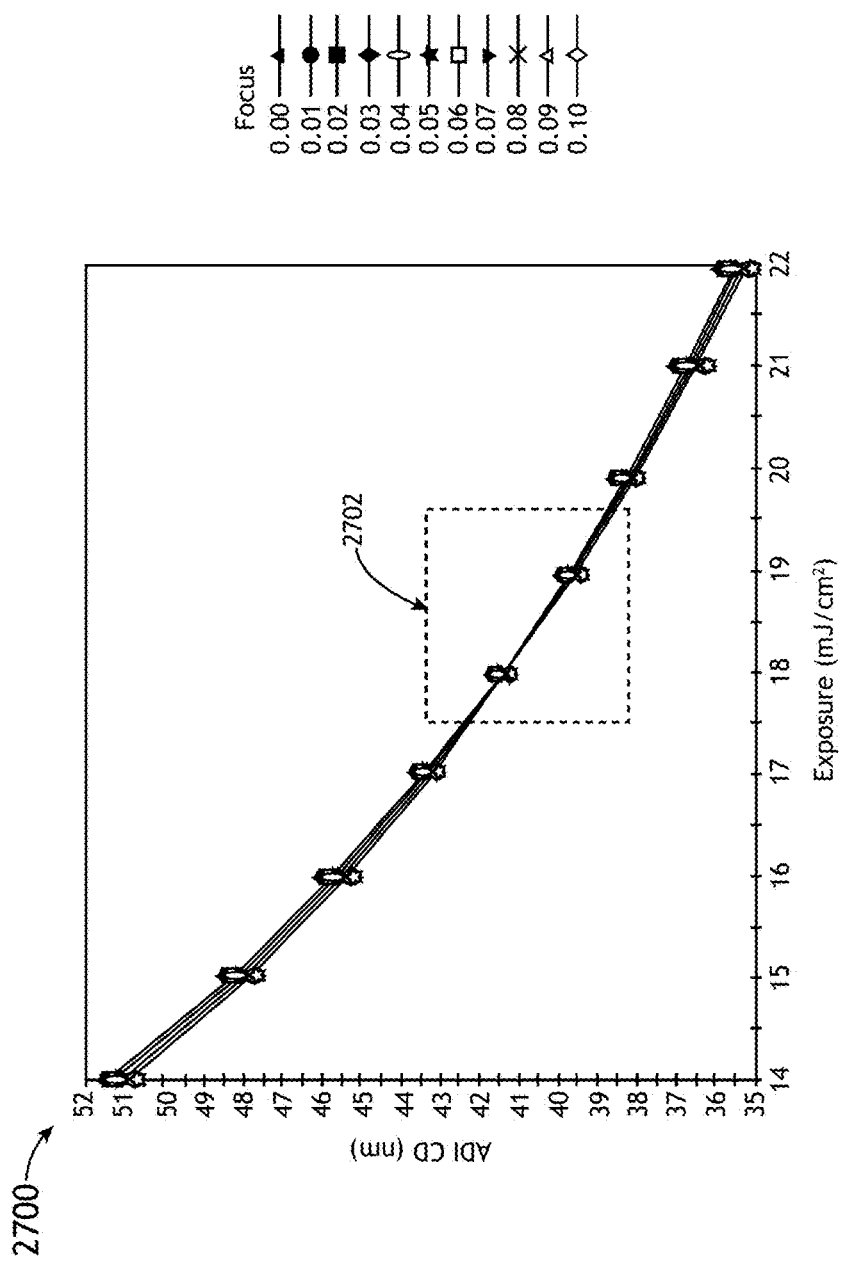
FIG. 27 is a plot illustrating a variation of the critical dimension of exposure-sensitive printed pattern profiles as a function of exposure for multiple values of focal position of the sample, in accordance with one or more embodiments of the present disclosure.

FIG. 27 is a plot 2700 illustrating a variation of a critical dimension of exposure-sensitive printed pattern profiles (e.g., a width of printed pattern profiles as measured at a designated height) as a function of exposure for multiple values of focal position of the sample 112, in accordance with one or more embodiments of the present disclosure. In one embodiment, the critical dimension is sensitive to the exposure and exhibits a relatively low sensitivity to the focal position of the sample. For example, in a process window 2702, the critical dimension varies by 3.3 nm in response to a deviation of the exposure of 2 mJ/cm². In contrast, the critical dimension varies by 0.001 nm in response to a 70 nm deviation of the focal position of the sample 112. In this regard, the printed pattern profiles 2314 exhibit high sensitivity to exposure and minimal sensitivity to deviations of the focal position of the sample 112 and may thus operate as exposure-sensitive patterns on an exposure-sensitive metrology target.

Referring again to FIGS. 1A through 1C, the illumination source 102 may include any illumination source known in the art suitable for generating an illumination beam 104. For example, the illumination source 102 may include, but is not limited to, a monochromatic light source (e.g. a laser), a polychromatic light source with a spectrum including two or more discrete wavelengths, a broadband light source, or a wavelength-sweeping light source. Further, the illumination source 102 may be, but is not required to be, formed from a white light source (e.g. a broadband light source with a spectrum including visible wavelengths), a laser source, a free-form illumination source, a single-pole illumination source, a multi-pole illumination source, an arc lamp, an electrode-less lamp, or a laser sustained plasma (LSP) source. Further, the illumination beam 104 may be delivered via free-space propagation or guided light (e.g. an optical fiber, a light pipe, or the like).

It is further noted herein that, for the purposes of the present disclosure, an illumination pole of the illumination source 102 may represent illumination from a specific location of the illumination source 102. In this regard, each spatial location on an illumination source 102 may be considered an illumination pole. Further, an illumination pole may have any shape or size known in the art. Additionally, a free-form illumination source 102 may be considered to have an illumination profile corresponding to a distribution of illumination poles.

In another embodiment, the system 100 includes a sample stage 114 suitable for securing a sample 112. The sample stage 114 may include any sample stage architecture known in the art. For example, the sample stage 114 may include, but is not limited to, a linear stage. By way of another example, the sample stage 114 may include, but is not limited to, a rotational stage. Further, the sample 112 may include a wafer, such as, but not limited to, a semiconductor wafer.

In another embodiment, the angle of incidence of the illumination beam 104 on the sample 112 is adjustable. For example, the path of the illumination beam 104 through the beamsplitter 126 and the objective lens 128 may be adjusted to control the angle of incidence of the illumination beam 104 on the sample 112. In this regard, the illumination beam 104 may have a nominal path through the beamsplitter 126 and the objective lens 128 such that the illumination beam 104 has a normal incidence angle on the sample 112.

Further, the angle of incidence of the illumination beam 104 on the sample 112 may be controlled by modifying the position and/or angle of the illumination beam 104 on the beamsplitter 126 (e.g. by rotatable mirrors, a spatial light modulator, a free-form illumination source, or the like).

The one or more processors 119 of a controller 118 may include any processing element known in the art. In this sense, the one or more processors 119 may include any microprocessor-type device configured to execute algorithms and/or instructions. In one embodiment, the one or more processors 119 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 120. Further, the steps described throughout the present disclosure may be carried out by a single controller 118 or, alternatively, multiple controllers 118. Additionally, the controller 118 may include one or more controllers 118 housed in a common housing or within multiple housings. In this way, any controller or combination of controllers may be separately packaged as a module suitable for integration into system 100.

The memory medium 120 may include any storage medium known in the art suitable for storing program instructions executable by the associated one or more processors 119. For example, the memory medium 120 may include a non-transitory memory medium. By way of another example, the memory medium 120 may include, but is not limited to, a read-only memory, a random access memory, a magnetic or optical memory device (e.g., disk), a magnetic tape, a solid state drive and the like. It is further noted that memory medium 120 may be housed in a common controller housing with the one or more processors 119. In one embodiment, the memory medium 120 may be located remotely with respect to the physical location of the one or more processors 119 of controller 118. For instance, the one or more processors 119 of controller 118 may access a remote memory (e.g., server), accessible through a network (e.g., internet, intranet and the like). Therefore, the above description should not be interpreted as a limitation on the present invention but merely an illustration.

In another embodiment, the controller 118 directs the illumination source 102 to provide one or more selected wavelengths of illumination (e.g. in response to feedback). In a general sense, the controller 118 may be communicatively coupled with any element within the metrology sub-system 101. In another embodiment, the controller 118 is communicatively coupled to the optical components 162 and/or the illumination source 102 to direct the adjustment of the angle of incidence between the illumination beam 104 and the sample 112. Further, the controller 118 may analyze data received from the detector 130 and feed the data to additional components within the metrology sub-system 101 or external to the system 100.

Embodiments of the present disclosure may incorporate any type of metrology system known in the art including, but not limited to, a spectroscopic ellipsometer with one or more angles of illumination, a spectroscopic ellipsometer for measuring Mueller matrix elements (e.g. using rotating compensators), a single-wavelength ellipsometer, an angle-resolved ellipsometer (e.g. a beam-profile ellipsometer), a spectroscopic reflectometer, a single-wavelength reflectometer, an angle-resolved reflectometer (e.g. a beam-profile reflectometer), an imaging system, a pupil imaging system, a spectral imaging system, or a scatterometer. Further, the metrology system may include a single metrology tool or multiple metrology tools. A metrology system incorporating multiple metrology tools is generally described in U.S. Pat. No. 7,478,019. Focused beam ellipsometry based on primarily reflective optics is generally described in U.S. Pat. No. 5,608,526, which is incorporated herein by reference in its entirety. The use of apodizers to mitigate the effects of optical diffraction causing the spread of the illumination spot beyond the size defined by geometric optics is generally described in U.S. Pat. No. 5,859,424, which is incorporated herein by reference in its entirety. The use of high-numerical-aperture tools with simultaneous multiple angle-of-incidence illumination is generally described by U.S. Pat. No. 6,429,943, which is incorporated herein by reference in its entirety.

It is further recognized herein that a metrology tool may measure characteristics of one or more targets such as, but not limited to, critical dimensions (CD), overlay, sidewall angles, film thicknesses, or process-related parameters (e.g., focus, dose, and the like). The targets may include certain regions of interest that are periodic in nature, such as for example gratings in a memory die. The metrology targets may further possess various spatial characteristics and are typically constructed of one or more cells which may include features in one or more layers which may have been printed in one or more lithographically distinct exposures. The targets or the cells may possess various symmetries such as two-fold or four-fold rotation symmetry, reflection symmetry. Examples of such metrology structures are described in U.S. Pat. No. 6,985,618, which is included herein by reference in its entirety. Different cells or combinations of cells may belong to distinct layers or exposure steps. The individual cells may comprise either isolated non-periodic features or alternately they may be constructed from one, two or three dimensional periodic structures or combinations of non-periodic and periodic structures. The periodic structures may be non-segmented or they may be constructed from finely segmented features which may at or close to the minimum design rule of the lithographic process be used to print them. The metrology targets may also be collocated or in close proximity with dummification structures in the same layer or in a layer above, below or in between the layers of the metrology structures. Targets can include multiple layers (e.g., films) whose thicknesses can be measured by the metrology tool. Targets can include target designs placed on the semiconductor wafer for use (e.g., with alignment, overlay registration operations, and the like). Further, targets may be located at multiple sites on the semiconductor wafer. For example, targets may be located within scribe lines (e.g., between dies) and/or located in the die itself. Multiple targets may be measured simultaneously or serially by the same or multiple metrology tools as described in U.S. Pat. No. 7,478,019, which is incorporated herein by reference in its entirety.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A lithography system, comprising:
an illumination source including an off-axis illumination pole, wherein the off-axis illumination pole is separated from an optical axis by a known offset distance along an offset direction, wherein the pattern mask includes a first pattern element segmented with a focus-sensitive pitch along a segmentation direction and a second pattern element segmented with a focus-insensitive pitch along the segmentation direction; and
a set of projection optics configured to expose a sample with an image corresponding to the pattern mask based on illumination from the illumination source to generate exposed features, wherein the focus-sensitive pitch is selected based on the known offset distance such that illumination from the off-axis illumination pole diffracted by the pattern mask based on the focus-sensitive pitch is asymmetrically distributed in a pupil plane of the set of projection optics, wherein widths of segments of the first pattern element are selected such that at least some segments of the first pattern element along the segmentation direction are separated by a sub-resolution distance smaller than a resolution of the set of projection optics, wherein segments of the first pattern element separated by the sub-resolution distance are exposed as merged features, wherein exposed features on the sample corresponding to the first pattern element include one or more indicators of a focal position of the sample during exposure, wherein the focus-insensitive pitch is selected based on the known offset distance such that illumination from the off-axis illumination pole diffracted by the pattern mask based on the focus-insensitive pitch is symmetrically distributed in the pupil plane, wherein exposed features on the sample corresponding to the second pattern element are independent of the focal position of the sample during exposure, wherein differences between the first pattern element and the second pattern element along the segmentation direction with respect to the one or more indicators are indicative of the focal position of the sample during exposure.

2. The lithography system of claim 1, wherein the offset direction is the segmentation direction.

3. The lithography system of claim 1, wherein the segmentation direction is a first segmentation direction, wherein the first pattern element is further segmented with the focus-sensitive pitch along a second segmentation direction perpendicular to the first segmentation direction, wherein the offset direction is different than the first segmentation direction and the second segmentation direction.

4. The lithography system of claim 3, wherein the one or more indicators of the focal position of the sample include one or more indicators measurable along the first segmentation direction and one or more indicators measurable along the second segmentation direction.

5. The lithography system of claim 1, wherein the off-axis illumination pole is a first off-axis illumination pole, of wherein the illumination source further includes a second off-axis illumination pole symmetric to the first off-axis illumination pole along the offset direction, wherein illumination from the second off-axis illumination pole diffracted by the first pattern element is asymmetrically distributed in the pupil plane, wherein illumination from the second off-axis illumination pole diffracted by the second pattern element is symmetrically distributed in the pupil plane, wherein a combined distribution of illumination in the pupil plane associated with the first off-axis illumination pole and the second off-axis illumination pole is symmetric.

6. The lithography system of claim 5, wherein the illumination from the first off-axis illumination pole diffracted by the first pattern element and illumination from the second off-axis illumination pole diffracted by the first pattern element are distributed in a non-overlapping pattern in the pupil plane.

7. The lithography system of claim 5, wherein the one or more indicators of the focal position of the sample comprises:
at least one of sidewall angles or dimensions along the segmentation direction of the exposed features corresponding to segments of the first pattern element.

8. The lithography system of claim 1, wherein at least some segments of the first pattern element comprise:
two or more sub-elements separated by the sub-resolution distance having different widths along the segmentation direction such that the two or more sub-elements are exposed as the merged features, wherein the merged features are asymmetric.

9. The lithography system of claim 1, wherein the one or more indicators of the focal position of the sample comprise:
positions of the exposed features corresponding to segments of the first pattern element, wherein displacements along the segmentation direction of the exposed features corresponding to the first pattern element with respect to exposed features corresponding to the second pattern element are indicative of the focal position.

10. The lithography system of claim 1, wherein the first pattern element is further segmented by the focus-insensitive pitch, wherein the first pattern element comprises:
two or more element groups distributed with the focus-insensitive pitch, wherein at least some element groups of the two or more element groups include two or more sub-elements distributed with the focus-sensitive pitch and separated with the sub-resolution distance such that the at least some element groups are exposed as the merged features.

11. The lithography system of claim 1, wherein the pattern mask comprises:
a substantially transparent substrate; and
a substantially opaque material.

12. The lithography system of claim 11, wherein the substantially opaque material includes a metal.

13. The lithography system of claim 1, wherein the pattern mask comprises:
at least one of a binary pattern mask element or a patterned phase mask.

14. The lithography system of claim 1, wherein the one or more indicators of the focal position of the sample during exposure comprise:
at least one of pattern placement, sidewall angles, or dimensions along the segmentation direction of the exposed features corresponding to segments of the first pattern element.

15. A metrology system, comprising:
a sample stage configured to support a substrate with a metrology target disposed upon the substrate, wherein the metrology target corresponds to an image of a pattern mask generated by a lithography system including an off-axis illumination pole, wherein the off-axis illumination pole is separated from an optical axis by a known offset distance along an offset direction, wherein the pattern mask comprises:
a first pattern element segmented with a focus-sensitive pitch along a segmentation direction, wherein the focus-sensitive pitch is selected based on the known offset distance such that illumination from the off-axis illumination pole diffracted by the pattern mask based on the focus-sensitive pitch is asymmetrically distributed in a pupil plane of the lithography system during exposure, wherein widths of segments of the first pattern element are selected such that at least some segments of the first pattern element along the segmentation direction are separated by a sub-resolution distance smaller than a resolution of the set of projection optics, wherein segments of the first pattern element separated by the sub-resolution distance are exposed as merged features, wherein features on the metrology target associated with the first pattern element include one or more indicators of a focal position of the sample in the lithography system; and
a second pattern element segmented with a focus-insensitive pitch along the segmentation direction, wherein the focus-insensitive pitch is selected based on the known offset distance such that illumination from the off-axis illumination pole diffracted by the pattern mark based on the focus-insensitive pitch is symmetrically distributed in the pupil plane, wherein features of the metrology target associated with the second pattern element are independent of the focal position of the sample during exposure;
at least one metrology illumination source configured to illuminate the metrology target;
at least one detector configured to receive illumination from the metrology target; and
at least one controller communicatively coupled to the detector and configured to determine the focal position of the metrology target, the lithography system based on differences between features of the metrology target associated with the first pattern element and the second pattern element with respect to the one or more indicators.

16. The metrology system of claim 15, wherein the illumination from the metrology target includes at least one of reflected illumination, scattered illumination, or emitted illumination.

17. The metrology system of claim 15, wherein the one or more indicators of the focal position of the metrology target comprise:
positions of the features of the metrology target corresponding to segments of the first pattern element, wherein displacements along the segmentation direction of the features of the metrology target corresponding to the first pattern element with respect to features of the metrology target corresponding to the second pattern element are indicative of the focal position.

18. A method for determining a position of a sample along an optical axis of a lithography system, comprising:
generating an image of a pattern mask with a lithography system including an off-axis illumination pole, wherein the off-axis illumination pole is separated from an optical axis by a known offset distance along an offset direction, wherein the pattern mask comprises:
a first pattern element segmented with a focus-sensitive pitch along a segmentation direction, wherein the focus-sensitive pitch is selected based on the known offset distance such that illumination from the off-axis illumination pole diffracted by the pattern mask based on the focus-sensitive pitch is asymmetrically distributed in a pupil plane of the lithography system, wherein widths of segments of the first pattern element are selected such that at least some segments of the first pattern element along the segmentation direction are separated by a sub-resolution distance smaller than a resolution of the set of projection optics, wherein segments of the first pattern element separated by the sub-resolution distance are exposed as merged features, wherein features on the metrology target associated with the first pattern element include one or more indicators of a focal position of the sample in the lithography system during exposure; and
a second pattern element segmented with a focus-insensitive pitch along the segmentation direction, wherein the focus-insensitive pitch is selected based on the known offset distance such that illumination from the off-axis illumination pole diffracted by the pattern mark based on the focus-insensitive pitch is symmetrically distributed in the pupil plane, wherein features of the metrology target associated with the second pattern element are independent of the focal position of the sample during exposure;
measuring the one or more indicators of the focal position using a metrology system; and
determining the focal position location of the sample along the optical axis of the set of projection optics based on differences between features of the metrology target associated with the first pattern element and the second pattern element with respect to the one or more indicators.

19. A metrology target, comprising:
a first segmented feature segmented along a segmentation direction, the first segmented feature corresponding to an image of a first pattern element of a pattern mask exposed by a lithography system including an off-axis illumination pole, wherein the off-axis illumination pole is separated from an optical axis by a known offset distance along an offset direction, wherein a position of the first segmented feature along the segmentation direction is indicative of a focal position of the metrology target in the lithography system when exposed, wherein the first pattern element is segmented with the focus-sensitive pitch, wherein the first pattern element includes two or more element groups distributed with a focus-insensitive pitch, wherein at least some element groups of the two or more element groups includes two or more sub-elements distributed with a focus-sensitive pitch, wherein the focus-sensitive pitch is selected based on the known offset distance such that illumination from the off-axis illumination pole diffracted by the pattern mask based on the focus-sensitive pitch is asymmetrically distributed in a pupil plane of the lithography system, wherein widths of two or more sub-elements are selected such that at least some of the two or more sub-elements are separated by a sub-resolution distance smaller than a resolution of the set of projection optics, wherein the at least some of the two or more sub-elements are exposed as merged features; and a second segmented feature segmented along the segmentation direction, the second feature corresponding to an image of a second pattern element of a pattern mask exposed by the lithography system contemporaneously with the first pattern element, wherein a position of the second segmented feature is independent of the focal position of the metrology target in the lithography system when exposed, wherein the second pattern element is segmented with the focus-insensitive pitch, wherein the focus-insensitive pitch is selected based on the known offset distance such that illumination from the off-axis illumination pole diffracted by the pattern mask based on the focus-insensitive pitch is symmetrically distributed in a pupil plane of the lithography system, wherein positional differences between the first segmented feature and the second segmented feature are indicative of the focal position of the sample in the lithography system when exposed.

* * * * *